United States Patent [19]

Stevens, Jr. et al.

[11] Patent Number: 5,295,072
[45] Date of Patent: Mar. 15, 1994

[54] SAMPLED DATA LIGHTNING STRIKE DETECTION AND MAPPING SYSTEM CAPABLE OF RECOVERING A PRE THRESHOLD SAMPLE HISTORY FOR DETECTION AND MAPPING PROCESSING

[75] Inventors: Billie M. Stevens, Jr., Westerville; Joseph G. Kuzma, Dublin, both of Ohio

[73] Assignee: BFGoodrich FlightSystems, Inc., Columbus, Ohio

[21] Appl. No.: 876,011

[22] Filed: Apr. 29, 1992

[51] Int. Cl.$^5$ .................. G06F 15/31; G01S 3/02; G01N 1/16
[52] U.S. Cl. ..................... 364/420; 342/460
[58] Field of Search ............ 329/72, 76.15, 76.21, 329/76.22; 342/460; 364/420

[56] References Cited

U.S. PATENT DOCUMENTS

| | | |
|---|---|---|
| 3,060,427 | 10/1962 | Jaffe et al. |
| 3,715,660 | 2/1973 | Ruhnke |
| 3,754,263 | 8/1973 | Wojtasinski et al. ........ 342/460 |
| 3,772,594 | 11/1973 | Kuehnast ................ 324/72 |
| 3,891,919 | 6/1975 | Penninger |
| 4,023,408 | 5/1977 | Ryan |
| 4,115,732 | 9/1978 | Krider et al. |
| 4,198,599 | 4/1980 | Krider et al. ............ 324/72 |
| 4,272,720 | 6/1981 | Lennon |
| 4,383,260 | 5/1983 | Ryan |
| 4,395,906 | 8/1983 | Ryan et al. |
| 4,422,037 | 12/1983 | Coleman ................ 324/72 |
| 4,672,305 | 6/1987 | Coleman |
| 4,801,942 | 1/1989 | Markson et al. ........ 342/460 |
| 4,803,421 | 2/1989 | Ostrander |
| 4,873,483 | 10/1989 | Ostrander |
| 4,972,195 | 11/1990 | Markson et al. ........ 342/460 |
| 5,168,212 | 12/1992 | Byerley, III et al. ...... 324/72 |

OTHER PUBLICATIONS

"A Lightning Data Acquisition System", B. M. Steens, Jr., et al. p. 38-1, Sess. 10A, presented at IAGC on Lightning and Static Electricity, Jun. 24–26, 1986, Dayton, OH.
"CRC Handbook of Atmospherics", edited by Hans Volland, vol. I, CRC Press, Inc. (1982), pp. 180–199.
Honeywell LSS Sperry Lightning Sensor System, Marketing Brochure, 1988.
"Top Drawer Weather Avoidance" Insight Avionics Advertisement, 1990.
"Blue Side UP", 3M Stormscope, American Bonanza Society, 1986.
"Strike Finder", Marketing Brochure, 1990.
"New Approaches to Lightning Detection", Mal Gormley, Business and Commercial Aviation, 1990.
"Strike Finder, Insight's Thunderstorm Avoidance System", Keith Connes, Avionics News, 1990.
"Outwitting Thor", F. E. Potts, IFR, 1990.

Primary Examiner—Donald E. McElheny, Jr.
Attorney, Agent, or Firm—William E. Zitelli

[57] ABSTRACT

A sampled data lightning strike detection and mapping system receives a signal waveform representative of a lightning strike and samples the waveform to generate a train of data samples representative thereof. A data sample of the train is identified as exceeding a predetermined threshold and designated as the trigger sample. The system recovers a predetermined number of data samples, preceeding the trigger sample, of the train for processing to detect and map the lightning strike.

20 Claims, 50 Drawing Sheets

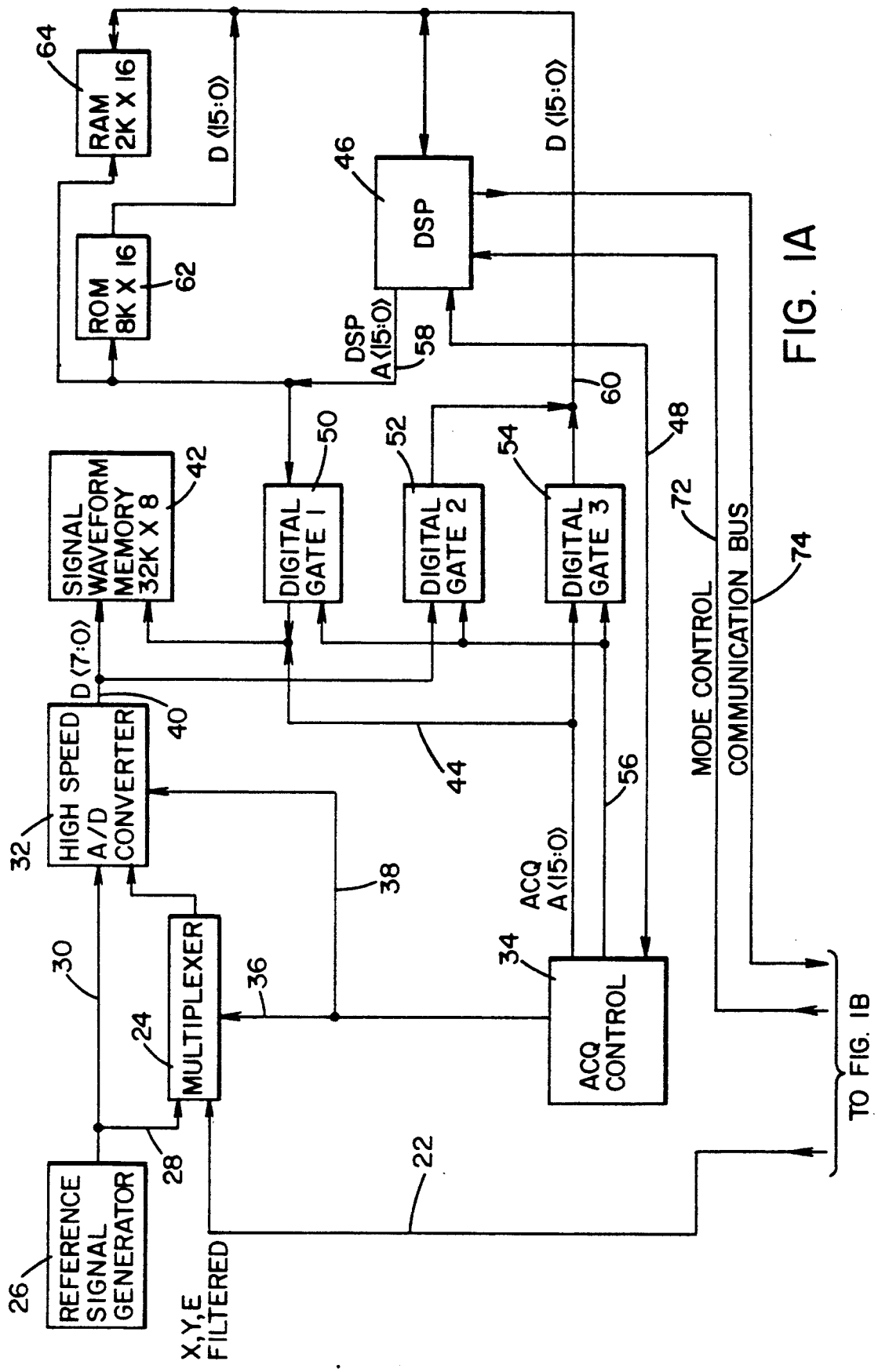

FIG. 9A
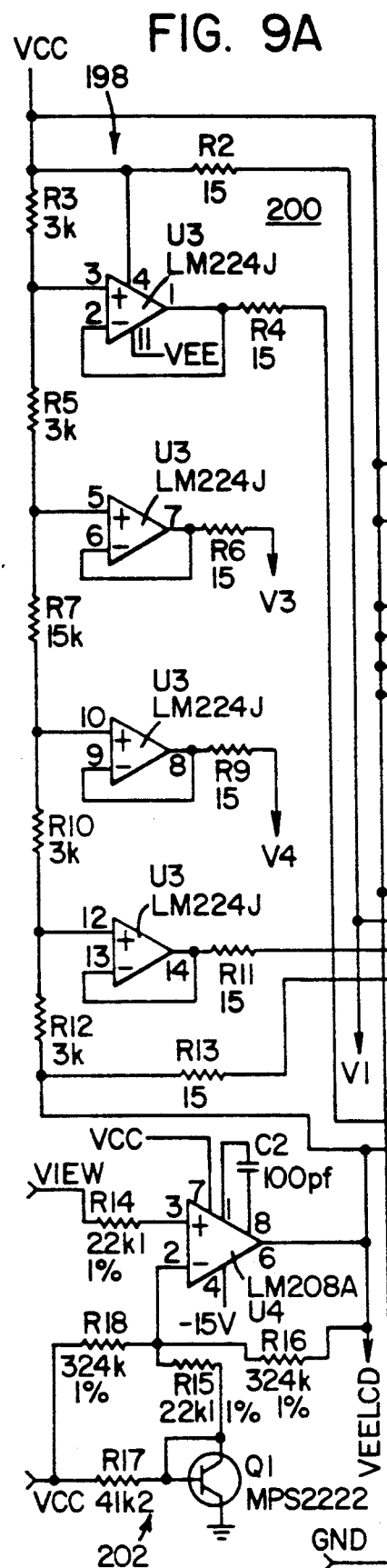
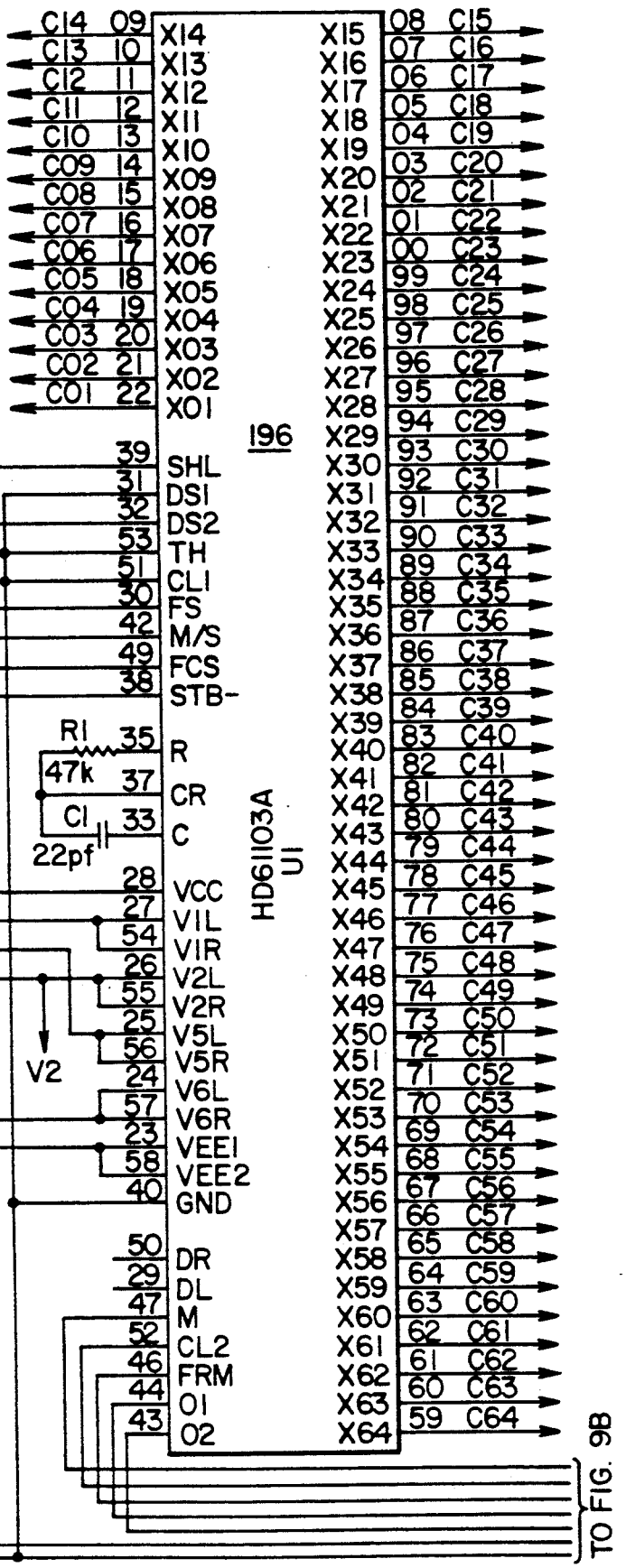

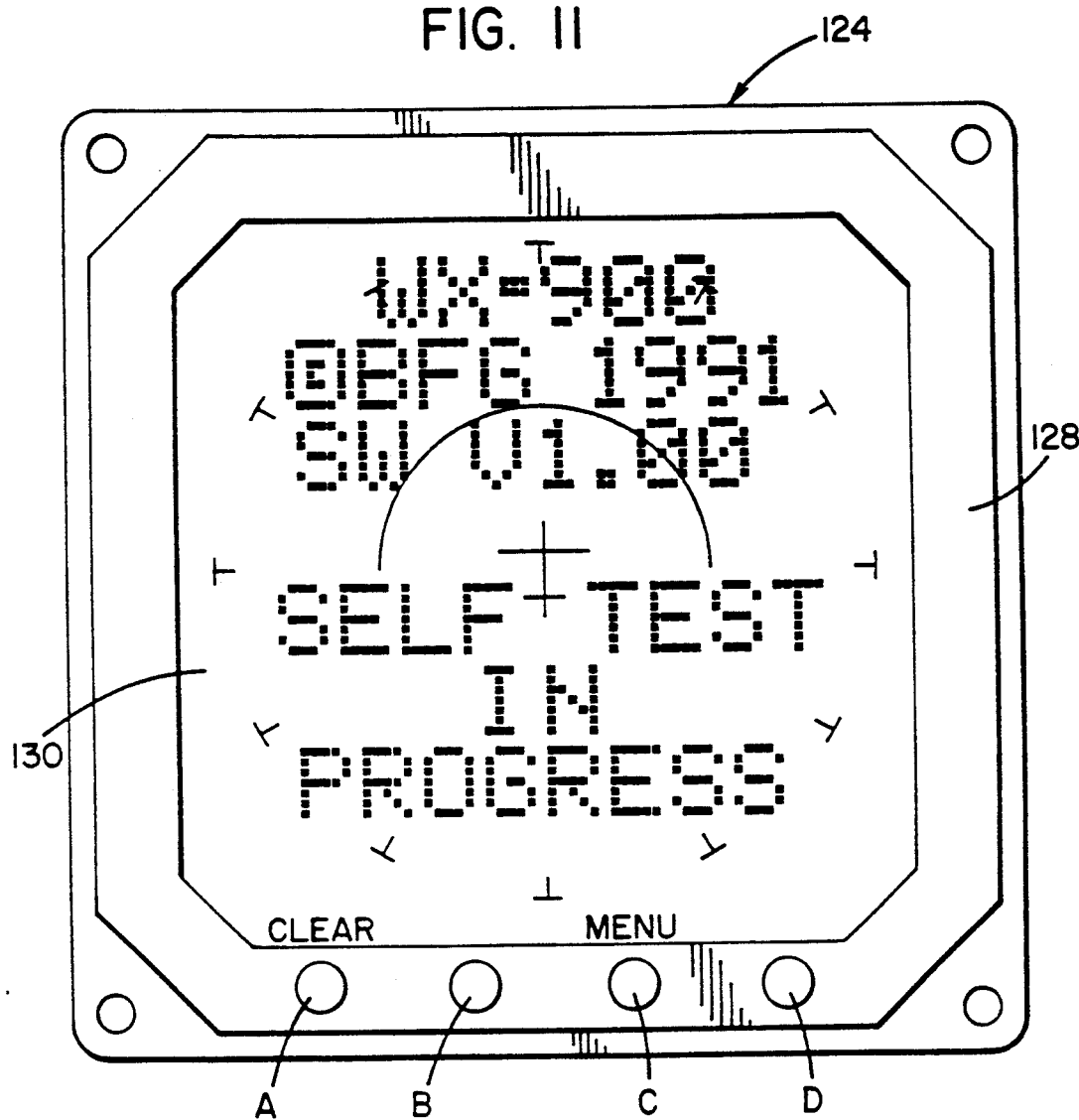

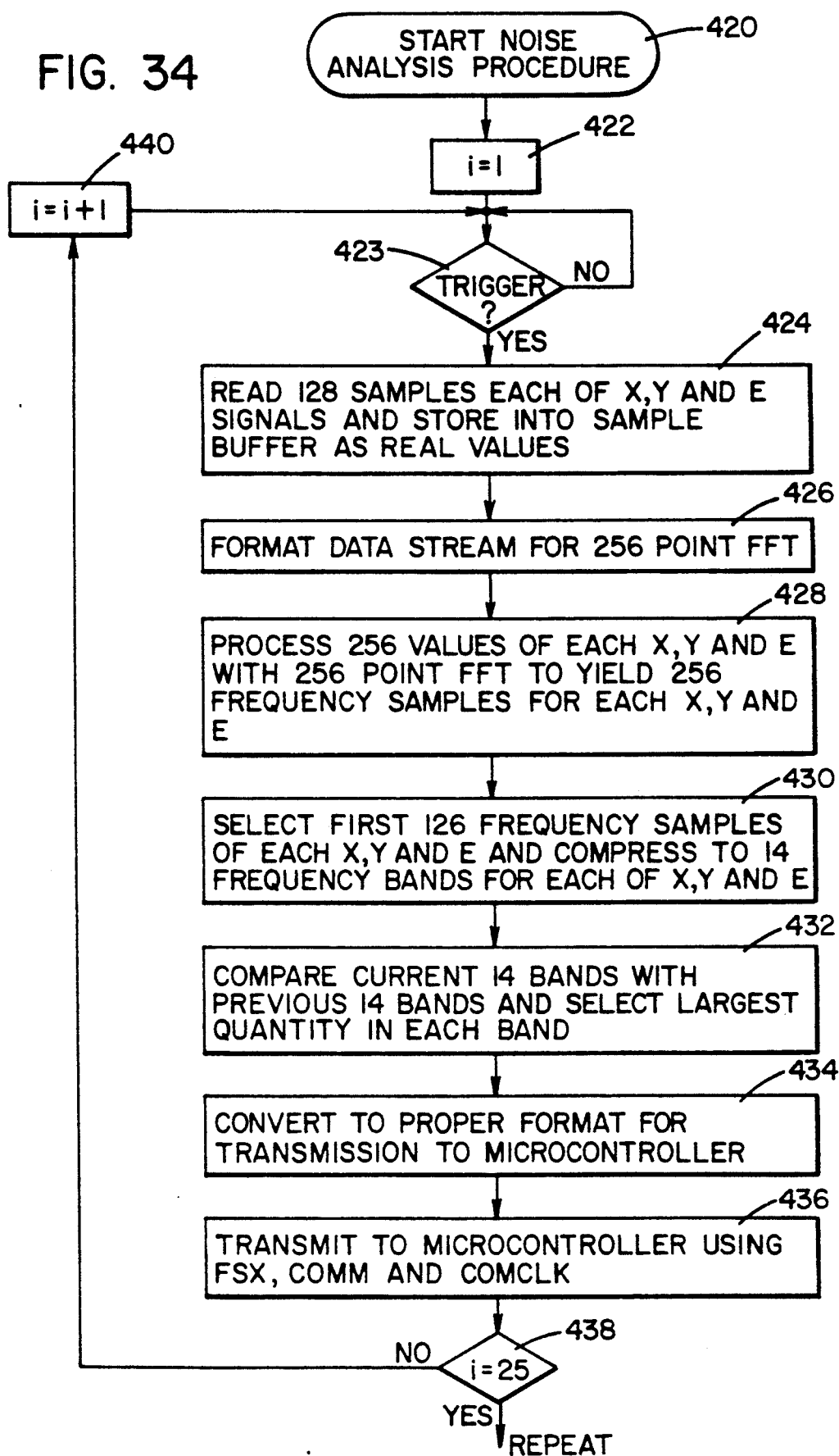

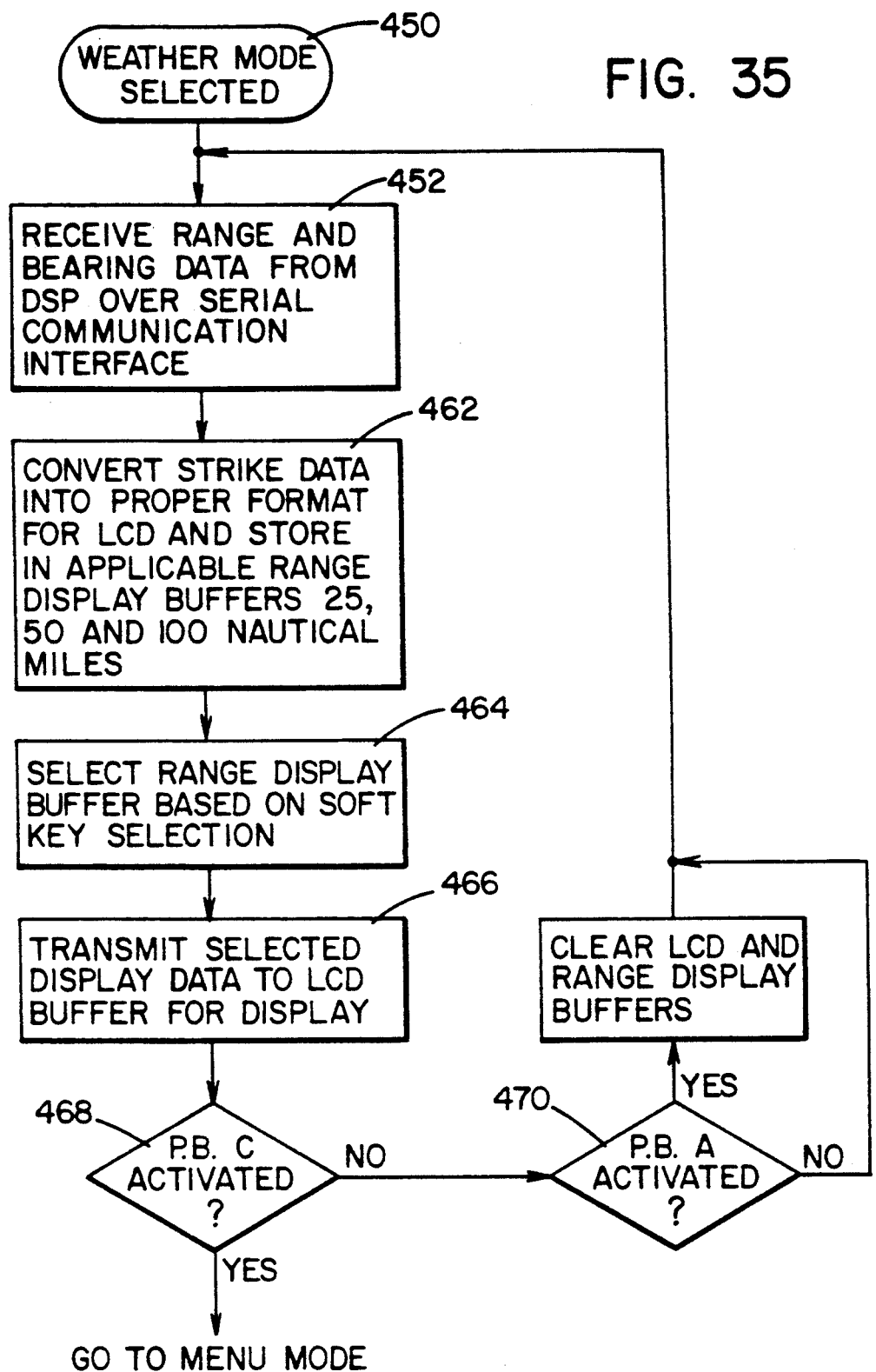

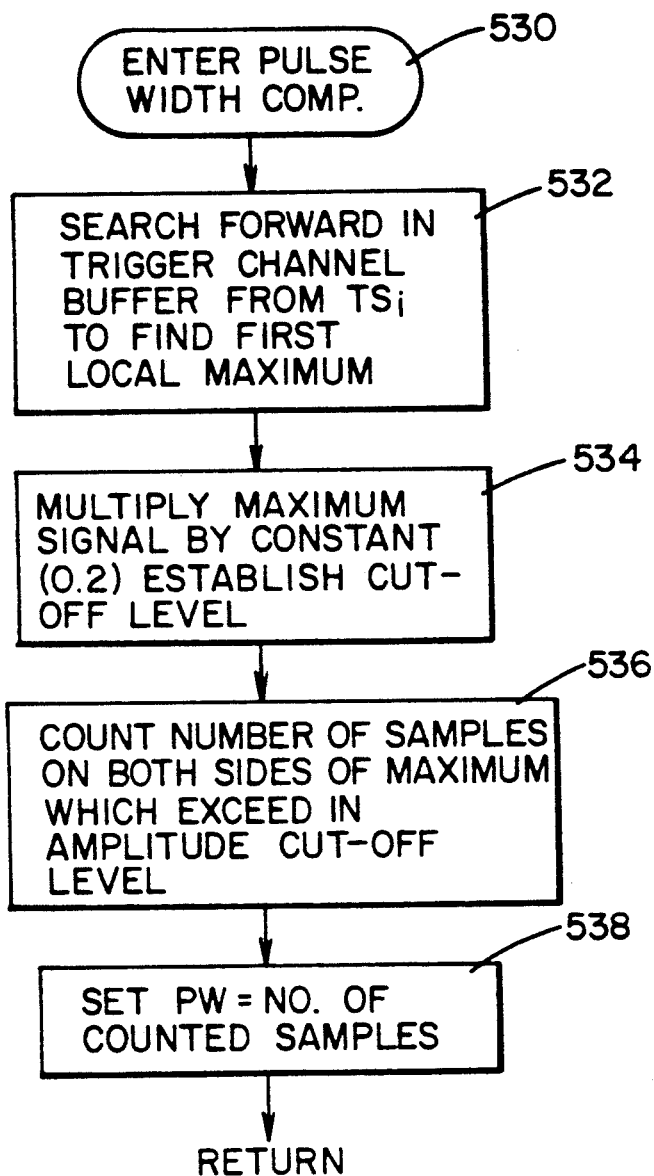

SAMPLED DATA LIGHTNING STRIKE DETECTION AND MAPPING SYSTEM CAPABLE OF RECOVERING A PRE THRESHOLD SAMPLE HISTORY FOR DETECTION AND MAPPING PROCESSING

CROSS REFERENCE TO RELATED COPENDING APPLICATIONS

U.S. patent application Ser. No. 07/876,012 entitled "A Lightning Detection and Mapping System With Auto Control of Mapping Display";

U.S. patent application Ser. No. 07/876,010 entitled "A Lightning Strike Detection and Mapping System Capable Of Monitoring Its Power Source And Of Displaying A Representation Thereof On The Mapping Display";

U.S patent application Ser. No. 07/876,007 entitled "A Sampled Data Lightning Strike Detection And Mapping System Capable Of Generating A Frequency Spectrum Of Input Signal Waveforms And Displaying Such On The Mapping Display";

U.S. patent application Ser. No. 07/876,009 entitled "A Sampled Data Lightning Strike Detection And Mapping System Capable Of Early Detection Of An Invalid Strike From Sampled Data And Quick Resumption Of Monitoring An Incoming Signal";

U.S. patent application Ser. No. 07/876,013 entitled "A System For Classifying Lightning Strikes To Enhance Location Estimation Thereof";

U S. patent application Ser. No. 07/875,901 entitled "A Lightning Strike Detection System Capable Of Quickly Determining An Invalid Correlation Of Strike Signaling";

All of the above applications being filed concurrently with the instant application and being assigned to the same assignee thereof.

BACKGROUND OF THE INVENTION

The present invention is related to lightning strike detection and mapping systems, in general, and more particularly to a system capable of recovering predetermined pre threshold sampled data for the processing thereof to detect and map a lightning strike.

It is well known that thunderstorms present a serious threat to airborne craft as a result of the dangerous turbulence, up and down drafts, wind shear and other violent atmospheric disturbances generated thereby. Thunderstorms for the most part are comprised of clusters of cells which grow and dissipate within the storm through a variety of stages. Most of the violent atmospheric disturbance of the storm takes place during the mature stage of the storm cells. It was recognized by Paul Ryan an early pioneer in the field of weather mapping instrumentation that electrical discharges or lightning occurred coincidentally with the violent atmospheric disturbances during the mature stage of the storm cells. This strong correlation between the threatening atmospheric disturbances and electrical discharges was used by Ryan to create a weather mapping system known as Stormscope®, which was disclosed in the U.S. Pat. No. 4,023,408 which is currently assigned to the same assignees as the instant application.

The Ryan system is capable of measuring pulse type electromagnetic radiation generated through the atmosphere from the large electric currents flowing within the lightning channel during a lightning stroke for the detection thereof. Ryan's system used an inverse relationship of the measured radiation to map the detected lightning strike on a display in range and bearing relative to an observation location which, for example, may be the location of the aircraft. In one embodiment, the observation location was calibrated at the center of the display screen and each displayed stroke appeared as a substantial point source at a bearing and radial dimension from the screen center, the radial dimension being proportional to the range measurement of the corresponding lightning stroke.

The dimension between the displayed stroke and screen center was not necessarily a measure of the actual range from the aircraft to the stroke but rather an approximation of range based on a mix of distance and intensity information of the detected lightning stroke. The Ryan system did not take into account the variety of lightning strikes, like return strikes, leader strikes and intra cloud strikes, nor did he utilize the different frequency and pulse width characteristics of these different strikes.

While the Ryan technology described by the aforementioned '408 patent has met and continues to meet a significant commercial need, further improvements are always desirable. For example, by classifying the detected lightning strike into a known type, the range and bearing measurements corresponding thereto may be more accurately estimated to narrow the statistical distribution thereof, thus rendering a more accurate range and bearing measurement over a given region for display mapping purposes.

From the teachings of Hans Volland in his edited text "CRC Handbook of Atmospherics", Vol. I, published by CRC Press, Inc. of Boca Raton, Fla. (1982), it is recognized that impulse forms of lightning currents may be characterized into different types by the spectral frequency and pulse width characteristics thereof. A Type 1 current is observed from lightning channel currents of return strikes and commonly referred to as aperiodic waveforms. A Type 2 current is observed from both return and intra cloud strikes and is referred to as damped oscillatory waves. And, Type 3 or K current is a special case of Type 2 and is sometimes referred to as the intermediate type. A more recent model of the Ryan Stromscope technology, referred to as WX-1000, manufactured by BFGoodrich FlightSystems, Inc. and marketed more than one year prior to the filing of the instant application, used pulse width measurements of the lightning strikes to discriminate intra cloud and leader strikes from the others.

In addition, a U.S. Patent bearing the number U.S. Pat. No. 4,672,305 issued to Coleman is directed to a lightning detection system which uses a ratio of low (1.5 kHz) and high (500 kHz) frequency magnetic field components to extend the range thereof. Further, U.S. Pat. No. 4,803,421 and its divisional counterpart U.S. Pat. No. 4,873,483 both issued to Ostrander and assigned to the same assignee as the instant application, are directed to lightning detection and mapping systems which determine lightning locations from the ratio of the integrated intensity of two different field components of lightning generated signals. Also, a data acquisition system for use in gathering lightning strike data is present in the paper "A Lightning Data Acquisition System", authorized by B. M. Stevens, Jr. et al. for the International Aerospace and Ground Conference on Lightning and Static Electricity at Dayton, Ohio, Jun. 24-26, 1986.

Because the electromagnetic radiation measurements of the lightning detection instrumentation are affected by noise and other unwanted interference, there is always the problem of false triggers causing unwanted processing of information. Accordingly, to avoid false triggering, the threshold trigger level for detecting valid lightning strikes may be set at higher magnitudes, although it recognized that the processing of lightning stroke signaling does not commence until the higher threshold level is reached. Since the past embodiments were analog, the pre-threshold portion of the incoming signal was lost. Consequently, the higher the threshold setting for false trigger avoidance, the greater the portion of incoming signal not being processed. Therefore, another area of improvement of the prior analog systems is the capability of avoiding false triggering without loss of a substantial initial portion of the incoming lightning signal.

Further, the prior lightning detection systems relied primarily on threshold triggering of the incoming lightning signal to commence processing thereof. Once processing began, it would continue for a predetermined processing interval until completion. There was no way to interrupt or abort information processing once started. Accordingly, if the processing was initiated by an invalid lightning stroke, such as a dart leader, a noise spike, or other interference, for example, a main or return stroke may be missed during the invalid processing interval and thus not measured. Accordingly, it is of paramount importance to be capable of distinguishing between valid and invalid lightning strikes early in the processing interval thereof so that the processing of an invalid strike may be aborted and the monitoring of incoming lightning signaling is quickly resumed. This capability would provide a greater opportunity to detect and measure the associated lightning strikes which follow quickly after their corresponding dart leaders.

Still further, the prior analog systems generally processed as much of the incoming lightning signaling as possible in performing correlation discrimination between the EH field measurements thereof. This method of correlation not only increased processing time but also processed signaling beyond the leading edge of the lightning pulse where noise became more prevalent in the incoming signal, thus corrupting at times the correlation discrimination. Thus, another area of improvement is the capability of limiting the correlation determination of the incoming lightning signaling to the leading edge thereof to effect an early correlation decision which accomplishes speeding up the processing time and avoiding significant noise disruption and interference that could render a false or corrupted correlation decision.

Another area of improvement over the past lightning detection systems is the capability of identifying ambient noise conditions which could interfere with weather mapping and/or lightning detection operations of the instrumentation. Even sporadic noise levels may cause false triggering or even false detection of invalid lightning strikes. An additional improvement is the capability of switching between weather mapping and noise or frequency spectrum identification modes for displaying such on a common weather mapping display. Accordingly, the operator or pilot could confirm the integrity of the instrumentation with the push of a button.

Still further, certain types of weather mapping displays require a backlight for viewing by an operator or pilot. In a cockpit environment, the ambient light levels tend to change as a result of varying the orientation of the aircraft. Also, the brightness of the display is contrasted with the surrounding ambient light level of the cockpit. Thus, in order to maintain an even brightness level, the pilot or viewer will have to vary the backlight setting with each variation of ambient light condition. This could result in the pilot directing a substantial portion of his time controlling the brightness of the display rather than operating the aircraft. Accordingly, it is believed beneficial to have some hands-off automatic brightness level calibration for the display so that the pilot can direct his attention more to the flying of the aircraft.

Another area of improvement is directed to the integrity of the instrumentation in regard to the supply of power thereto. An operator or pilot utilizing a lightning detection system for storm avoidance may question the information being displayed on the display unit of the lightning detection system. Since, the aircraft instrumentation is generally powered by on board batteries, there is always the possibility of malfunctioning conditions and degradation of the battery voltage potential which could cause erroneous readings. Accordingly, it would be beneficial to the pilot to have the capability of reading the avionics power bus through the same lightning detection display without interrupting substantially the weather mapping operations. Thus, a malfunction or degradation of the avionics power bus could be quickly determined at the push of a button.

SUMMARY OF THE INVENTION

In accordance with the present invention, a sampled data lightning strike detection and mapping system comprises means for sampling a received signal waveform representative of a lightning strike to generate a train of data samples representative of the received waveform, means for identifying a data sample of the train which exceeds a predetermined threshold level as a trigger sample, means for recovering a predetermined number of data samples, preceeding the trigger sample, and means for processing the recovered predetermined number of data samples to detect and map the lightning strike. In a preferred embodiment, the identifying means and processing are embodied in a common digital signal processing means to perform the functions thereof.

BRIEF DESCRIPTION OF THE DRAWINGS

FIGS. 1A and 1B are, in combination, a functional block diagram schematic of a lightning strike detection and mapping system suitable for embodying the principles of the present invention.

FIGS. 9A-9H are circuit schematics of suitable circuits for embodying the display module of the system.

FIGS. 11-16 are examples of screen display formats which may be generated by the software routine of FIG. 10.

FIG. 34 is a software flow chart suitable for programming the DSP to perform frequency spectrum analysis processing.

FIG. 35 is a software flow chart suitable for programming the microcontroller to operate in a weather mapping mode.

FIGS. 36A, 36B-39 are software flow charts suitable for programming the DSP to operate in the lightning detection and mapping mode of operation.

DESCRIPTION OF THE PREFERRED EMBODIMENT

Figure 1B:
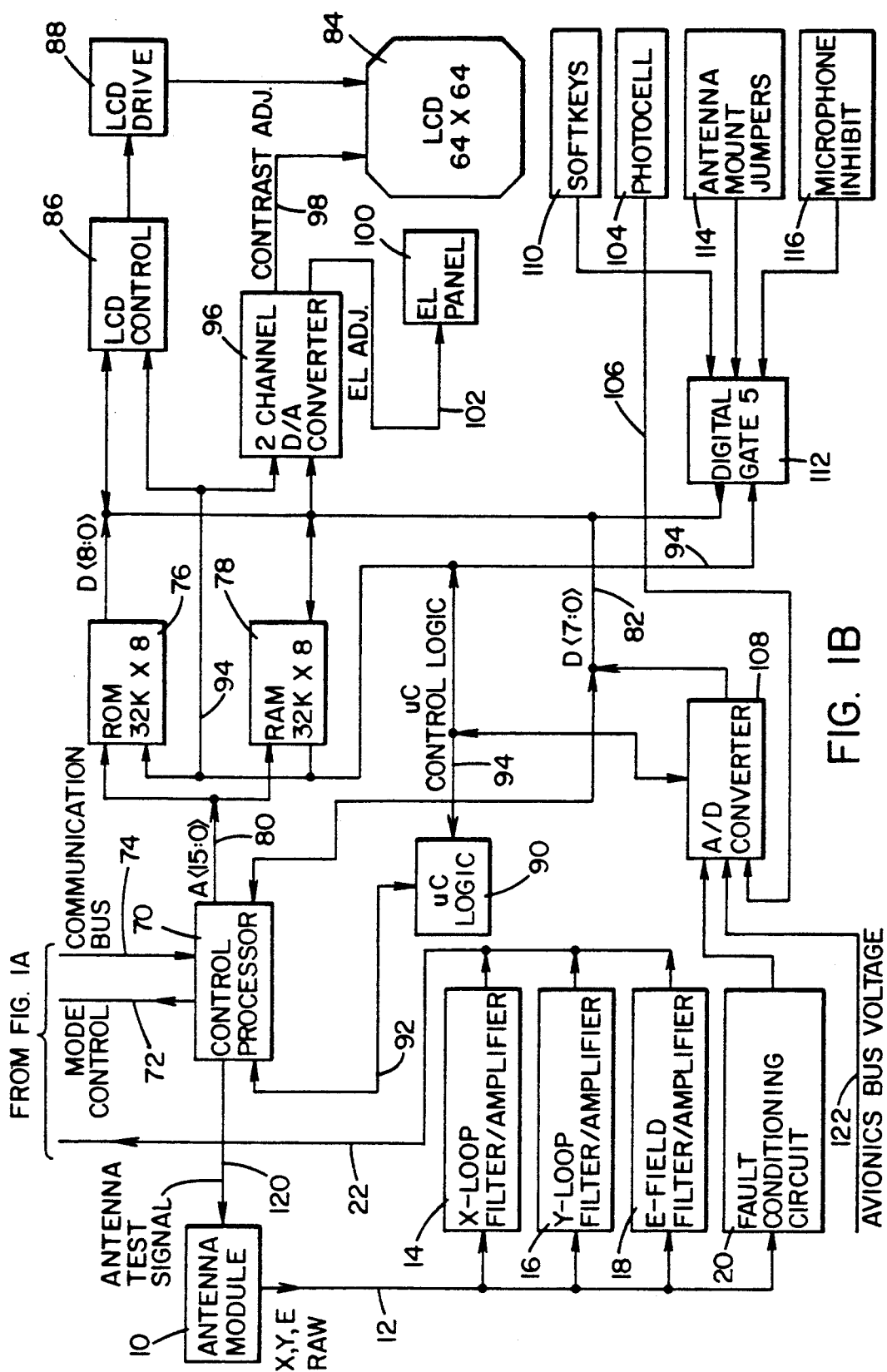
Figure 4A:
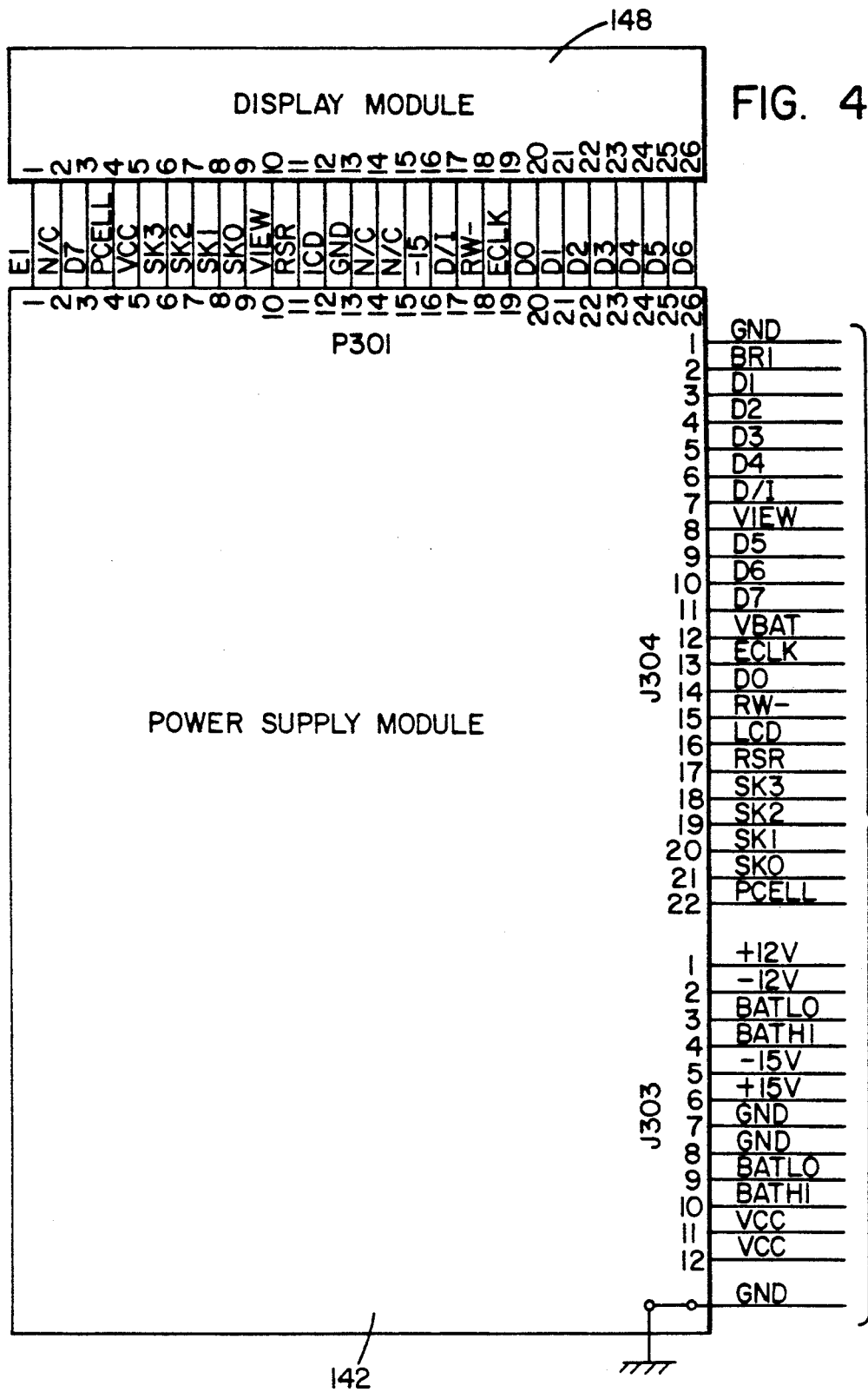
FIGS. 4A, 4B and 4C depict, in combination, a suitable electronic processing section of the system comprising separate and distinct modules and their interconnections between themselves and with other external subcomponents of the system.
Figure 4B:
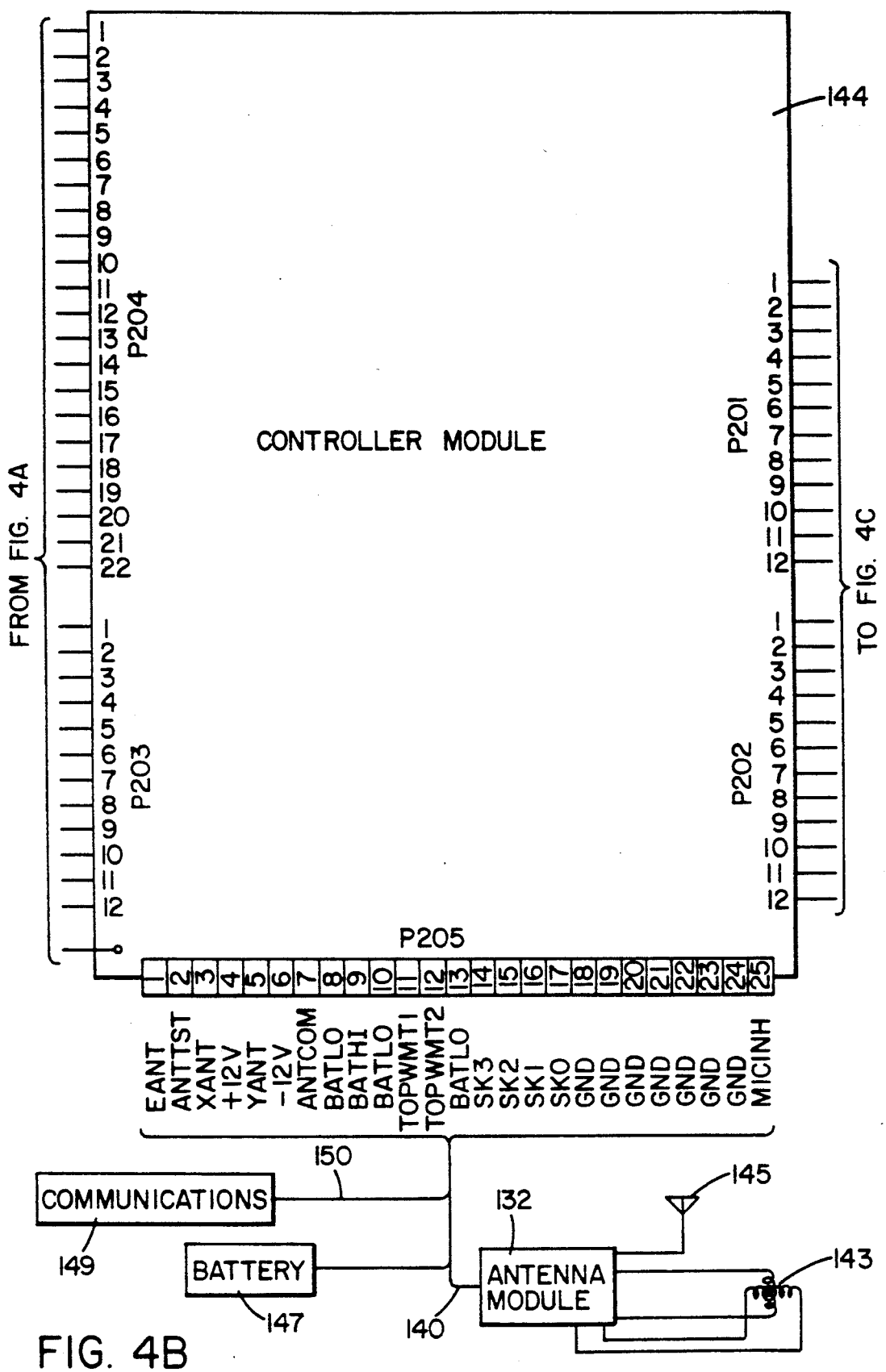
Figure 4C:
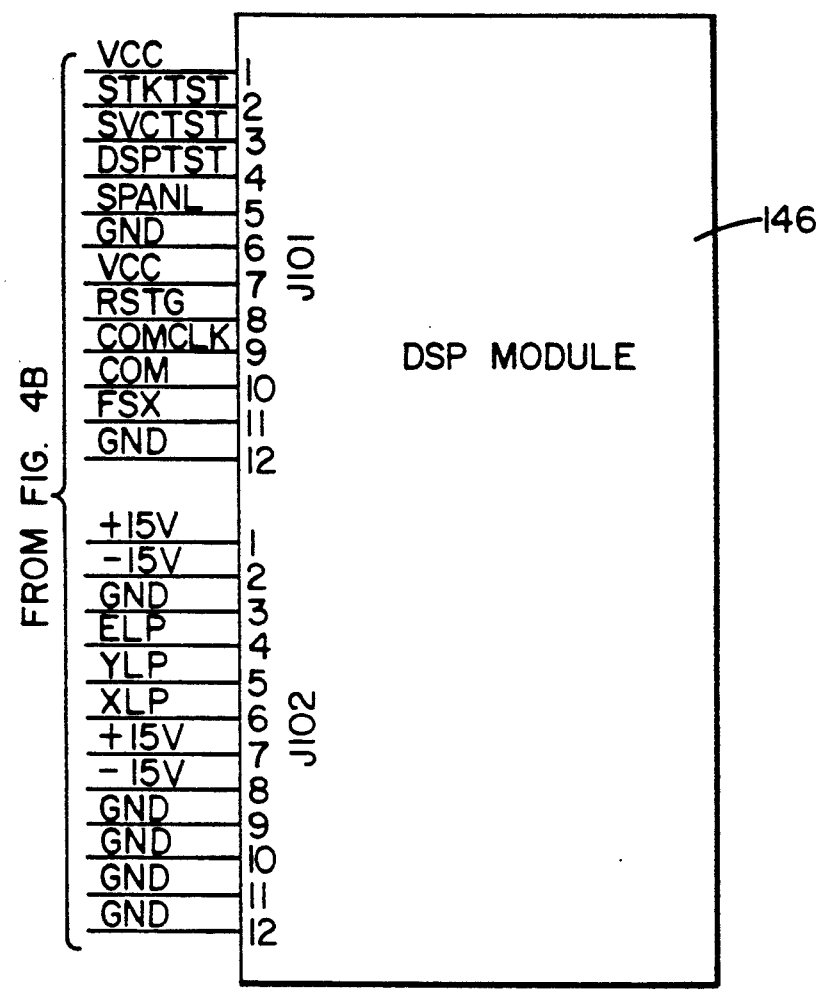
Figure 5A:
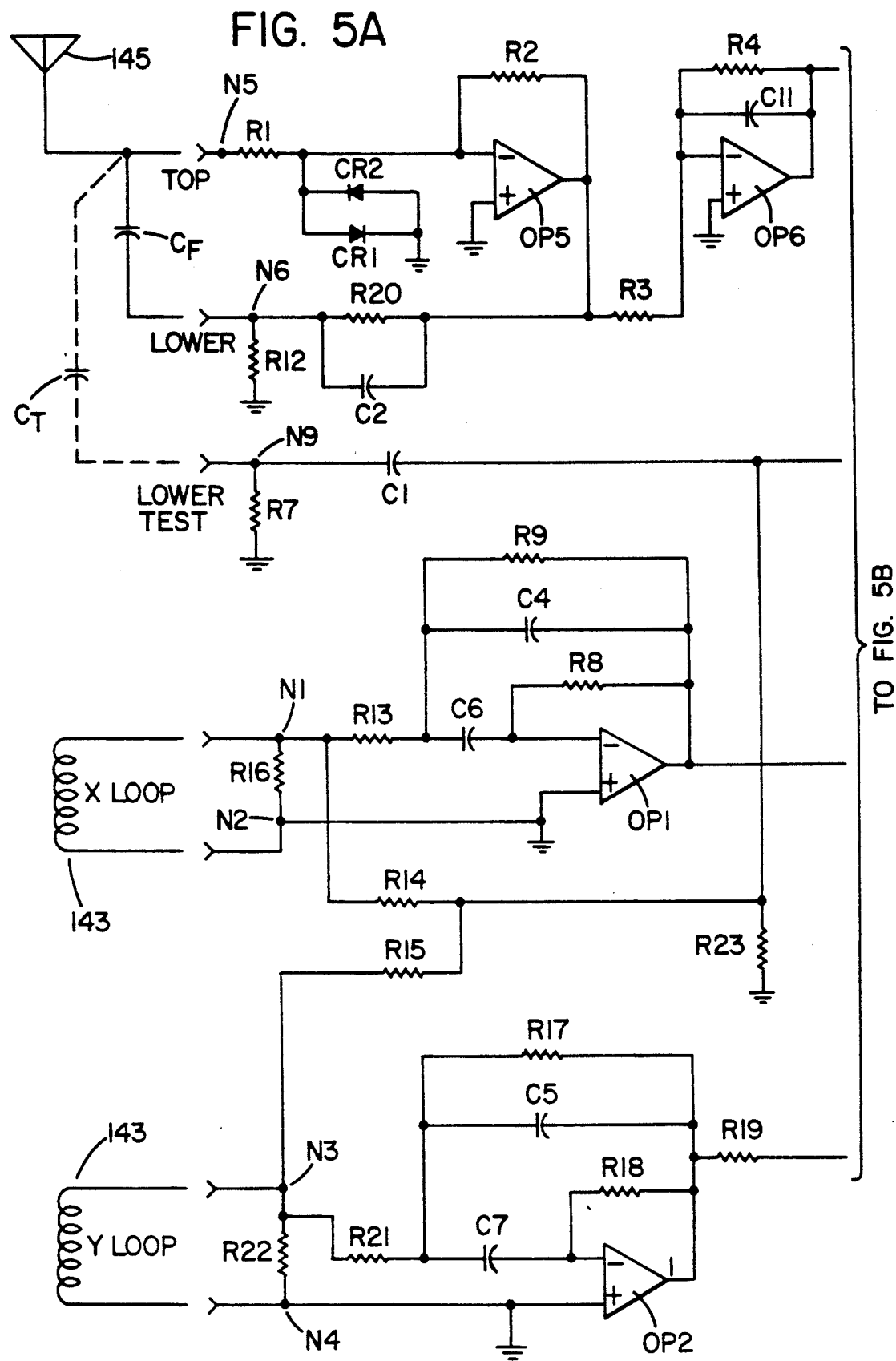
FIGS. 5A and 5B are, in combination, a circuit schematic of a suitable circuit for embodying the antenna module of the system.
Figure 5B:
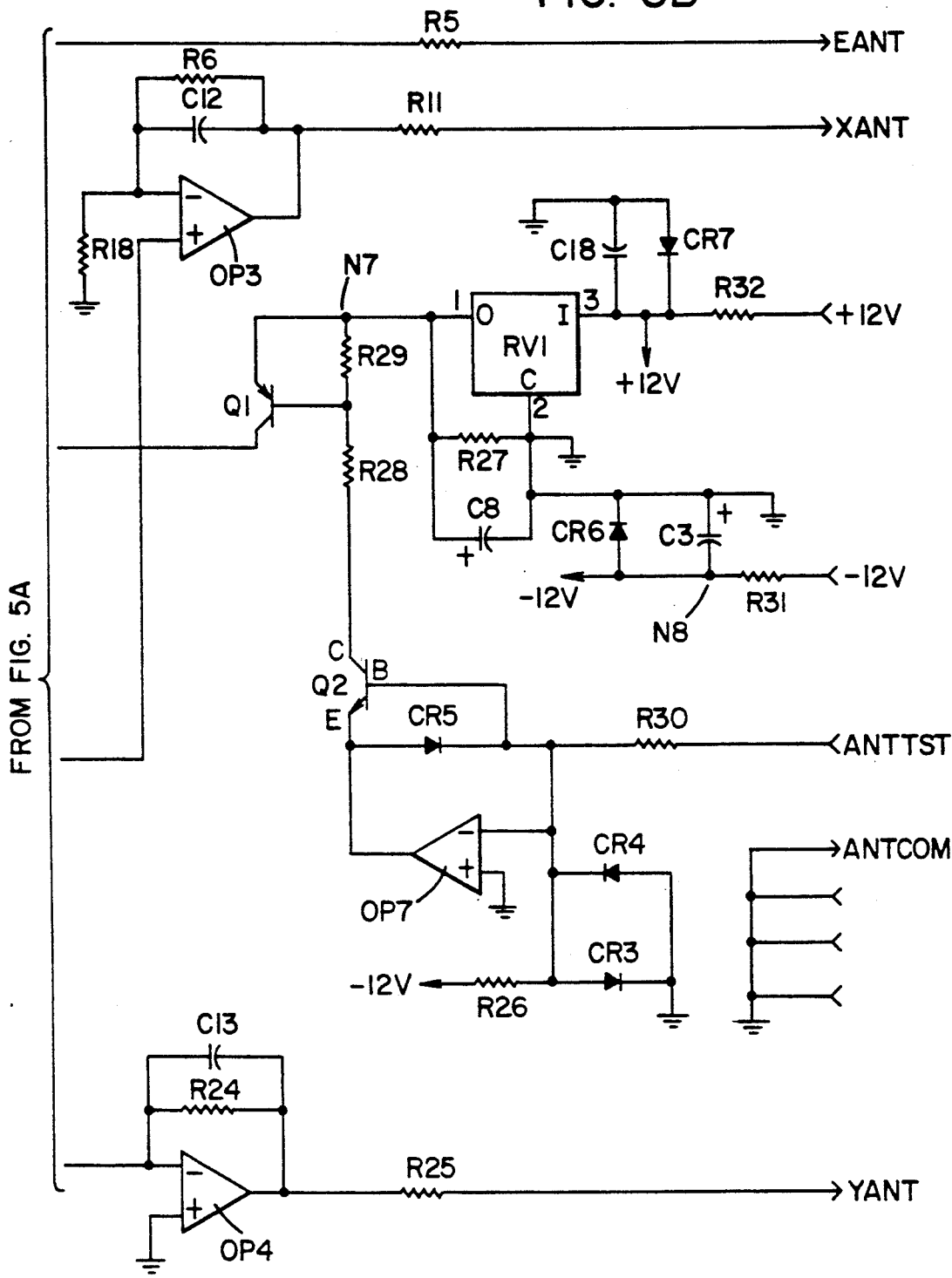
Figure 6A:
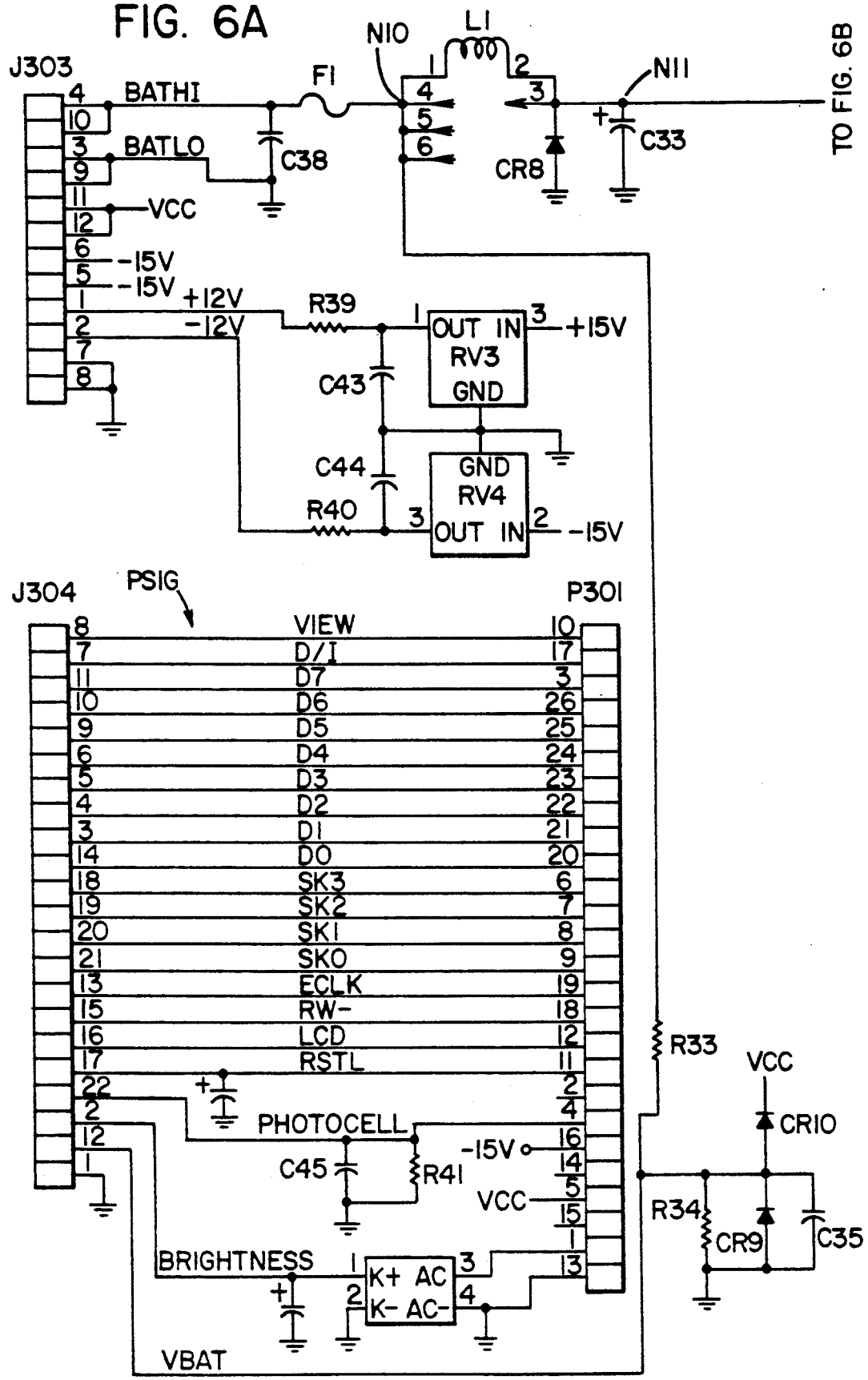
FIGS. 6A and 6B are, in combination, a circuit schematic of a suitable circuit for embodying the power supply module of the system.
Figure 6B:
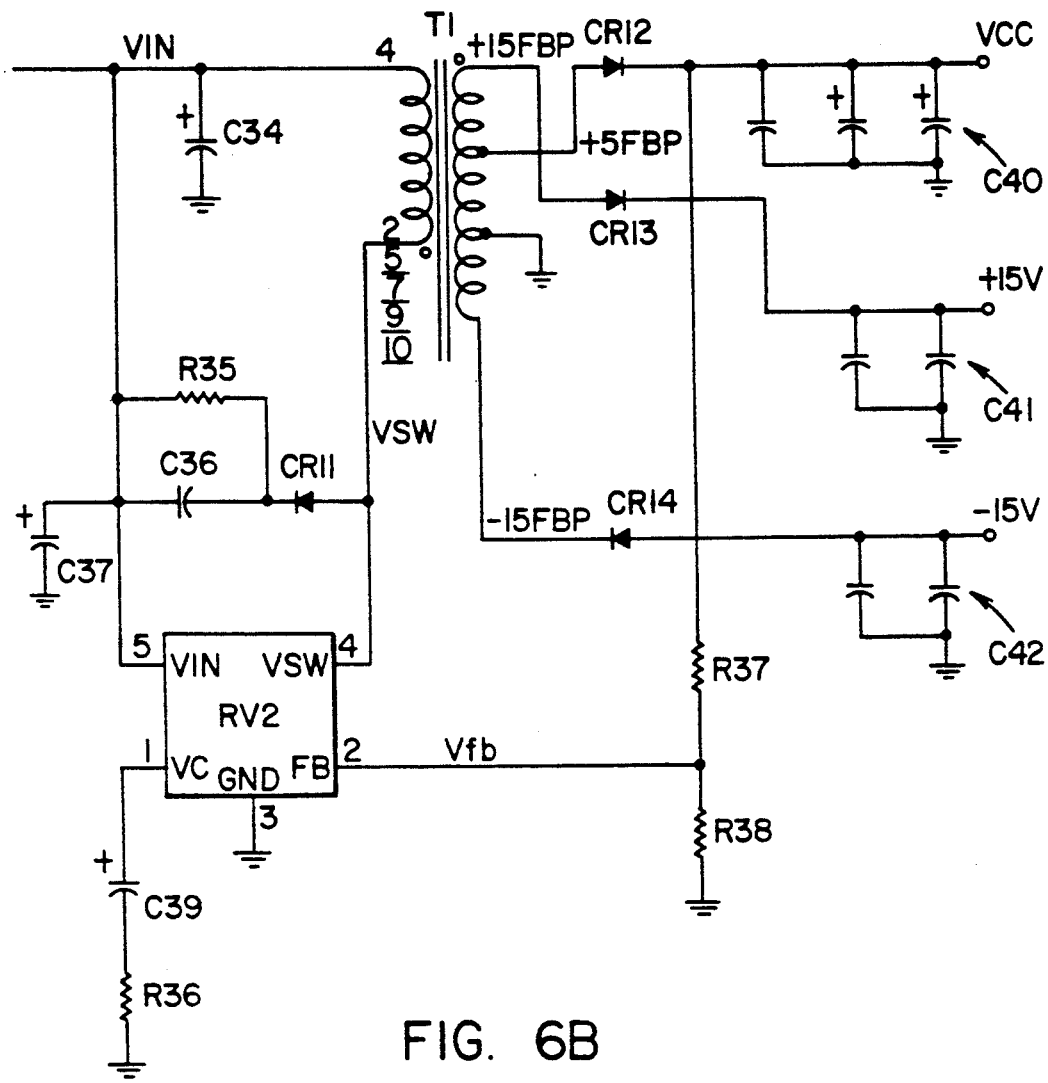
Figure 7A:
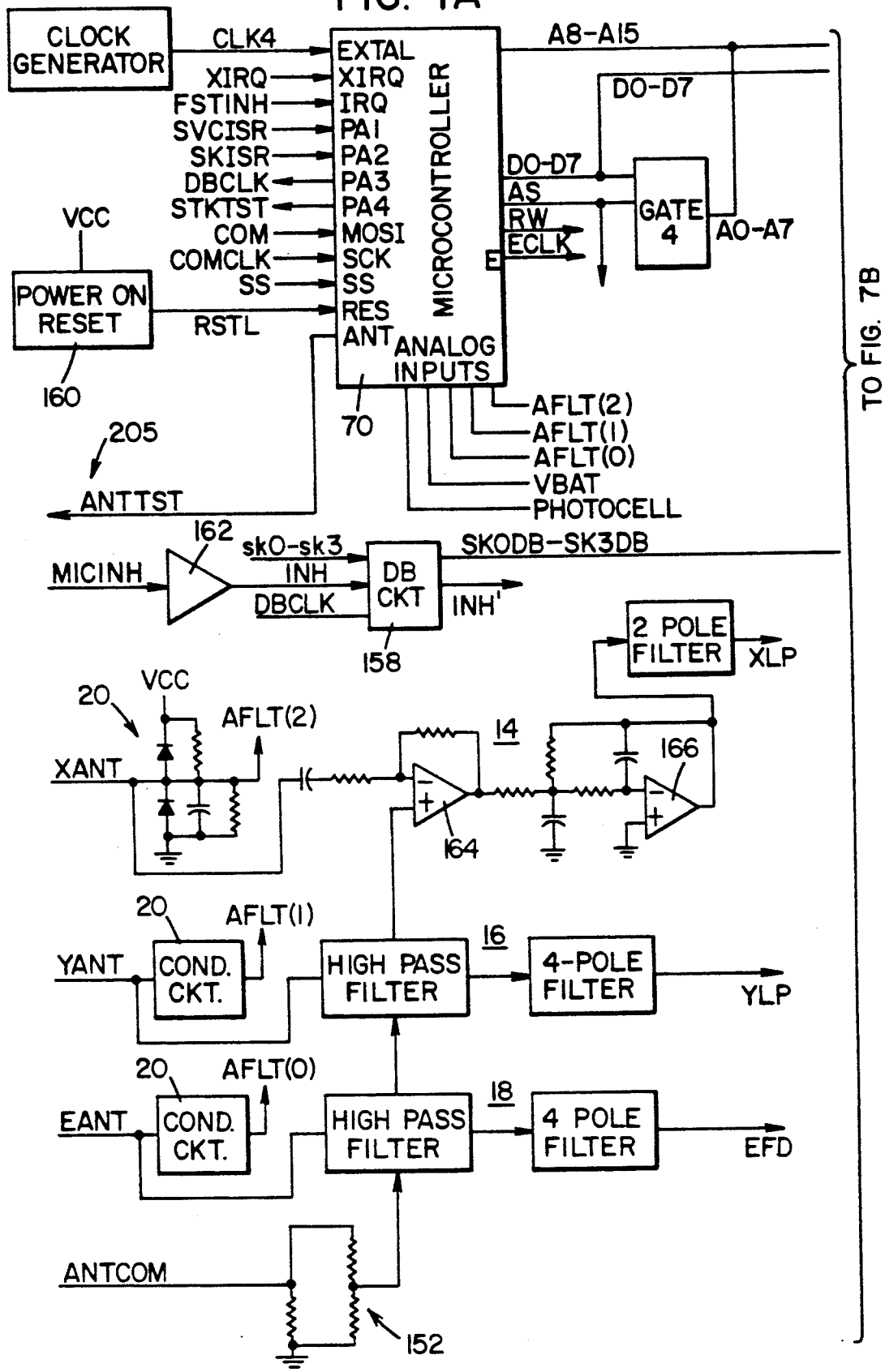
FIGS. 7A and 7B are, in combination, a circuit schematic of a suitable circuit for embodying the controller module of the system.
Figure 7B:
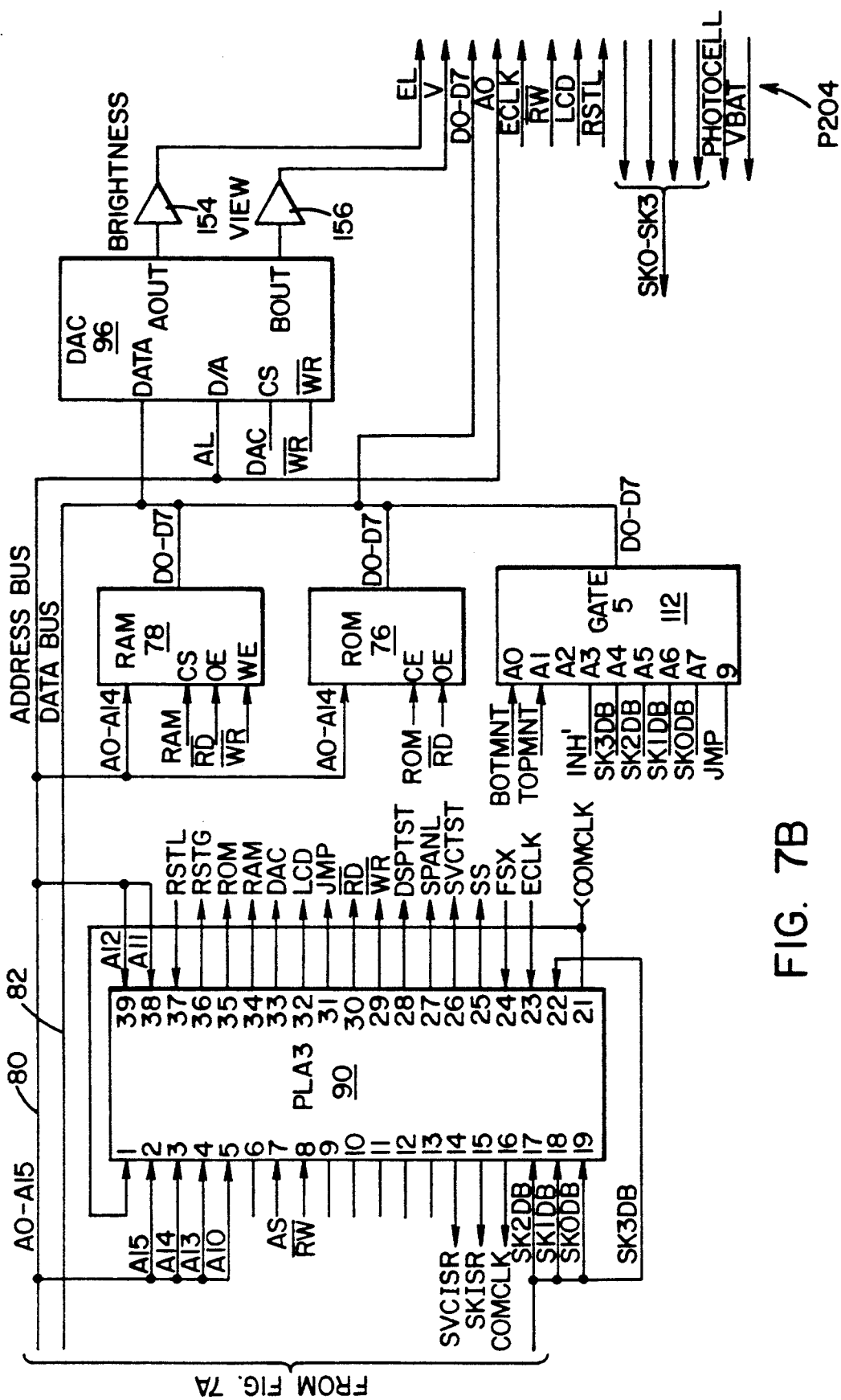
Figure 8A:
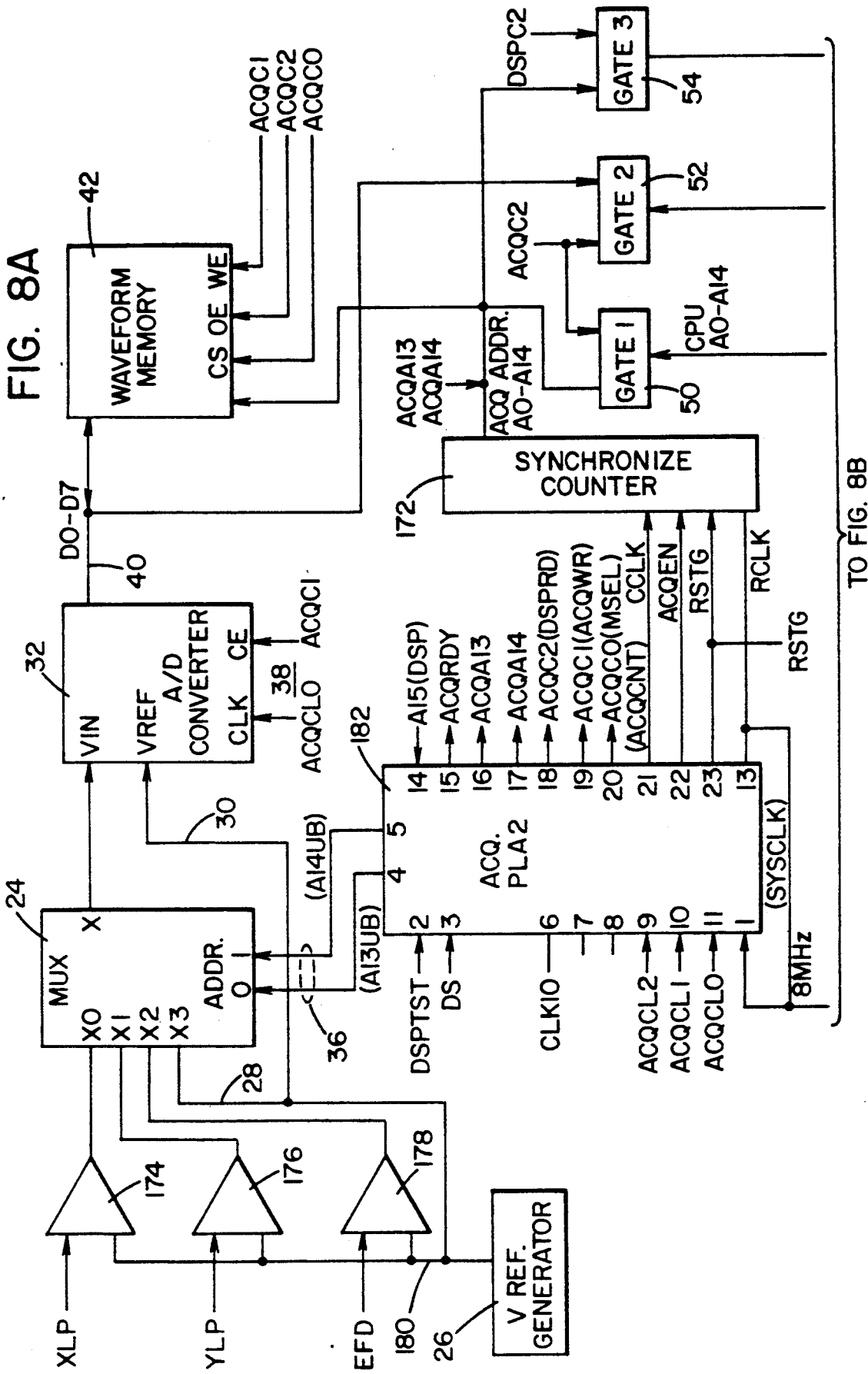
FIGS. 8A and 8B are, in combination a circuit schematic of a suitable circuit for embodying the DSP module of the system.
Figure 8B:
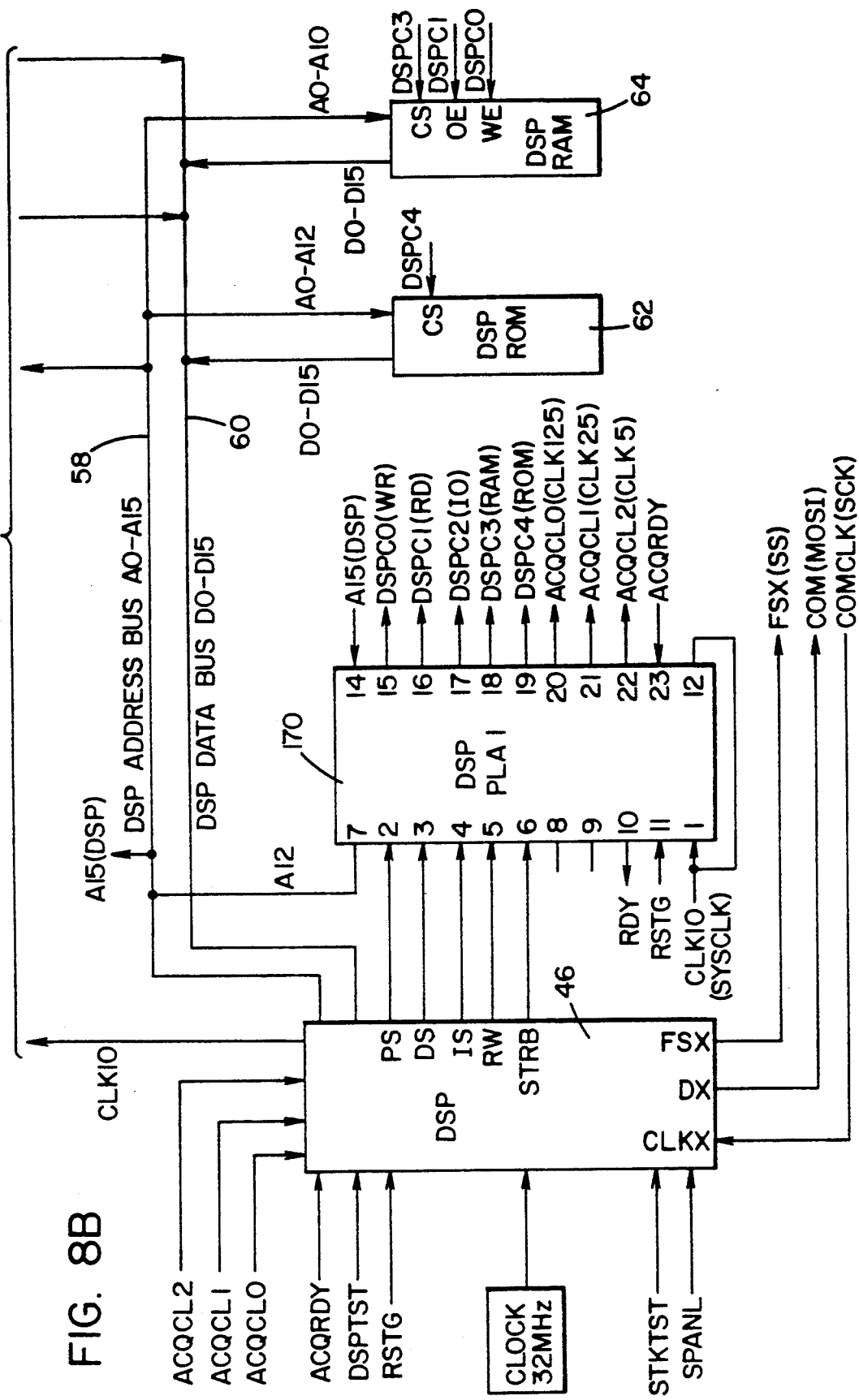
Figure 9B:
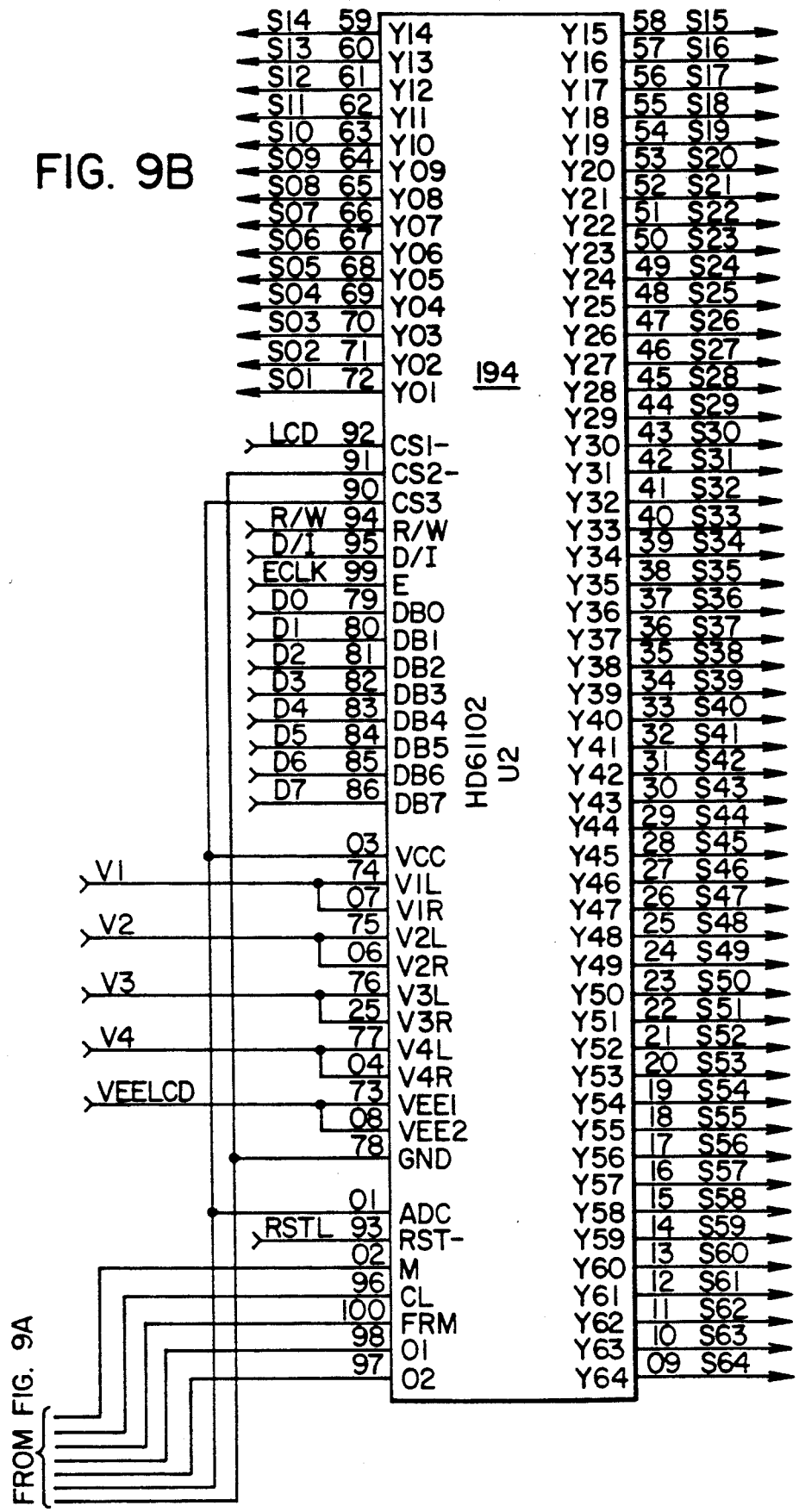
Figure 9C:
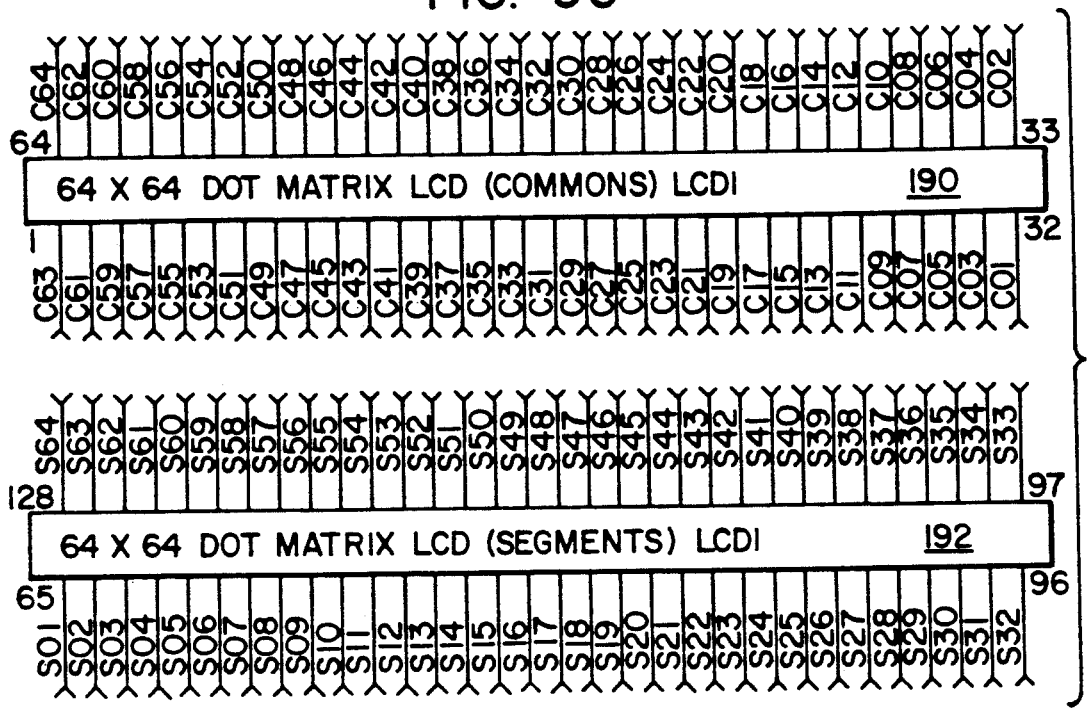
Figure 9D:
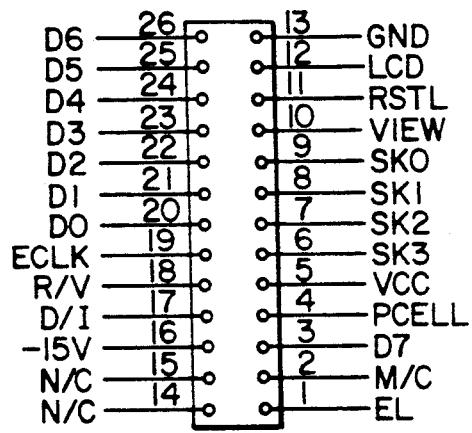
Figure 9E:
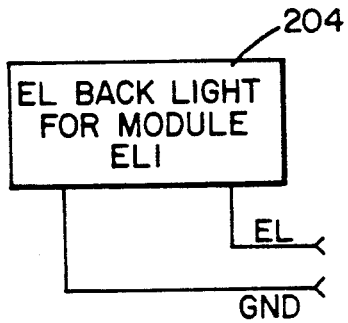
Figure 9G:
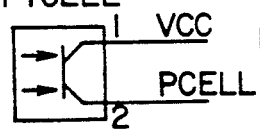
Figure 9H:
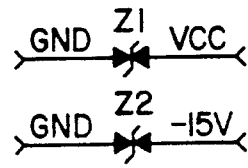
Figure 9F:
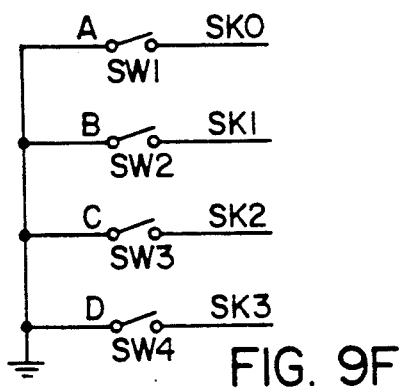
Figure 10A:
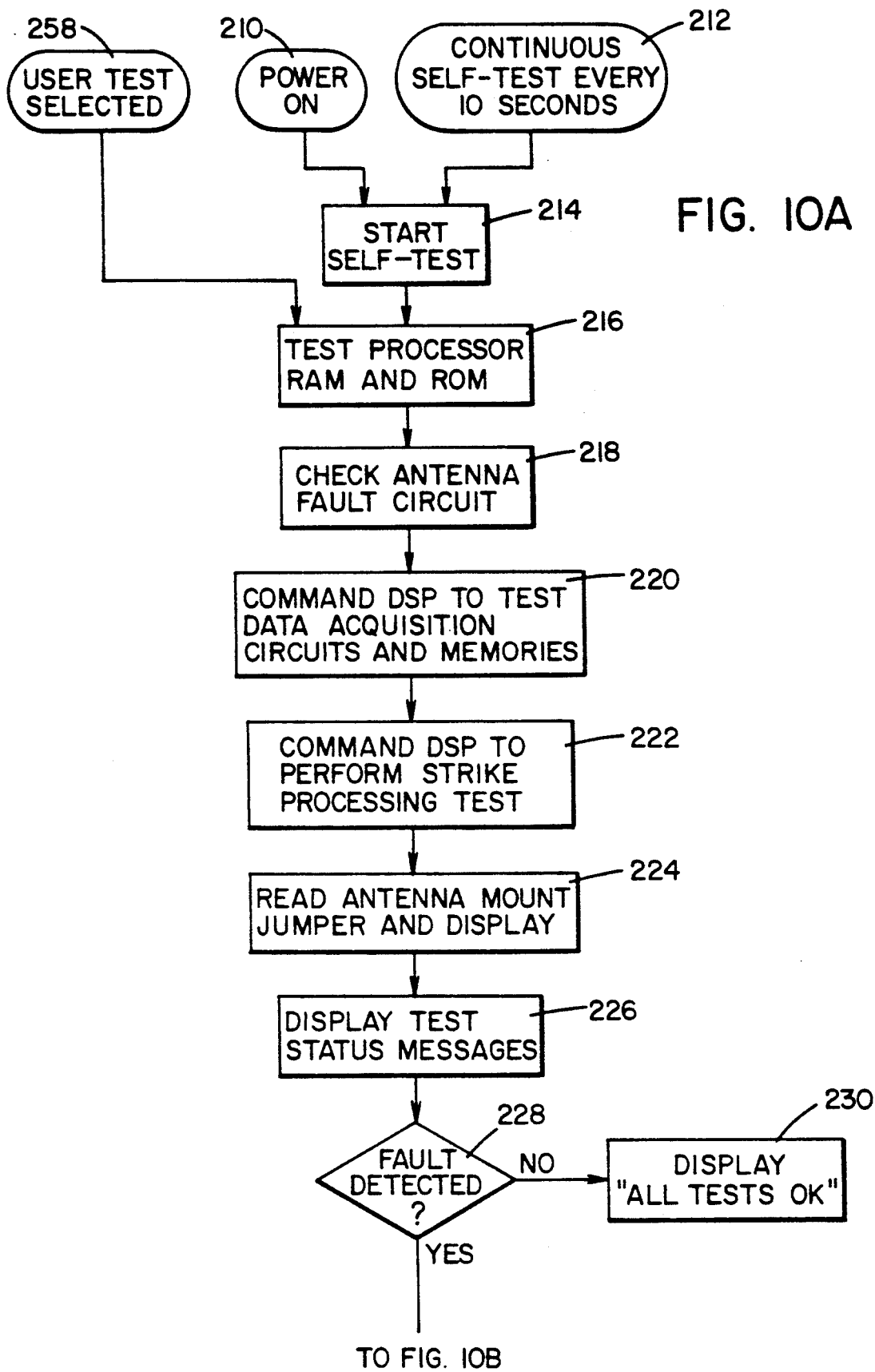
FIGS. 10A and 10B are, in combination a software flow chart exemplifying a suitable programmed routine for operation of the microcontroller of the controller module.
Figure 10B:
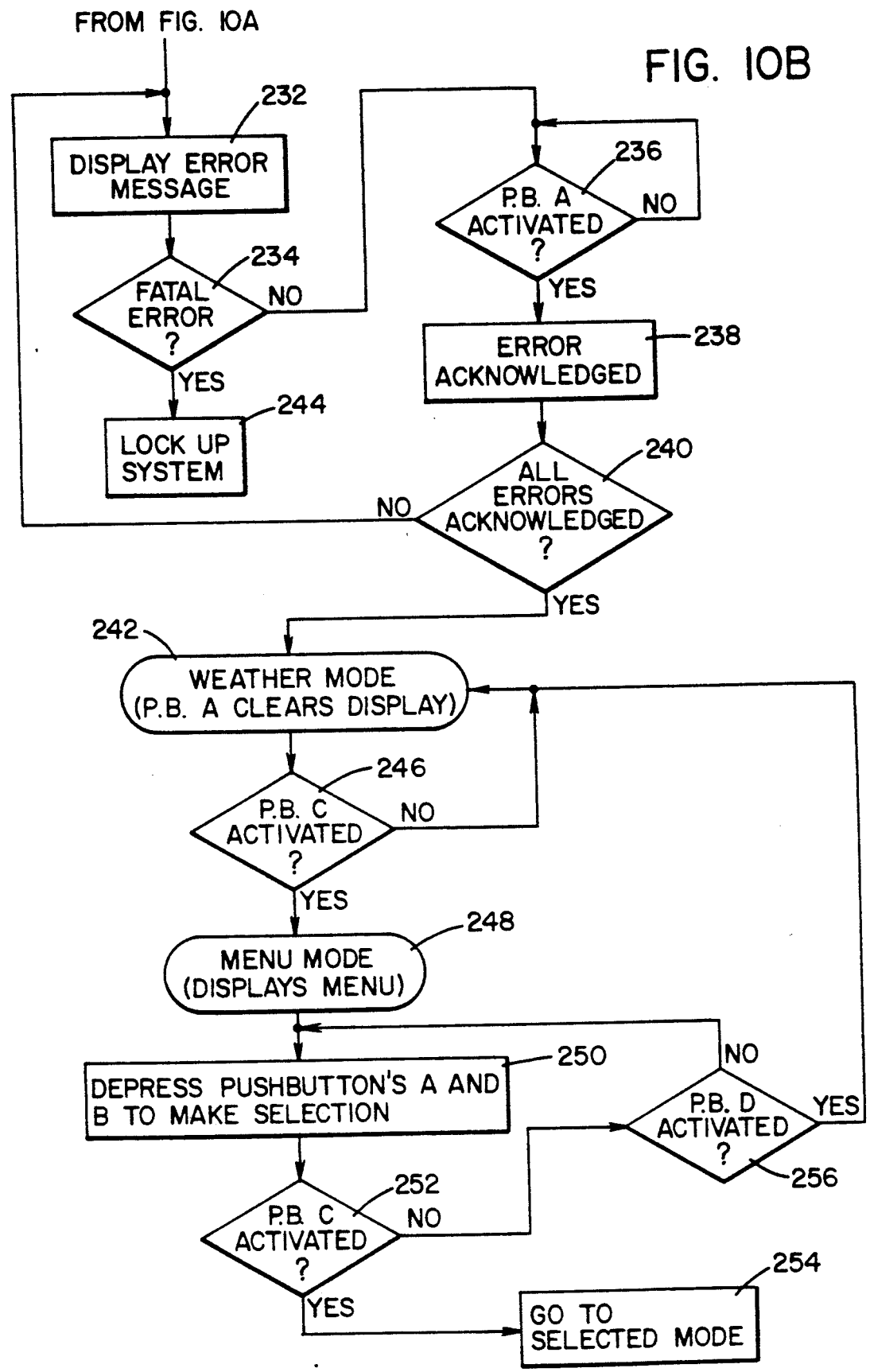
Figure 36A:
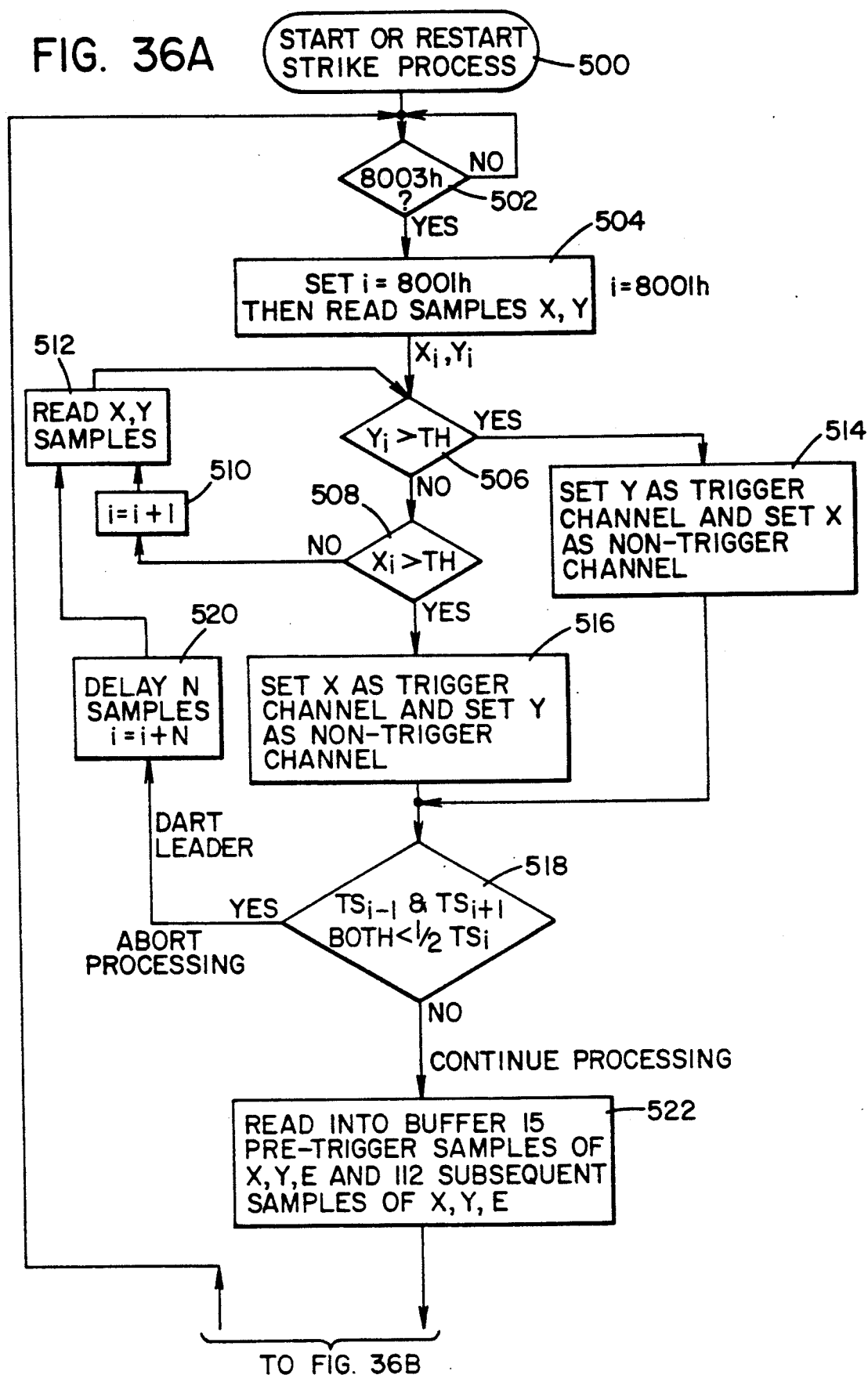
Figure 36B:
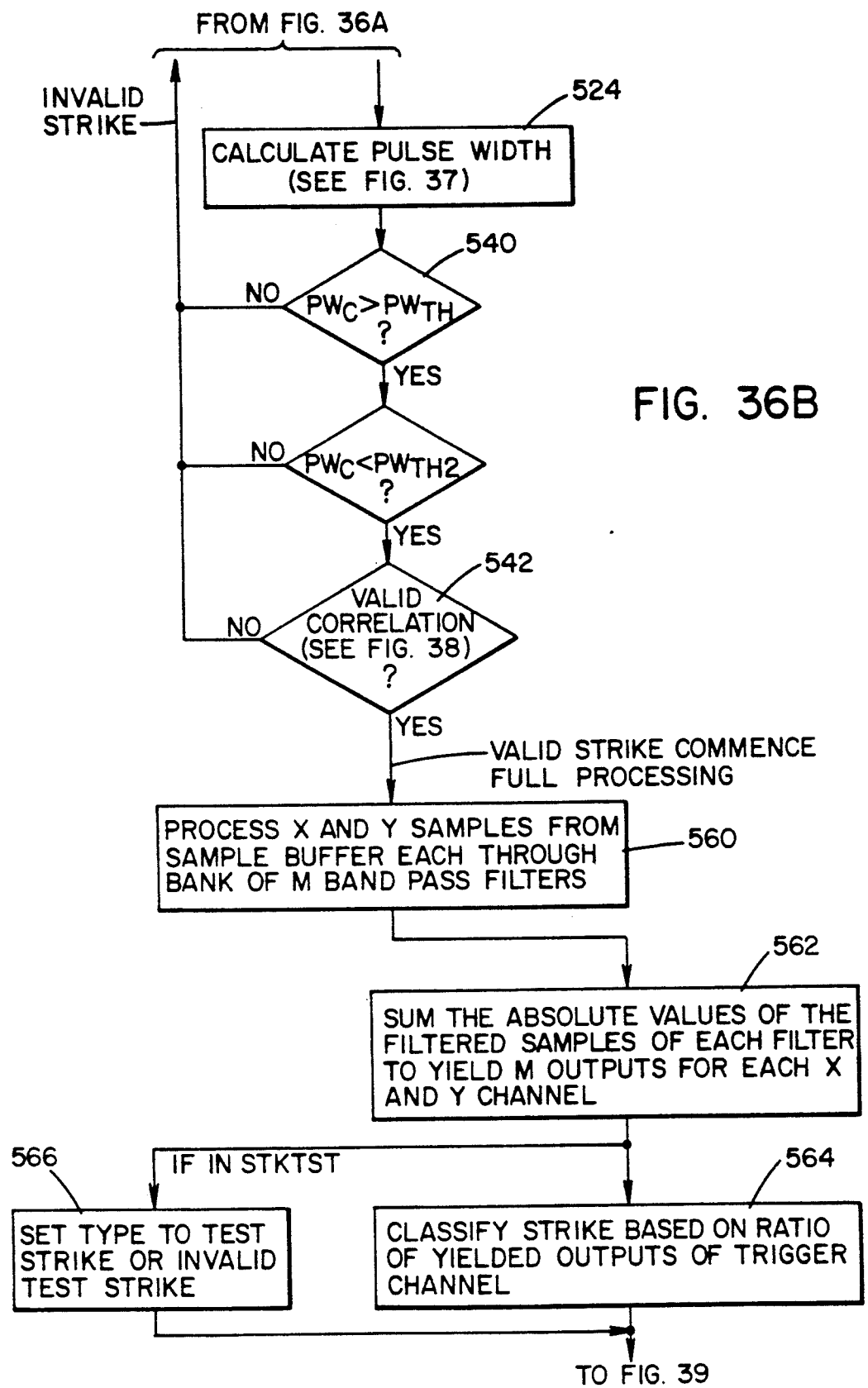

In the text of the following paragraphs, wherever FIG. 1 is used, it is referring to the combination of FIGS. 1A and 1B; wherever FIG. 4 is used, it is referring to the combination of FIGS. 4A, 4B and 4C; wherever FIG. 5 is used, it is referring to the combination of FIGS. 5A and 5B; wherever FIG. 6 is used, it is referring to the combination of FIGS. 6A and 6B; wherever FIG. 7 is used, it is referring to the combination of FIGS. 7A and 7B; wherever FIG. 8 is used, it is referring to the combination of FIGS. 8A and 8B; wherever FIG. 10 is used, it is referring to the combination of FIGS. 10A and 10B; and wherever FIG. 36 is used, it is referring to the combination of FIGS. 36A and 36B.

FIG. 1 is a functional block diagram of a lightning strike detection and mapping system suitable for embodying the principles of the present invention. Referring to FIG. 1, an antenna module 10 includes a conventional crossed loop antenna for sensing and receiving the magnetic field radiated from a lightning strike. The module 10 includes conditioning circuits coupled to the loop antenna for generating signal waveforms denoted as X and Y representative of the received components of the magnetic field. In the present embodiment, the X and Y signals are substantially orthogonal. Further, the antenna module 10 includes a sense antenna which may be non-directional for sensing and receiving an electrical field radiated from a lightning strike and conditioning circuitry coupled to the sense antenna for generating a signal waveform E representative of the received electric field.

The generated signals X, Y and E are provided over a path 12 to respective filter/amplifiers 14, 16 and 18 for the further conditioning thereof. The three signals X, Y and E are also provided to a fault conditioning circuit 20 which shall be described in greater detail here below in connection with an antenna test operation.

The conditioned X, Y and E signals are provided over a path 22 to respective inputs of a multiplexer 24. In addition, a reference signal generator 26 generates one reference signal over path 28 to another input of the multiplexer 24 and another reference signal over path 30 to a reference signal input of a high speed analog-to-digital A/D converter 32.

A data acquisition (ACQ) control block 34 controls the sampling of the X, Y and E signal waveforms and the reference signal by the path 36 and controls the digitizing thereof by the converter 32 with signals over the path 38. In the present embodiment, the digitized samples are generated as a train of data samples corresponding to and representative of each of the X, Y and E signal waveforms and conducted over an 8 bit data bus 40 to a signal waveform memory 42 for storage therein. The ACQ control block 34 addresses the memory 42 utilizing an address bus 44 to designate the storage register of each of the digitized data samples.

The ACQ control block 34 coordinates its operational activities with a programmed digital signal processor (DSP) 46 utilizing by-directional signal lines 48. The ACQ control block 34 also governs the operation of three digital gates 50, 52 and 54 by the signals over path 56. In the present embodiment, the DSP 46 is capable of addressing the memory 42 using its address bus 58 via gate 50 and also of reading the contents of the addressed storage register of memory 42 over a portion of its data bus 60 via gate 52. The DSP 46 is also capable of reading the ACQ address bus 44 over its data bus 60 via gate 54. The digital signal processing section further includes a read only memory (ROM) module 62 and a random access memory (RAM) module 64 both of which being coupled to the DSP 46 over the address and data busses 58 and 60, respectively. In this embodiment, the DSP 46 processes the data samples of the sampled-data waveform trains to detect a lightning strike and estimates a location thereof for weather mapping process.

Further in the present embodiment, the operations of the DSP 46 are controlled to a great extent by a programmed control processor 70 utilizing signal lines over a path 72 connecting the processor 70 and DSP 46. In addition, processed data, like the location of the detected lightning strike with respect to an observation location, for example, is provided from the DSP 46 to the control processor 70 over a communication bus 74 coupling the two units. The control processing section also includes a read only (ROM) memory 76 and a random access (RAM) memory 78 which are coupled to the control processor 70 through an address bus 80 and a data bus 82.

The control processor or microcontroller 70 is programmed to drive a display unit 84 from the data bus 82 utilizing a control block 86 and drive block 88 both of which may be part of the display module 84. In the present embodiment, the display module 84 is a liquid crystal display (LCD) having on the order of a 64 by 64 pixel array. An ancillary logic block 90 coordinates operational activities with the control processor 70 utilizing a by-directional signal path 92 to generate and receive logic signals over a by-directional path 94 which is coupled to the various modules of the control processing section, like the memories 76 and 78 for enabling and controlling read and write operations, for example. The signal path 94 is also coupled to the control block 86 to enable and control the operations thereof as well.

The control processor 70 is also capable of controlling the brightness and contrast of the display module 84 utilizing a two channel digital-to-analog (D/A) converter 96 which is coupled to the processor 70 through the data bus 82. The enabling and control of the converter 96 is provided by signals over path 94. One output signal of the converter 96 governs the contrast of the display unit 84 over path 98 and the other signal adjusts brightness of a back panel light module 100 of the display module 84 over path 102. A photocell 104 disposed in close proximity to the display unit 84 measures ambient light conditions and generates a signal over path 106 representative thereof. The control processor 70 is capable of reading the signal 106 through an analog-to-digital (A/D) converter 108 and the data bus 82. Once again, the signals of the path 94 enable and operate the converter 108.

Still further, operator interface pushbuttons referred to as softkeys and designated by block 110 may be read by the control processor 70 through a digital gate 112 and the data bus 82. The gate 112 also permits reading of other digital signals, like antenna mount jumpers designated by the block 114 and a microphone inhibit signal designated by the block 116, for example. Similarly, the gate 112 is enabled and controlled by the logic signals of path 94.

Finally, the control processor 70 is capable of generating an antenna test signal over path 120 to the antenna module 10 for testing the X, Y and E receiving circuits thereof. Resultant test signals of the X, Y and E circuits are conducted over the path 12 and through the conditioning circuit 20 to the A/D converter 108 for reading by the control processor 70 via the data bus 82. Still further, the control processor 70 is capable of monitoring the power source of the system by reading the bus voltage thereof over path 122 utilizing A/D the converter 108 and data bus 82.

The foregoing description of the functional block embodiment of FIG. 1 was provided merely as an overview of a lightning strike system for use as a reference for the more detailed description of the preferred embodiment and operation thereof in the following paragraphs. Accordingly, the various inventive features embodied by this system embodiment shall become more evident from this more detailed description.

Figure 2:
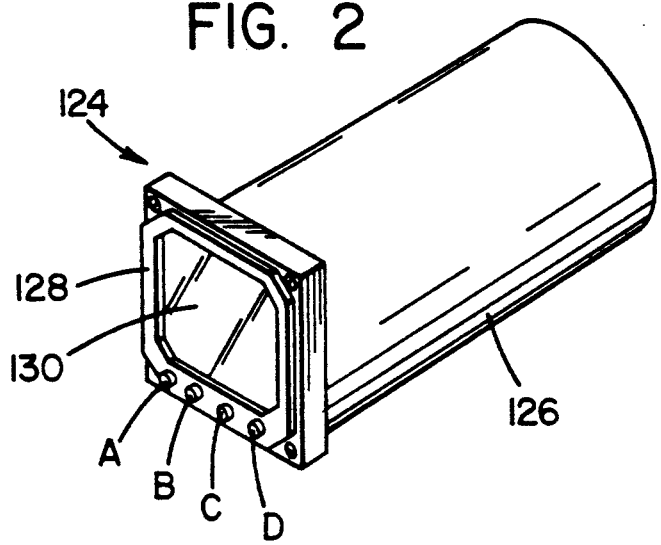
FIG. 2 is an illustration of an exemplary physical embodiment of the preferred system which depicts the display module and the electronic processing section enclosure thereof.

In FIG. 2, an illustration of an exemplary physical embodiment of the preferred system shows the display module depicted at 124 and the electronic processing section enclosed within an enclosure depicted at 126. Four softkeys or pushbuttons A, B, C and D are disposed at the bottom of the display section 124 within a bezel mount 128 surrounding the a panel LCD unit 130. The photocell or ambient light measuring instrument may be disposed in close proximity to the display 130 like, for example, in the bezel 128 thereof.

Figure 3:
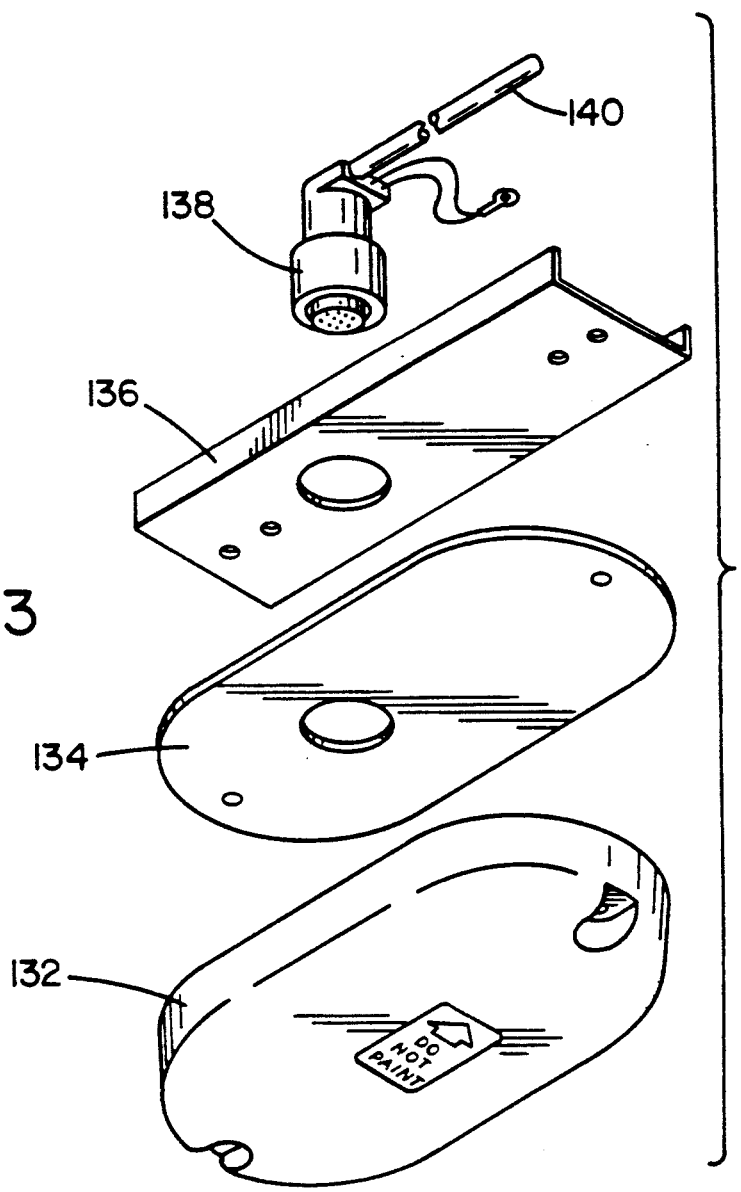
FIG. 3 is an illustration exemplifying a physical embodiment of an antenna module and ancillary structural members utilized to affix the module to the body of an aircraft.

In FIG. 3 is an illustration exemplifying a physical embodiment of an antenna module 132 and ancillary structural members 134 and 136 utilized to couple the antenna module 132 to the outside surface of the body of an aircraft. More specifically, the plate 136 is mounted under the aircraft skin to facilitate easy installation and removal of the antenna 132. Also depicted is an exemplary physical embodiment of a connector 138 for conducting the electrical signals X, Y and E from the antenna module 132 over a cable 140 to the electronic processing sections of the system.

Referring to FIG. 4, in the present embodiment the electronic processing section of the system comprises three separate and distinct modules 142, 144 and 146 referred to as the power supply module, the controller module and the DSP module, respectively. Module 142 is coupled to module 144 through two sets of connectors—J303/P203 and J304/P204, for providing signal and power paths therebetween. Similarly, module 144 is coupled to module 146 through another two sets of connectors—P202/J102 and P201/J101, for providing signal and power paths therebetween. A display module 148, which is part of the display section 124 as depicted in FIG. 2, is coupled to the power supply 142 through a connector designated as P301.

Also, the antenna module 132 which includes the cross looped antennas depicted at 142 and the sense antenna depicted at 145 is shown coupled to the controller module 144 over the cable 140 and connector P205. Also coupled to the cable is the system power source or battery 147 and a communications device 149 which may be a conventional two-way radio, for example. In the present embodiment, when the radio transmitter is in use, the device 149 generates an inhibit signal denoted as MICINH over signal path 150. Accordingly, signals from the antenna module 132, battery 147 and communication device 149 are coupled through the cable 140 to the connector P205 of the controller module 144.

A circuit schematic of a suitable circuit for embodying the antenna module 132 is shown in FIG. 5. As previously described, the antenna module receiving circuitry is coupled to the X and Y crossed loop coils 143 and the sense antenna 145. In the present embodiment, the sense antenna may be substantially a large area of foil or capacitive sense plate on the solder side of a printed circuit board implementing the circuit schematic of FIG. 5. More specifically, the X and Y loops of the antenna 143 are coupled to respective operational amplifier circuits OP1 and OP2, configured as 2-pole filter/amplifiers. The X loop coil is coupled to nodes N1 and N2 across a resistor R16. The node N2 is coupled to the non-inverting (+) input of OP1 which is connected to ground or common. Node N1 is connected through a series combination of resister R13 and capacitor C6 to an inverting (−) input of OP1 which is also connected through resistor R8 to the output thereof. The output of OP1 is also coupled through a parallel connection of resistor R9 and capacitor C4 to the connecting node between R13 and C6. Similarly, the Y loop is coupled to nodes N3 and N4 across a resistor R22. The node N4 is coupled to a non-inverting (+) input of OP2 which is also coupled to ground or common. Node N3 is coupled through a series combination of resistor R21 and capacitor C7 to an inverting input (−) of OP2 which is coupled to the output thereof through resistor R18. The output is also coupled through a parallel combination of resistor R17 and capacitor C5 to the node connection between R21 and C7.

The output of OP1 is coupled to a non-inverting operational amplifier (OP3) circuit whose gain is set by resistors R6 and R10 and includes a single-pole low pass filter having a high frequency roll off determined by a feed-back parallel combination of resistor R6 and a capacitor C12. The output of OP3 is conducted through a resistor R11 and becomes the signal XANT representing one component of the magnetic field. Similarly, the output of amplifier OP2 is conducted through an inverting operational amplifier (OP4) circuit in which the gain is set by resistors R24 and R19. The circuit of OP4 includes a low pass filter with a high frequency roll off set by the feed back parallel combination of resistor R24 and a capacitor C13. The output of OP4 is conducted through resistor R25 and becomes signal YANT which is representative of another component of the magnetic field.

Since both of the X and Y loop channel circuits are basically similar, only the X channel circuit will be described for operational purposes. Referring to FIG. 5, the magnetic field of a lightning strike produces a current in the winding of the loop/core assembly. The resistor R16 dampens the natural Q of the winding at frequencies above the normal operation of the amplifier OP1. The amplifier circuit of OP1 operates as a current to voltage converter yielding a voltage at the output of OP1 proportional to the current induced in the X loop coil. Accordingly, this method of loading the X loop coil into the node of an inverting amplifier OP1 effects a response directly to the current in the winding of the X loop eliminating substantially the inductive effects of the coil itself. Consequently, a nearly flat frequency band pass response is achieved except for the intentional frequency rolloffs caused by (1) R13 and the inductance of the X loop winding for low frequency rolloff and (2) C4 and R9 for the high frequency rolloff. The output of OP1 is applied to the non-inverting amplifier circuit of OP3 for further amplification and high frequency roll-off set by R6 and C12. The output of OP3 is decoupled by the resistor R11 to prevent oscillation of OP3 due to capacitive loading by the cable 140. The Y loop channel is basically the same as described for the X loop, except that the output of OP2 is coupled to the inverting op amp circuit of OP4. The output signals XANT and YANT of the loop channel circuits are made opposite in polarity to guard agains X-Y wiring errors during installation.

Now turning to the sense channel of FIG. 5, the sense antenna or sense plate 145 is coupled to the node N5 which is part of a feedforward input coupling to an operational amplifier OP5. The output of OP5 is coupled through a parallel combination of resistor R20 and capacitor C2 to a node N6 which is coupled to ground through resistor R12. Node 6 is coup)ed to Node 5 by a capacitor CF which may be formed by another large foil area on the component side of the PCB opposite the sense plate 145 foil area. Node N5 is coupled through resistor R1 to an inverting input (−) of OP5 which in turn is coupled to the output thereof through resistor R2. The non-inverting input (+) of OP5 is coupled to ground or common. The inverting input is also coupled through a parallel combination of diodes CR1 and CR2 to ground. The output of OP5 is further amplified by an inverting operational amplifier (OP6) circuit, the amplification of which being set by resistors R4 and R3 and a high frequency rolloff thereof being set by the resistor R4 and a capacitor C11 in the feedback network thereof. The output of OP6 is conducted through a resistor R5 to become the signal EANT which represents the E field of the lightning strike.

In operation, the signal from the antenna sense plate 145 is amplified by the operational amplifier circuit of OP5 which is configured as a charge amplifier. Resistor R1 and diodes CR1 and CR2 protect the input of the amplifier OP5 from large amplitude swings. The antenna plate 145 is coupled into the feedback path of the amplifier network to control the amplifier gain and permit frequency rolloff by the feedback elements R12, R20 and C2 which are applied to the inverting node, in the present embodiment, through the other capacitor $C_F$. This implementation affords a shielding advantage over a simple capacitor since E field generations from the centers of the magnetic windings 143 ma be effectively shielded from the top sense plate 145 by the lower feedback plate $C_F$. The output of OP5 is further amplified and filtered by the inverting amplifier circuit of OP6 and decoupled from the cable 140 by the resistor R5 to prevent capacitive loading induced oscillation thereof.

Antenna test circuitry is also found in the antenna module and is initiated by an antenna test signal denoted as ANTTST generated from the controller module 144. In this test circuit, a regulated 5 volt signal is produced at node N7 using an off-the-shelf regulator RV1. A +12 volt line is coupled to the I node of RV1 through resistor R32 and the node I is coupled to ground through the parallel combination of capacitor C18 and diode CR7. Further to the regulator circuit the node C of RV1 is coupled to ground and to the output node O through a parallel combination of resistor R27 and capacitor C8. The output O which is node N7 becomes the regulated logic source potential of the test circuit.

The node N7 is coupled to an emitter of a PNP transistor Q1 and also to the base thereof through a resistor R29. The base of Q1 is coupled through resistor R28 to a collector of a NPN transistor Q2. The test signal ANTTST is coupled through resistor 32 to an inverting node of an operational amplifier OP7. Also, A −12 V input voltage line is coupled through a resistor R31 to a node N8 which is coupled to ground through a parallel combination of diode CR6 and capacitor C3. Node N8 is also coupled through a resistor R26 to the inverting node of OP7 and also through a parallel connection of diode CR3 and CR4 to ground. The non-inverting node of OP7 is coupled to ground. Still further, the inverting node of OP7 is coupled to the base of Q2 and the emitter thereof is coupled to the output of OP7. Also a reverse biased diode CR5 is coupled across the emitter and base of Q2. Still further, the collector of Q1 is coupled through to nodes N1 and N3 through respective resistors R14 and R15 and also to ground through resistor R23. The collector of Q1 is also coupled through a capacitor C1 to a node N9 which is coupled to ground through resistor R7. The node N9 is coupled to the sense amplifier node N6, in the present embodiment, through a small round printed circuit board foil area under the sense amplifier plate foil and denoted by the dashed lines and capacitor $C_F$.

In operation, the controller module initiates an antenna test by generating the signal ANTTST expressed as a positive current pulse from a regulated logic voltage source potential. ANTTST is conducted through the resistor R30 to the inverting node of OP7. The current signal was selected, in the present embodiment, to minimize signal coupling due to voltage transitions and capacitive coupling inherent in the cable connection between the controller and antenna modules. In response to the current signal, the output of the amplifier OP7 is driven to a low voltage potential turning on the transistor Q2 through the emitter thereof, which in turn, turns on transistor Q1 by the base connected resistor R28 which causes the collector of Q1 to be pulled up to the regulated voltage source at the node N7. Accordingly, this voltage transition is coupled to the filter/amplifier circuits of the X and Y loop channels by resistors R14 and R15, respectively, and to the amplifier circuit of the sense channel by the shaping network of C1, R7 and the coupling capacitive foil $C_F$.

Returning to the amplifier circuit OP7, the voltage applied through resistor R26 to the inverting node offsets the switching point of OP7 to approximately one half of the full range of the test signal current which is set for the present embodiment at 1 ma so that at zero ma applied test current, the test signal is considered off. Still further, the resistor R27 of the regulator RV1 during non-test, no load periods loads the regulator RV1 to maintain proper voltage regulation. The diodes CR6 and CR7 protect the input nodes of RV1 against reversed power wiring by conducting and loading the 12 volt output regulators and forcing them into current limit without danger to the antenna test circuit components. Accordingly, the output signals XANT, YANT AND EANT responsive to the antenna test signal are coupled through the cable 140 to the controller module 144 to be analyzed thereby as will become more apparent from the description found hereinbelow.

A circuit schematic of a suitable circuit for embodying the power supply module 142 is shown in FIG. 6. The power source signals which for the present embodiment are battery terminal signals denoted as BATHI and BATLO are coupled from the controller board 144 to the power supply module connector J303. The signal BATLO is coupled to the ground or common of the module 142 and the signal BATHI is coupled across a capacitor C38 to ground and through a fuse F1 to a node N10. The node N10 is coupled through an inductor L1 to another node N11 which is coupled to ground through capacitors C33 and C34 and diode CR8 and also coupled to one side of a primary of a transformer T1.

The other side of the primary of T1 is coupled to a switching input of a off-the-shelf switching voltage regulator RV2 which uses pulse width modulation techniques. RV2 may be of the type manufactured by Linear Technology bearing model no. LT1070, for example. Coupled across the primary of T1 is a diode CR11 in series with a parallel combination of resistor R35 and capacitor C36. Node N11 is also coupled to an VIN input of RV2 which is also coupled to ground through a capacitor C37. A voltage comparison VC input of RV2 is coupled to ground through the series combination of capacitor C39 and resistor R36.

Going back to transformer T1, one side of the secondary coil thereof is coupled through a diode CR13 to generate a +15 volt voltage supply output which is filtered by a plurality of capacitors, denoted by C41, coupled to ground. The other end of the secondary of T1 is coupled through a diode CR14 to generate a −15 volt power source which is filtered through a plurality of capacitors, denoted as C42, coupled to ground. Still further, the secondary of the transformer T1 is tapped and coupled through a diode CR12 to generate a +5 voltage supply or VCC which is filtered through a plurality of capacitors, denoted as C40, coupled to ground. The +5 V or VCC supply is coupled through a resistor network of resistors R37 and R38 to ground with the connecting node thereof coupled to the feedback node FB of the regulator RV2.

The +15 volt and −15 volt supplies are coupled through conventional 3-terminal voltage regulator circuits RV3 and RV4, respectively, to generate the +12 and −12 voltage supplies which are coupled through connector J303 back to the controller module 144. The outputs of the regulators RV3 and RV4 are decoupled to ground through capacitor C43 and C44, respectively, and decoupled from the cable connection through resistors R39 and R40, respectively.

The battery voltage at node N10 which represents the output of avionics power source is coupled through a resistor network R33 and R34 to ground with the connecting node thereof becoming the power source monitoring signal VBAT. Diodes are coupled from the connecting node to VCC and ground and a capacitor C35 is connected across R34 to ground. Also, on the power supply module 142, a plurality of signals denoted as PSIG are coupled directly through the module 142 from the control module connector J304 to the display module connector P301. Amongst these PSIG signals is the photocell signal which is filtered by a resistor R41 and capacitor C45 combination to ground. In addition, a Brightness signal of the plurality PSIG is converted from DC to AC utilizing a conventional circuit. The other signals of PSIG will become more evident from the description of the Controller and DSP modules found in the following paragraphs.

In operation, the incoming battery voltage signal BATHI is limited by the fuse F1 for protection in the event of defect and the resulting signal is conducted through inductor L1 and capacitors C34 and C35 to provide a low impedance power source to the remainder of the circuitry. The inductor L1 and C38 serve to decouple electromagnetic interference from the switching power supply RV2 as well as high frequency noise from the avionics buss. The diode CR8 is normally reverse biased but will forward bias in the event of a reverse power line wiring to protect the power supply by blowing the fuse F1.

The heart of the power supply module circuit is the switching voltage regulator RV2 which includes all of the circuitry to implement a regulated fly-back topology covering an input voltage range of 8 to 40 volts. An electronic switch inside the regulator RV2 conducts to apply the full battery voltage across the primary of T1 which current loads the inductance thereof. After a time interval determined by the timing circuitry of RV2, the internal electronic switch opens allowing the built-up magnetic flux to "fly-back". The fly-back energy of the primary is coupled through to the secondary and the diodes CR12, CR13 and CR14 to be stored in the capacitors C40, C41 and C42. The voltage proportions are determined by the transformer winding ratios of the primary and secondary. A voltage feed-back signal is returned from the VCC output through the resistor network R37 and R38 to the regulator RV2. C39 and R36 set the frequency compensation of RV2 to match the feed-back delays unavoidably caused by output capacitors. The filtering components R35, C36 and CR11 form a "snubber" network that together control any high voltage spikes under fly-back conditions that would normally be present due to the leakage inductance of the transformer T1. If left uncontrolled, the regulator RV2 may be damaged if the spike exceeds damage voltage levels. In the present embodiment, the switching frequency of RV2 is set at approximately 40 kilohertz which provide waveforms which are square in shape and a duty cycle varying proportionally with the reference feed-back voltage level.

In addition, the regulators RV3 and RV4 are conventional three terminal regulators which are decoupled to ground with capacitor C43 and C44 and also decoupled from the connector with resistors R39 and R40. In the present embodiment, the regulators RV3 and RV4 are set to current limit at approximate 100 mil. amps. should the antenna power wiring be reversed or shorted inadvertently. Also, the measured battery voltage is scaled by the resistor network R33 and R34 and capacitor C35 and limited by the diodes CR9 and CR10 before being sent to the controller board (VBAT) for monitoring thereby. Further, the photocell sensor signal is conditioned by the parallel combination of resistor R41 and capacitor C45 before being sent to the controller board for monitoring. Still further, the DC/AC convertor coupled in the Brightness signal path is used to power the electroluminescent (E/L) back-light behind the LCD display panel. The brightness signal DC voltage level is generated on the controller module and conducted to the power supply module. The DC voltage varies from approximately 4 to 15 volts, in the present embodiment, to control the brightness of the back-light. The output of the convertor is over 100 volts RMS at roughly 400 hertz as determined by the capacitance of the back-light itself. This frequency can vary considerably from back-light to back-light, age and input voltage to the display module. The output waveform is a crude sign wave usually clipped on one excursion.

Next to be described is the controller module 144. A suitable circuit embodiment thereof is shown by the schematic of FIG. 7. At the heart of the controller module is the micro controller 70, which for the present embodiment, is a Motorola MC68HC11A1, for example, which includes an 8 bit microprocessor operative at 1 megahertz and an 8 channel A/D convertor, 5 timers, 8 general purpose input/output (I/O) bits, an asynchronous communications channel, and a synchronous communication channel, 512 bytes of eeprom, and 256 bytes of RAM. The operation of the Motorola microcontroller is well known to those skilled in the pertinent art and is described in the *Motorola SemiConductor Technical Data Bulletin* published by Motorola, Inc. (1988) which may be ordered by the document no. MC68HC11A8/D. This manual is incorporated by reference in the instant application to provide greater details of the architecture and operation of the microcontroller 70.

The following functions are controlled by the controller module: (1) receives lightning strike location data from the DSP module via the synchronous communications link (COM, SS), (2) generates display data and writes such data to the display module (D0-D7, ECLK, AO, RW, LCD), (3) decodes the softkey activations (sk0-sk3), (4) monitors the photocell to determine ambient light level (photocell), (5) controls the brightness of the EL back-light (EL), (6) checks the antenna lines (XANT, YANT, EANT) for antenna fault conditions (AFLT0, AFLT1, AFLT2), (7) generates the antenna test signal (ANTTST), (8) generates the contrast adjust voltage (VIEW) for the LCD display, (9) reads the antenna mount jumpers (BOTMNT, TOPMNT) to determine aircraft bottom/top mount antenna, (10) monitors the microphone inhibit line (MICINH), (11) generates the communications clock line (COMCLK) for synchronous communications with the DSP module, (12) monitors the avionics bus voltage level (BVAT), (13) generates control signals to the DSP module to initiate the DSP self-test (DSPTST), the spectrum analyzer mode (SPANL), and to inform the DSP that a test signal is being generated (STKTST), (14) generates a master reset (RSTL) for the controller board, display and DSP module (RSTG), (15) conditions and filters the three antenna Waveforms signals (XANT, YANT, EANT), which are then passed to the DSP module for processing (XLP, YLP and EFD).

As described in connection with the functional block diagram schematic of FIG. 1, the microcontroller 70 coordinates its logical operations with the controller logic 90 which for the controller module is suitably embodied by a programmable logic array (PLA3) which may be of the type manufactured by Altera Corporation bearing the module no. EP900EPLD, for example. The programming of the logic array is defined by a set of equations based on the logic inputs and outputs thereof. For the present embodiment, the input, outputs and equations are shown below in Table 1:

TABLE 1

INPUTS:
COMCLK,A15,A14,A13,A10,AS,RW,SK2DB,SK1DB,SKODB, SK3DB,ECLK,FSX,RSTL,A11,A12
OUTPUTS:
SVCISR,SKISR,SS,SVCTST,SPANL,DSPTST,WR,RD,JMP, LCD,DAC,RAM,ROM,RSTG,COMCLK

| NETWORK: | EQUATIONS: |
|---|---|
| comclk - INP (COMCLK) | rom = (a15)'; |
| a15 = INP (A15) | ram = (a15'* a14')'; |
| a14 = INP (A14) | lcd = (a15'*a14*a13'*a12'*a11')'; |
| a13 = INP (A13) | dac = (a15'*a14*a13*a12'*a11)'; |
| a12 = INP (A12) | jmp = (a15'*a14*a13'a12*a11')'; |
| a11 = INP (A11) | dsptstn = (a15'*a14*a13'a12*a11); |
| a10 = INP (A10) | dsptst = (a15'*a14*a13*a12*a11); |
| eclk = INP (ECLK) | spanl = (a15'*a14*a13*a12'a11')'; |
| as = INP (AS) | svctst = (a15'*a14*a13*a12'*a11)'; |

TABLE 1-continued

```
rw   = INP (RW)              rstg =
                               ((a15'*a14*a13*a12*a11')+rstl)';
sk3  = INP (SK3DB)           svcisr = (sk0'*sk1');
sk2  = INP (SK2DB)           skisr = (sk0'+sk2'+sk3');
sk1  = INP (SK1DB)           rd = (rw*eclk)';
sk0  = INP (SK0DB)           wr = (rw'*eclk)';
eclk1 = CLKB (eclk)          cmq0d =
                               cmq0f*cmq1f+cmq0f*cmq1f';
fsx  = INP (FSX)             cmq1d = cmq1f';
rstln = INP (RSTL)           ss =(q0f+
                             q3f*q1f+q3f*q2f+q3f*q2f*q1f
                             +q3f*q2f*q1f*q0f)';
rstin = INP (RSTL)           END$
ROM   = CONF(rom,VCC)
RAM   = CONF(ram,VCC)
LCD   = CONF(lcd,VCC)
DAC   = CONF(dac,VCC)
JMP   = CONF(jmp,VCC)
SPANL = CONF(spanl,VCC)
SVCTST = CONF(svctst,VCC)
RSTG  = CONF(rstg,VCC)
RD    = CONF(rd,VCC)
WR    = CONF(wr,VCC)
DSPTSTF dsptstf = COIF(dsptst,VCC)
dsptstclk = CLKB (dsptstf)
DSPTST = RONF(VCC,dsptstclk,dsprstn,GND,VCC)
CMQ0,cmq0f = RORF(cmq0d,eclk1,rstl,GND,VCC)
CMQ1,cmq1f = RORF(cmq1d,eclk1,rstl,GND,VCC)
```

TABLE 1-continued

```
SS     = CONF(ss,VCC)
SVCISR = CONF(svcisr,VCC)
SKISR  = CONF(skisr,VCC)
```

In addition, all of the devices of the controller module are memory mapped within a 64k byte address space of the microcontroller 70. The address assignments are found below in Table 2:

TABLE 2

| Address | Size | Device Enable | Comments |
|---|---|---|---|
| 0000h - 003Fh | 64 × 8 | 68HC11A1 Registers | Internal Registers |
| 0040h - 00FFh | 192 × 8 | 68HC11A1 RAM | Internal RAM |
| 0100h - 3FFFh | 16128 × 8 | RAM | External Ram |
| 4000h | | LCD | control Register |
| 4001h | | LCD | LCD Data Registr |
| 4800h | | D/A Converter | Brightness Adj. DAC |
| 4801h | | D/A Converter | View Adjust DAC |
| 5000h | | Latch | Option Jumpers Latch |
| 5800h | | DSP Test Line | Set DSP INT0 Line Low |
| 6000h | | DSP Spect Anal Line | Pulse DSP INT2 Line |
| 6800h | | DSP Service Test Line | Pulse DSP INT1 Line |
| 7000h | | DSP Reset Line | Pulse DSP Board Reset |
| 7800h | | DSP Test Line | Set DSP INT0 Line High |
| 8000h - B5FFh | 13824 × 8 | EPROM | External EPROM |
| B600h - B7FFh | 512 × 8 | EEPROM | 68HC11 Internal EEPROM |
| B800h - FFFFh | 18432 × 8 | EPROM | External EPROM |

NOTES:
Address 1000h is the power-on default base address for the 68HC11 on-chip registers. When program execution begins, 00h must be written to the 68HC11 INIT register located at address 103Dh. This changes the base address of the registers to 0000h which is also the base address of the 68HC11 on-chip RAM. On-chip memory conflicts are automatically resolved by the 68HC11 to the addresses indicated in the memory map shown above. Notice that once the base address of the registers has been changed, the previous address space occupied by the registers becomes available for external use (RAM in this case).

The minimum DSP interrupt line pulse width is 25 ns. The minimum DSP reset line pulse width is 990 ns.

Many of the devices shown in the schematic of FIG. 7 are similar to those described in connection with the block diagram of FIG. 1 and shall be referred to with like reference numerals. One exception is the inclusion of a Gate 4 which has as inputs the data bus D0-D7 of bus processor 70 and outputs address lines A0-A7 to complement the address lines A8-A15 effected by the processor 70 to yield an overall address bus A0-A15. Gate 4 is activated by the address strobe AS of the processor 70 to capture the data on its inputs and store them on the corresponding output lines. To better understand the other interconnections of the logical signals of the controller module, reference is made to Table 3 found here below:

TABLE 3

| | Controller Board | | |
|---|---|---|---|
| Signal | From | To | Function Performed |
| FSK | DSP(DSPBD) | PLA3-P24 | Asserts SS (PLA3-P25) to micro to enable comm. interface for serial comm. between DSP and micro. |
| COM | DSP(DSPBD) | MICRO-MOSI | comm's serial data from DSP |
| COMCLK | DSP(DSPBD) | MICRO-SCK | synchronizing clock for data comm. |
| DSPTST | PLA3-P28 | DSP,PLAZ-P2 | generated from A10-A15 signals, and RW signal of micro to initiate DSP tests on DSP Board. |
| SPANL | PLA3-P27 | DSP | governs DSP to noise spectrum analysis, triggered by softkeys. |
| STKTST | MICRO-PA4 | DSP | governs test strike in comb. with ANTTST generated by micro-PA7. |
| DBCLK | MICRO-PA3 | DBCKT | used as CLK in debounce processing of softkey signals SK0-SK3(61Hz). |
| ECLK | MICRO-E | LCD | master clock for display. |
| AS | MICRO-AS | PLA3-P7 | strobes addr. inputs to |

TABLE 3-continued

| | Controller Board | | |
|---|---|---|---|
| Signal | From | To | Function Performed |
| RW | MICRO-RW | Gate 4<br>LCD<br>PLA3-P8 | PLA3 & Gate 4.<br>asserts RD (PLA3-P30) and<br>WR(PLA3-P29). |
| WR | PLA3-P29 | DAC-WR<br>RAM-WE | writes data from data bus into<br>addressed register. |
| RD | PLA3-P30 | RAM-OE<br>ROM-OE | enables output to supply<br>data to data bus. |
| JMP | PLA3-P31 | GATES | enables micro to read data<br>inputs of gates over data bus. |
| LCD | PLA3-P32 | LCD | enables LCD to update display reg. |
| DAC | PLA3-P33 | DAC-CS | selects DAC for update. |
| RAM | PLA3-P34 | RAM-CS | selects RAM for operation. |
| ROM | PLA3-P35 | ROM-CE | selects ROM for reading date. |
| SKISR | PLA3-P15 | MICRO-PA2 | hard interupt, asserted in response to any SK activation, micro, in turn, is programmed to read SK signals (via GATES) to determine which SK was activated. |
| SVCISR | PLA3-P14 | MICRO-PA1 | assertd when 2 SK's are activated concurrently, e.g. service menu selection. |
| RSTG | PLA3-P36 | DSP | reset global for DSP Bd. |
| RSTL | Power-on CKT | MICRO-RES<br>PLA3-P37 | reset local for controller<br>asserts RSTG (PLA3-P36). |
| CLK4 | CLOCK GEN. | MICRO-EXTAL | clock signal for micro. |
| BOTMNT | ANT.CONN. | GATE 5-AO | identifies antenna mount. |
| TOPMNT | ANT.CONN. | GATE 5-A1 | position on airplane. |
| ANTTST | MICRO-PA7 | ANT. BD. | toggled by micro and processed by circuitry on antenna Ld. for simulating lighting strike signals into X,Y,E amplifiers, resultant signals are fedback to DSP Bd for processing to evaluate operation of antenna web. |
| SK0-SK3 | LCD CONN. | DB CKT/PLA3 | softkey signals. |
| SK0DB-SK3DB | DB CKT | PLA3-P19,18<br>17,22<br>GATES5-A7,<br>A6,A5,A4 | debounced signals. |
| MICINH | ANT.CONN. | DB CKT | generates INH' |
| INH' | DB CKT | GATE5-A3 | conditioned microphone inhibit. |

As indicated by FIG. 1, the display brightness and contrast or view are controlled by the microcontroller 70 through an 8 bit, 2 channel multiplying digital-to-analog convertor (DAC) 96. The brightness and view outputs are amplified through conventional operational amplifier and power transistor circuits depicted by the blocks 154 and 156, respectively, Additionally, the brightness signal EL delivered to the display module is converted to approximately 150 VAC by an invertor circuit located on the power supply module as described in connection with the embodiment of FIG. 6. The VIEW signal may range from 0 to plus 1 VDC which is provided to the display module to alter the twist voltage applied to the LCD to adjust the viewing angle thereof. The brightness signal may range from 0 to plus 13 VDC which is boosted by the invertor circuit to achieve the drive current needed by the EL invertor (approximately 120 ma). The view and brightness halves of the DAC96 may be selected by the address line A0 which is also supplied to the display module. In the present embodiment, the DAC96 is embodied by a chip manufactured by Micro Power Systems bearing model no. NP7528.

The softkeys A, B, C and D disposed on the display face as shown in FIG. 2 generate signals when activated or depressed which signals are conducted from the display module 148 through the power supply module 142 to the controller module over corresponding signal lines SK0-SK3. These signals along with a conditioned microphone inhibit signal INH are input to a debounce circuit 158 which may be of the type manufactured by Motorola Corporation bearing model no. MC14490, for example. The softkeys A-D may consist of 4 normally open, momentary contact dome switches which when pushed, pull the associated signal line to ground. The switch closures are debounced by the circuit 158 which is clocked by a clock signal DBCLK generated by the processor 70. Approximately 61 hertz was found to be a suitable clock rate for the debounce circuit 158 in order for the output states thereof not to change until the input stays at a given level for approximately 8 msec. The debounced output signals SK0DB-SK3DB and INH' are provided to the logic array 90 and Gate 5 for reading by the processor 70. At the logic array 90, the debounced softkey signals are decoded to generate SKISR each time a key is activated and SVCISR when SK0 and SK1 are activated simultaneously. These signals are provided to the processor 70 as interrupts and once generated, the processor 70 reads the state of the softkeys through gate 5.

As described hereabove, the ambient light level is determined by a photocell disposed at the display module. The particular cell used in the present embodiment is coupled between VCC and a dividing resistor-network with, the cell itself changing in resistance based on the incident light level. The resulting resistance network provides a voltage between VCC which is the maximum light level to near 0 VDC which indicates absolute darkness. The photocell signal is coupled to an input of the A/D convertor of the controller 70 and is used to adjust the brightness level of the EL back-light to provide automatic control of the display brightness through the DAC 96 and amplifier circuit 154.

The avionics bus voltage level (VBAT) is preconditioned by the circuit described in connection with the embodiment of FIG. 6. The battery range may be between 10 and 32 VDC and is voltage divided by such circuit to yield plus 5 to 0 VDC, correspondingly. This signal VBAT is coupled to another input of the A/D convertor of the controller 70 for the reading and display thereof to the user over the display of the display module.

RSTL and RSTG are reset signals generated by the controller module. A conventional power-up reset circuit 160 is provided to monitor the VCC power line and detect a low voltage condition. In the present embodiment, RSTL is generated whenever VCC dips below approximately 4.5 VDC. RSTL is used to reset the controller 70, the programmable array 90 and the display module 148. Also, within the array 90, RSTL is ORed with a decoded address to generate RSTG which is used to power-up reset the DSP module 146 and to provide the processor 70 with a controlled reset so that the DSP process may be reset on demand. A write to address 7000H by the processor 70 forces RSTG low for approximately 1 micro second in the present embodiment.

Further, the controller 70 provides discrete signalling to the DSP processor of the DSP module 146 for initiation of various functions. Each of the signals is memory mapped to the address base of the controller 70 as shown in Table 1 here above. The signals are generated by writing to the respective address utilizing the logic array 90. For example, the DSPTST signal initiates a self test, testing the RAM, ROM and A/D circuits of the DSP module 146 and then permits gatherint of the test results reported back over the synchronous communications lines coupled to the controller 70. In addition, the SPANL signal initiates the DSP to perform a spectral-frequency analysis function and report back the resulting spectrum information over the same synchronous communications lines to the controller 70.

Accordingly, the synchronous communications link, comprising signals FSX, COMM, COMCLK and SS, is used to communicate information serially between the DSP46 of the module 146 and the controller 70 of the module 144. In the present embodiment, the link operates at approximately 250 kilohertz, transmitting a bit approximately every 40 micro seconds. The signal COMCLK is generated in the logic array 90 using ECLK (1 megahertz) divided by 4 to generate 250 kilohertz. The DSP processor 46 transmits each bit, along with the FSX signal (start of transmission). The logic array 90 inputs COMCLK and FSX signals, divides the clock by 9, and generates the SS pulse to the controller 70, which informs controller 70 of when to read the incoming data over the signals line COM.

A microphone inhibits signal MICINH is provided from the communications unit 149 through the connector P205 to the controller module 144 and is used to inhibit the processing of lightning strike data in cases where the action of the transmit key of the communications unit causes noise in the system. The MICINH line may be coupled to the keying switch of the communications microphone and is pulled to ground when the switch is closed which causes the output of the conditioning amplifier 162 to also be pulled low and debounced by the circuit 158. The debounced output INH' is read through Gate 5 by the controller 70 on a polled basis to inhibit the processing of the strike data.

The antenna fault circuits 20 provide for monitoring of the external antennas and associated wiring for open or shorted conditions. Each of the conditioning networks 20 comprises limiting resistors tied to ground and VCC and a resistor network coupled to VCC and ground and a capacitor coupled to ground. The resulting signal AFLT in each case is coupled to a respective analog input of the A/D convertor of the controller 70 for reading thereby. Under normal conditions, the outputs XANT, YANT AND EANT of the corresponding antenna are very low impedance, on the order of 20 ohms, for example, and a bias voltage applied to each antenna line through the resistance, which may be on the order of 15K, for example, is pulled to ground which causes the voltage of AFLT at the resistance divider network node to stay at approximately 2.5 VDC. On the other hand, if an antenna line opens, the voltage of AFLT at the divider junction will rise to 5 volts and be detected by the controller 70 as an open condition. Still further if one of the antenna lines is shorted to an non -zero voltage, i.e. plus 12 VDC or minus 12 VDC, then the voltage divider junction will reflect this difference in potential as well to the controller 70 when read thereby. The divider junction signals are polled periodically via A/D convertor of controller 70 and when the value read at the various input deviates from approximately 2.5 VDC, an antenna fault condition is reported by the controller 70.

The antenna signals XANT, YANT and EANT representative of a lightning strike waveforms are of the single-ended type, referenced to an antenna ground or common ANTCOM. In the present embodiment, the maximum amplitude expected at the antenna lines is plus/minus 4 volts peak. In the following discussion, only the circuitry for the XANT signal will be described, but it is understood that this circuitry is applicable to all three antenna signals.

Continuing then, the XANT signal is first AC coupled and high pass filtered by a conventional operational amplifier filter network 764 having a lower cutoff frequency of approximately 3 KH$_z$. In the same network, 164, the signal may be amplified by two, for example, and rejected for common mode using the ANTCOM signal applied to a reference input thereof. The next two stages are conventional two pole operational amplifier filter stages similar to that shown at 166 to perform amplification and low pass filtering functions with a total gain of 4 to each, and an upper cutoff frequency of 120 KH$_z$. The resulting signals, in each case, XLP, YLP and EFD are conducted to the DSP module 146 through connector P202 where the signals are processed for lightning strike detection and mapping.

A suitable circuit for embodying the DSP module 146 is shown in FIG. 8. Referring to FIG. 8, the DSP module 146 performs the processing operations for lightning detection and mapping including the following functions: (1) performs high speed analog-to-digital conversion of the low pass filtered analog lightning strike signals XLP, YLP and EFD conducted from the controller module 144, (2) stores the sampled-data signals representative of the XLP, YLP and EFD waveforms in a high speed waveform buffer memory, (3) monitors the digitized samples of the XLP and YLP magnetic field representative signals for threshold triggering, (4) discriminates between valid and invalid strike signals to provide "intelligent triggering", (5) classifies the detected lightning strike into a type selected from a predetermined plurality of types for each valid lightning strike signal and calculates the location thereof by estimating range and bearing, in reference to an observation location, based on the type classification (6) transmits the type and location information for each valid lightning strike signal to the controller module for map display thereof on the display module 148, and (7) performs frequency spectral analysis of the XLP, YLP and EFD signals utilizing a 256 point, radix 2 FFT, for example, and transmits the frequency spectrum information to the controller module for display thereof.

At the heart of the DSP module is a digital signal processor which may be of the type manufactured by Texas Instruments under the model no TMS320C25 which is a 16 bit, fixed point, 40 megahertz DSP. For more information of the Texas Instrument DSP, reference is made to the publication *TMS320 Second-Generation Digital Signal Processors* published by Texas Instrument May, 1989 and incorporated by reference herein to provide the architectural and operational details of the DSP.

Like reference numerals will be used for devices of the circuit embodiment which are similar to the devices described in connection with the embodiment of FIG. 1. All of the devices of DSP module shown in FIG. 8 are memory mapped within the double 64K word address base of the DSP 46. The Texas Instrument 320C25 has a 16 bit address bus, but outputs a program strobe PS, data strobe DS and I/O strobe IS so that the memory addresses appear to be overlaid. A suitable memory map for the purposes of the present embodiment is shown in Table 4 below:

lines A15 and A12 of the DSP and for generating read RD, write WR, and chip select signals IO, RAM, ROM to read and write to external memories 62 and 64. The external program memory 62 and data memory 64 of the DSP 46 are comprised of memory chips of high speed access on the order of 20 to 35 nsec. For the present embodiment the program memory utilizes two Cypress 7C261-35 ROMs (8K × 16 total), and is enabled by the ROM signal. External data memory 64 is embodied utilizing two Cypress CY6116-35 RAMs (2K × 16 total), and is enabled by RAM for chip accesses, and by RD for reads and WR for writes. To synchronize to the free running data acquisition ACQ. portion, the DSP 46 may read the ACQ address currently being generated by the acquisition controller address generator which in the present embodiment is a synchronous counter 172. This is enabled through Gate 3 by the select signal IO generated by the logic array 170 which places the ACQ. address on the DSP data bus 60 for reading thereof.

Mode control signals DSPTST, SPANL, and STKTST are conducted from the controller module to the DSP module using discrete lines for signal inputs to the DSP 46. For example, the DSPTST signal initiates the DSP 46 to perform a self test, testing the RAM 64, ROM 62 and data acquisition circuitry and then to report the results back to the microcontroller 70 via the synchronous communications link. In connection with the DSPTST, the acquisition controller is initiated to address the multiplexer 24 utilizing address lines 36 to select the reference voltage 28 generated by the generator 26 for sampling and digitizing by the A/D convertor 32 until all of the storage registers of the waveform memory 42 are filled with the resulting digitized data. In addition, the SPANL signal initiates the DSP 46 to perform a spectrum analysis of the signals XLP, YLP and EFD and report the frequency spectrum information results back to the microcontroller 70. In this mode, the DSP 46 looks for a trigger signal, than samples all three channels continuously, performs an FFT on each channel and formats the results into a spectral plot of the noise levels present as will become more apparent

TABLE 4

| Address | Size | Device Enabled | Comments |
|---|---|---|---|
| 8000h - DFFFh | 24k × 8 | Waveform RAM | Shared by DSP & Acquisition Sys. |
| 0000h - 1FFFh | 8k × 16 | EPROM for DSP | External DSP ROM |
| 1000h - 17FFh | 2K × 16 | RAM for DSP | External DSP RAM. |
| 0000h | 1 × 16 | Acquis.Addr.Cntr | DSP I/O Addr 0, Acq Address. |
| 0001h - 0015h | 15 × 16 | None | DSP I/0 Address 1-15, Not Used. |
| 0000h - 0005 | 6 × 16 | DSP Registers | DSP Internal Registers. |
| 0020h - OFAFh | 3984 × 16 | DSP ROM | DSP Internal ROM, Not Used. |
| 0060h - 007Fh | 32 × 16 | DSP RAM | DSP Internal RAM. |
| 0300h - 03FFH | 256 × 16 | DSP RAM | DSP Internal RAM. |
| FF00h - FFFFh | 256 × 16 | DSP RAM | DSP Internal Data/Prog RAM. |

The DSP processing of the present module is carried out in conjunction with the logic of a programmable logic array PLA1 170 which may be of the type manufactured by Altera Corp. bearing Model No. 610EP. The array 170 is responsible for decoding the address from the further descriptions found hereinbelow. Further, the STKTST signal ANTTST instructs the DSP 46 that a test strike signal has been generated to the antenna module and to expect resulting test strike waveforms rather than conventional lightning strike waveforms over the corresponding antenna signal lines. All other processing is in regard to the lightning strike processing.

The synchronous communications link comprising signals FSX, COM, and COMCLK is used to transfer DSP data from the DSP module to the controller module. The operation of the communications link has been described hereabove in connection with the embodiment of FIG. 7.

An analog portion of the DSP module comprises the precision reference generator 26 and level shift/compression circuits 174, 176 and 178 corresponding to each of the input signals XLP, YLP and EFD, respectively. The reference generator 26 provides a stable, precision voltage for the analog multiplexer 24 over line 28, the level shift networks 174, 176, 178 over line 180 and the A/D convertor 32 over line 30. Each of the shift/compression circuits 174, 176 and 178 converts the corresponding analog strike waveform from approximately plus/minus 12 volts peak full scale to 0 to 5 volts peak for digitization by the A/D convertor 32. The precision plus 5 volts generated over line 30 to the convertor 32 may be divided to provide a 2.06 volt reference for the three shift circuits 174, 176 and 178 over line 80, and the gain of each stage 174, 176 and 178 may be set at 1.2. The reference voltage provided to the input of the multiplexer 24 as a test signal is used for self-testing the data acquisition circuits.

In the present embodiment, the data acquisition controller 34, as described in connection with embodiment of FIG. 1, is embodied by a programmable logic array 182 which may be of the type manufactured by Altera Corporation bearing model no. EP610, for example. A synchronous counter 172 is governed by logic signals from array 182 to generate the ACQ address or a portion thereof. The A/D convertor 32 may be of the flash convertor type manufactured by Micro Power Systems bearing model no. MP7684, for example, and operates, in the present embodiment, at a sampling and digitizing rate of on the order of 1 megahertz. The waveform memory 52 may be a static random access memory having a capacity of 32K bytes.

Suitable logic equations for the programming of the two PLA's 170 and 182 are shown below in Tables 5 and 6, respectively:

TABLE 5

```
INPUTS:
SYSCLK,PS,DS,IS,RW,STRB,A12,RSTG,A15,ACQRDY
OUTPUTS:
RDY,WR,RD,IO,RAM,ROM,CLK125,CLK25,CLK5
NETWORK:
sysclk = INP (SYSCLK)
ps = INP (PS)
ds = INP (DS)
is = INP (IS)
rw = INP (RW)
strb = INP (STRB)
a15 = INP (A15)
a12 = INP (A12)
rstg = INP (RSTG)
acqrdy = INP (ACQRDY)
rstgn = NOT (rstg)
RDY = CONF (rdy,VCC)
WR = CONF (wr,VCC)
RD = CONF (rd,VCC)
IO = CONF (io,VCC)
RAM = CONF (ram,VCC)
ROM = conf (rom,VCC)
CLK125,CLK125f = RORF(clk125,sysclk,rstgn,GND,VCC)
CLK25,CLK25f = RORF(clk25,sysclk,rstgn,GND,VCC)
CLK25,clk25f = RORF(clk5,sysclk,rstgn,GND,VCC)
EQUATIONS:
```

TABLE 5-continued

```
clk5 = clk5f';
clk25 = clk5f * clk25f' + clk5f' * clk25f;
clk125 = clk125f' (clk25f*clk5f)' + clk125f' * clk25f * clk5f;
rdy = acqrdy;
wr = (rw' * strb')';
rd = (rw * strb')';
ram = (ds'*a15'*a12)';
rom = (ps'*a15'*rw)';
io = is;
END$
```

TABLE 6

```
INPUTS:
SYSCLK@1,DSPTST@2,DS@3,CLK@59,
CLK25@10CLK125@11,DSPA15@14,RSTG@23
OUTPUTS:
A13UB@4,A14UB@5,ACQRDY@15,A13@16,A14@17,
DSPRD@18,ACQWR@19,MSEL@20,
ACQCNT@21,ACQAEN@22
NETWORK:
sysclk = INP (SYSCLK)
dsptst = INP (DSPTST)
ds = INP (DS)
clk5 = INP (CLK5)
clk25 = INP(CLK25)
clk125 = INP(CLK125)
dspa15 = INP (DSPA15)
rstgn = INP (RSTG)
rstg = NOT (rstgn)
A13UB = CONF (a13ub,VCC)
A14UB = CONF (a14ub,VCC)
A13,a13qf = RORF(a13d,sysclk,rstg,GND,acqaenfn)
A14,a14qf = RORF(a14d,sysclk,rstg,GND,acqaenfn)
ACQAEN,acqaenf = COIF(acqaen,VCC)
acqaenfn = NOT (acqaenf)
ACQWR = CONF(acqwr,VCC)
MSEL = CONF(msel,VCC)
DSPRD = CONF(dsprd,VCC)
ACQRDY,acqrdyf = COIF(acqrdy,VCC)
ACQCNT = CONF(acqcnt,VCC)
EQUATIONS:
a13d = clk5'*a13qf*a14qf' + clk25'*a13qf*a14qf' +
        clk125*a13qf*a14qf' +
        cl5*clk25*clk125'*a13qf'*a14qf';
a14d = clk5'*a13qf*a14qf + clk25'*a13qf*a14qf +
        clk125*a13qf*a14qf +
        clk5*clk25*clk125'*a13qf*a14qf';
a13ub = a13qf + dsptst';
a14ub = a14qf + dsptst';
acqwr = (clk5'*clk25'*clk125)';
acqrdy = (ds'*dspa15*clk5'*clk25'*clk125)';
cqaen = ds'*dspa15*(clk5'*clk25'*clk125)';
msel = (ds'*dspa15*(clk5'*clk25'*clk125)' + clk5'*clk25'*clk125)';
acqcnt = clk5*clk25*clk125'*a13qf*a14qf;
dsprd = (ds'*dspa15*(clk5'*clk25'*clk125)')';
END$
```

Within the PLA2, the CLK5, CLK25 and CLK125 clock signals derived from the system clock CLK10 (8 MHZ) are used to generate a divide by 3 counter which drives the address lines A14 and A13 to cycle through the count 00, 01 and 10 once every 3 micro seconds, i.e. 1 usec. per count. These signals A13UB and A14UB become the address signals 36 of the multiplexer 24 for selecting the lightning strike signals XLP, YLP and EFD for the contemporaneous sampling and digitization thereof by the A/D converter 32. At the last phase of each count, e.g., for each A13, A14 combination, ACQWR is asserted low as is MSEL which condition enables the output of the A/D to write to the data bus 40 and enables the waveform memory 42 to write the data in the storage register addressed by the ACQ address lines. Each time A14:A13 finish one complete cycle, the signal ACQEN is strobed low to enable the synchronous counter 172 to count and increment the ACQ address outputs thereof to a new set of storage registers of the waveform memory 42 for the next sample. Note that, in the present embodiment, there are two sets of A13:A14 signals, one is designated by the suffix "UB" and these are unbuffered and the others are tri-stated along with the outputs of the synchronous counter 172 and caused to float whenever the DSP performs a read of the waveform memory 42 via gates 50 and 52. The unbuffered address lines are the ones which drive the multiplexer 24 to select the desired analog lightning strike signal.

When the DSP 46 desires to read data from the waveform RAM 42 for the processing thereof, it asserts DS and A15. If the ACQ controller is in the middle of a data write to waveform memory 42, the ACQRDY signal is pulled to a low logical state to cause DSP 46 to wait until the write cycle of the ACQ controller is complete. If the ACQ controller is ready, the ACQEN signal is de-asserted which causes the ACQ address lines to float, that is, in a tri-state condition, and MSEL and DSPRD are asserted to a low logical state. This condition enables the DSP gates 50 and 52 enabled which allows the DSP 46 to address the waveform memory 42 and read the data bus thereof through the respective gates 50 and 52.

Finally, the DSP 46 is capable of generating a test signal to test the acquisition circuitry of multiplexer 24, A/D convertor 32, and waveform memory 42. When the DSPTST signal is asserted by the controller module, the unbuffered address lines 36 are both taken to a high logical state which causes the multiplexer 24 to select the reference voltage input at X3 and couple it to the A/D convertor 32 for sampling and digitizing. The digital code representation of the reference voltage is written to all of the storage registers of the waveform memory 42 for reading by the DSP to establish proper data acquisition processing. More details of the signals of the DSP module, their interconnections and associated functions performed thereby are shown in Table 7 found directly here below.

TABLE 7

| | | DSP Board | |
|---|---|---|---|
| Signal | From | To | Function performed |
| PS | DSP | PLA1-P2 | Asserts DSPC4 RoM select (PLA1-P19) |
| DS | DSP | PLA1-P3 | If A15=0, asserts DSPC3 RAM select (PLA1-P18). If A15=1, asserts ACQC2 to select Gates 1 and 2 to permit DSP to read waveform mem. |
| IS | DSP | PLA1-P4 | Asserts DSPC2 (PLA1-P17) to select Gate 3 to permit DSP to read Addr. of ACQ. control ACQ Ao-A14. |
| R/W | DSP | PLA1-P5 | Asserts DSPCO (PLA1-P15) or DSPC1 (PLa1-P16) to write or read RAM. |
| STRB | DSP | PLA1-P6 | strobes outputs of PLA1. |
| A12 | DSP | PLA1-P7 | Used in PLA1 EQ's. |
| RSTG | PLA3 (cont. BD) | PLA1-P11, DSP PLA2,-P23 Counter | Resets all registers and program exec. of DSP. |
| CLK10 | DSP | PLA1-P1, P13; PLA2-81, P13, PC Synch. Counter | Master clock (8MHZ), used to generate ACQ6 (PLA1-20), IMHZ, ACQCL1 (PLA1-21) 2MHZ and ACQCL2 (PLA1-22) 4MHZ. |
| A15 | DSP | PLA2-P14 PLA1-P14 | Used on PLA1 & PLA2 EQ's (see above) |
| DSPCO | PLA1-P15 | RAM - WE | See above. |
| DSPC1 | PLA1-P16 | RAM - OE | See above. |
| DSPC2 | PLA1-P17 | Gate 3 | See above. |
| DSPC3 | PLA1-P18 | RAM - CS | see above. |
| DSPC4 | PLA1-P19 | ROM - CS | See above. |
| ACQCL0 | PLA1-20 | DSP, PLA2-P11, A/D-CLK | Controls timing 1MHZ. |
| ACQCL1 | PLA1-21 | DSP, PLA2-P10 | Controls timing 2MHZ. |
| ACQCL2 | PLA1-22 | DSP, PLA2-P9 | Controls timing 4MHZ. |
| DSPTST | PLA3-P28 | DSP, PLA2-P2 | Brings A13UB, A14UB to both 1's to select in mux VREF causing A/D to fill waveform mem. with Dig. EQ. of VREF. |
| AC3UB, A14UB | PLA2-P4, P5 | Mux. Addr. | controls seq. of signals selectec by mux. for A/D conv. @ IMHZ (cycles thru 00,01,10 normally) |
| ACQRDY | PLA2-P15 | DSP | * Wait state control, governs DSP to maintain delay reading waveform mem. until A/D completes writing thereto so data is not corrupted. |
| A13, A14 | PLA2-P16, P17 | Counter Output | Becomes part of Acq. Addr. AO-A12 generated by sync-counter. |

TABLE 7-continued

| | | DSP Board | |
|---|---|---|---|
| Signal | From | To | Function performed |
| ACQC2 and 2 | PLA2-P18 | Gates 1 | * Allows DSP to read waveform memory via Gates 1 and 2. |
| ACQC1 | PLA2-P19 | WMEM-OE A/D Conv. -CE | A10 conv. output enable & causes Acq. write to waveform memory. |
| ACQC0 | PLA2-20 | WMEM-WE WMEM-CS | Waveform memory chip select. |
| CCLK | PLA2-P21 | Synch. Counter | Clock for counter. |
| ACQEN** | PLA2-P22 | Synch.- Counter | Enables counter to count at rate of CCLK. |

(* A15 acts as chip select and functions in concert with DS to alert PLA2 that DSP wants to read waveform memory; PLA2 responds by asserting ACQC2, unless ACQ is in process of A/D conversion, in which case ACQRD4 is asserted to cause DSP to wait until A/D conversion completes.)
(** Mutually exclusive with ACQC2, Sync-Counter has tri-status outputs which are effected to their floating status when Gate 1 is enabled to connect addr. bus of DSP to addr. output lines of counter and waveform during DSP read operation)

Suitable circuits for embodying the display module are shown in the circuit diagrams of FIGS. 9A-9H which are, in combination exemplary of a display module manufactured by Hamlin Division of Standish Industries bearing part no. 010011. In the present embodiment (referring to FIGS. 9A through 9H), the display portion of the display module is a 64 by 64 segmented LCD shown at blocks 190 and 192 which are driven by large scale integration (LSI) controllers 194 and 196 which generate the necessary voltages to turn the LCD pixels on and off. The LCD controller has two addresses, one for a control word (AO equals 0) and one for a data word (AO equals one). The circuits 196 and 198 are both operated by a plurality of voltage levels V1, V2, V3, V4 and VEELCD generated from a resistance ladder network shown at 198 with each voltage level buffered by a corresponding operational amplifier forming the set of operational amplifiers shown at 200. The outputs of the operational amplifiers are coupled to the corresponding voltage level inputs of the LSI circuits 194 and 196. The voltage levels V1, V2, V3 and V4 are referenced to the level VEELCD generated by an operational amplifier circuit 202 governed by the VIEW signal. Accordingly, altering the level of the VIEW signal causes the voltage levels to change in proportion thereto which governs the contrast viewing of the LCD. In addition, the EL back-light for the LCD module is shown at 204 controlled by the brightness signal EL. The softkey push buttons A, B, C and D and the photocell have been described hereabove in connection with other embodiments.

In operation, to write to a specific location of the LCD, for example, the location is first written to the control register (AO equals 0), followed by the data to be displayed written through the data register (A0 equals 1). The display is clocked by the ECLK signal and data is read or written by the strobing of the RW signal.

It is understood that the micro controller 70 and DSP 46 as described here above are programmed with operational and application programs which may be stored in their respective ROM's 76 and 62, respectively, to perform a variety of tasks initiated upon the application of power thereto. A set of software flow charts exemplifying suitable programming of the micro controller 70 and DSP 46 are provided starting with FIG. 10.

As described in connection with the embodiment of FIG. 1, the micro controller 70 and DSP 46 are interconnected together by both control signals 72 and communication signals 74 to provide inter-processor communication to coordinate the activities thereof. Serial data information is transmitted from the DSP 46 to the microcontroller 70 utilizing the serial peripheral interfaces (SPI) of the two processing units. In the present embodiment, data transfer is accomplished by a one way synchronous serial data link there between. The SPI of the DSP 46 is set up to output serially 8-bit words overcome along with a pulse on the FSX line. The SPI of the microcontroller 70 is set up for operation in a slave mode with the control registers CPHA equal 0 and CPOL=1. The bit clock (COMCLK) is derived from the microcontroller's E clock (1 megahertz) and is divided by 4 to produce a 250 kilohertz bit rate. With a bit transfer of only 32 micro seconds, the DSP 46 pauses between each bit transmitted to prevent over runs at the slower operating microcontroller 70. A minimum delay between transmissions is about 300 micro seconds. All bits transmitted in the present embodiment are in the ASCII format with no spaces or other characters in or between the data bits. Each message will have the following ASCII format:

SOH TC N0 N1 N2 ... NN ETX, where SOH is the ASCII start of header message code=01h. TC is the one bit transaction code, ASCII A-Z(41h-5Ah). N0, N1 ..., NN represents 02NN bits of ASCII data depending on the transaction code. ETX is the ASCII end of text (message) code=03h.

With regard to the transaction codes
'S' this transaction code indicates strike data. The message format is as follows:

SOH S MRRRBBB ETX where SOH=01h
S=transaction code='S'=53h
M=model type ('1','2', '3', '4', '5',),
RRR=range to strike ('000'-'099'),
BBB=bearing to strike relative to nose or heading of aircraft assuming bottom mount antenna ('000'-'359'), and
ETX=03h
'T' this transaction code indicates DSP test results. The message format is as follows:

SOH T T1 T2 T3 ETX where SOH=01h

T=transaction code='T'=54h
T1=on chip RAM test result='0' if pass or '1' if fail.
T2=ROM test results='0' if pass or '1' if fail.
T3=A/D convertor and acquisition RAM test results='0' if pass or '1' if fail.
ETX=03h
'N' this transaction code indicates noise or frequency (spectrum analyzer) data. The message format is as follow:

SOH T X1 X2...X14 Y1 Y2...Y14 E1 E2...E14 ETX where SOH=01h
T=transaction code=sign 'N'=53h
X1 through X14 is X-magnetic noise bands 1 through 14='0'-'C'
Y1 through Y14 are Y-magnetic frequency bands 1 through 14='0'-'C'
E1 through E14 are E frequency bands 1 through 14='0'-'C'
ETX=03h In the present embodiment, the operating system of the microcontroller 70 provides priority, base scheduling of at least 6 tasks which are, in order of decreasing priority the clock driver, the display control, periodic, serial communications, strike processing and self test. A real time interrupt (RTI) drives the operating system by interrupting every 8.19 msec. (1 tick). An RTI handler is set up to signal the clock drive task every other interrupt or one tock. The signal is performed by exiting the interrupt handler through a common return function and indicating the number of the task to be signaled. Note that system calls may not be made from the user interrupt routine. Therefore, any interrupt routine which signals the task does so by exiting through the common return function which may then optionally signal a task. The RTI handler also toggles the state of the PA3 output line at each interrupt, which line is then used as the clock DBCLK of the debounce circuit as described here above. Tasks are synchronized by use of task semaphores, named semaphores and time delays Named semaphores are used to protect data buffers accessed by more than one task therefore, no more than two tasks should be permitted to access a data area via signal and pend operations to a task semaphore or name semaphore.

The clock driver task is set to be the highest priority task and waits until it is signaled from the RTI handler. The task checks for expired timers. If an expired timer is found, a signal call is performed and the scheduler executes the task waiting on the timer if its priority is higher than the currently executing task.

The display control task has the next highest priority and maintains a current and non-interrupted display. The LCD is accessed by writing to two registers in the LCD controller as described in FIGS. 9A-9H above. The LCD controller contains RAM which is used to produce an image of the LCD. A copy of the LCD controller RAM may be maintained in the RAM 78 which is written to with new screen information and then copied to the LCD controller RAM by the display task. All writes to the LCD controller are performed by the display control task. All tasks which effect display data signal the display task so that LCD updates may take place. All functions which pend on softkey activations should also be called from the display control task which is important because only one task can be signaled when a softkey interrupt occurs.

The periodic task sets up a cyclical timer so that it executes once each second. This task controls the backlight brightness, weather display updates, antenna fault and inhibit tests as well as monitoring the avionics bus voltage and stopwatch timer updates for bump off. The periodic task also resets a watchdog timer in the microcontroller 70 which is set up to time out if not reset every 2.1 seconds in the present embodiment.

The serial communications task is initiated from the serial peripheral interface (SPI) interrupt handler. The SPI handler signals the task after a complete message has been received from the DSP 46. This task receives the start address of the received message in the communications buffer. If the message contains DSP test results, the data is copied into a special test buffer for later use by the system test function. If the message contains spectrum analyzer data, the display control task is signaled to process the data. If the message contains lightning strike data, a system call is made to enqueue the message start address and current system time for use later by the strike processing routine.

The strike processing task is initiated by strike data enqueued by the serial communications task. It then dequeues the message start address and time information then processes the strike data to determine a range and bearing. The X and Y coordinates of the strike are then stored in appropriate strike buffers. The sign of the X coordinate is reversed if the antenna jumpers are setup for a top mounted antenna. The strike buffers consist of forward 180° view buffers for 100, 50 and 25 NM ranges and rear 180° view buffers for 100, 50 and 25 NM ranges in the present embodiment. When data is added to the buffers, a strike data display update flag is set. When the system is in the weather mode and the flag is set, the period task signals the display control task to update the weather display. By limiting strike display updates to one per second, the strike processing throughput of the system is greatly increased.

The self test task sets up a delay of about 10 seconds each time it executes. If a test fails, this task is signaled to display a fault message which, if non-fatal, is acknowledged by pressing a softkey. For most faults the fault message will be removed automatically if the condition which caused the fault is no longer present and the corresponding continuous test passes.

Now, starting with the flow chart of FIG. 10, when power is turned on at 210 or a self test is initiated at 212, a self test procedure is started at 214 and a self test indication is displayed on the display 84 similar to that shown in the illustration of FIG. 11. Next, the microcontroller 70 starts executing programs to test its RAM and ROM memories both internal and external in the box 216. An on chip non-volatile memory may be tested by writing predetermined test values to a predetermined location and reading the values back therefrom. If the read value is different from that which was written, a fault condition is considered to be present. Any time data is written to the memory, the value is verified after the write. If the data read back is not the same as written, or a location does not erase properly, a fault is also considered present. If a fault is present in the non-volatile memory, default LCD view adjust and backlight values are written to the RAM 78. The backlight and view adjust values may still be changed, but the new values are saved only in the RAM 78. Once a fault is detected, the non-volatile memory test is skipped during user initiated system tests, i.e. the fault is not recoverable. Also during the testing of block 216, the ROM 76 is tested by summing the contents of all the registers therein except the checksum register. This summation value should be the same as the value stored in the checksum location for the test to pass. If the two values differ, the system is locked up and continued operation is not possible. Further, the RAM 78 is tested as part of the routine of 216 by writing to each RAM location 2 test values. A fault is considered to be present if a test value written differs from a value read back for the same location. Once again, if a fault is detected in the RAM 78, the system is locked up and continued operation is not possible.

The next operation which is performed by block 218 is an antenna fault check in which the AFLT signals for the X, Y and E antenna lines are read through the A/D convertor 108 of the microcontroller 70 once per second and if any of the measurements are out of range during ten consecutive checks, for example, an antenna fault is considered present. An open line in an antenna will cause an antenna fault. Recovery from this fault is possible if all readings are normal during a subsequent test.

Next, in block 220, the microcontroller 70 may command (DSPTST) the DSP 46 to test the data acquisition circuits thereof and associated memories. The DSP tests are performed by the DSP 46, as will become more evident from the description hereinbelow, and the test results are sent back to the micro controller 70 over the communication line 74. Next, in block 222, the DSP may be commanded (STKTST) to perform a strike processing test and transmit the results back to the microcontroller 70 over the communication lines 74. More details of this strike testing will be provided in the description found hereinbelow. In block 224, the micro controller 70 performs an antenna jumpers test and a display test. The antenna jumpers test is performed by reading the antenna jumper signals of connector P205. For the test to pass, both jumpers must be present or both must be unconnected. If the test fails, a fault message is displayed by block 226 on the display 84 and once detected, the fault is considered to always be present, i.e. not recoverable. In the display test, all of the pixels and segments of the display 84 are turned on for 4 seconds and the user may inspect the LCD for inactive sections. An LCD busy bit is to be cleared before reading or writing data to the display. IF the busy bit does not clear after repeated reads, a fault is considered present and the backlight of the display is flashed on and off at a 1 or 2 hertz rate and the system is locked up.

Figure 12:
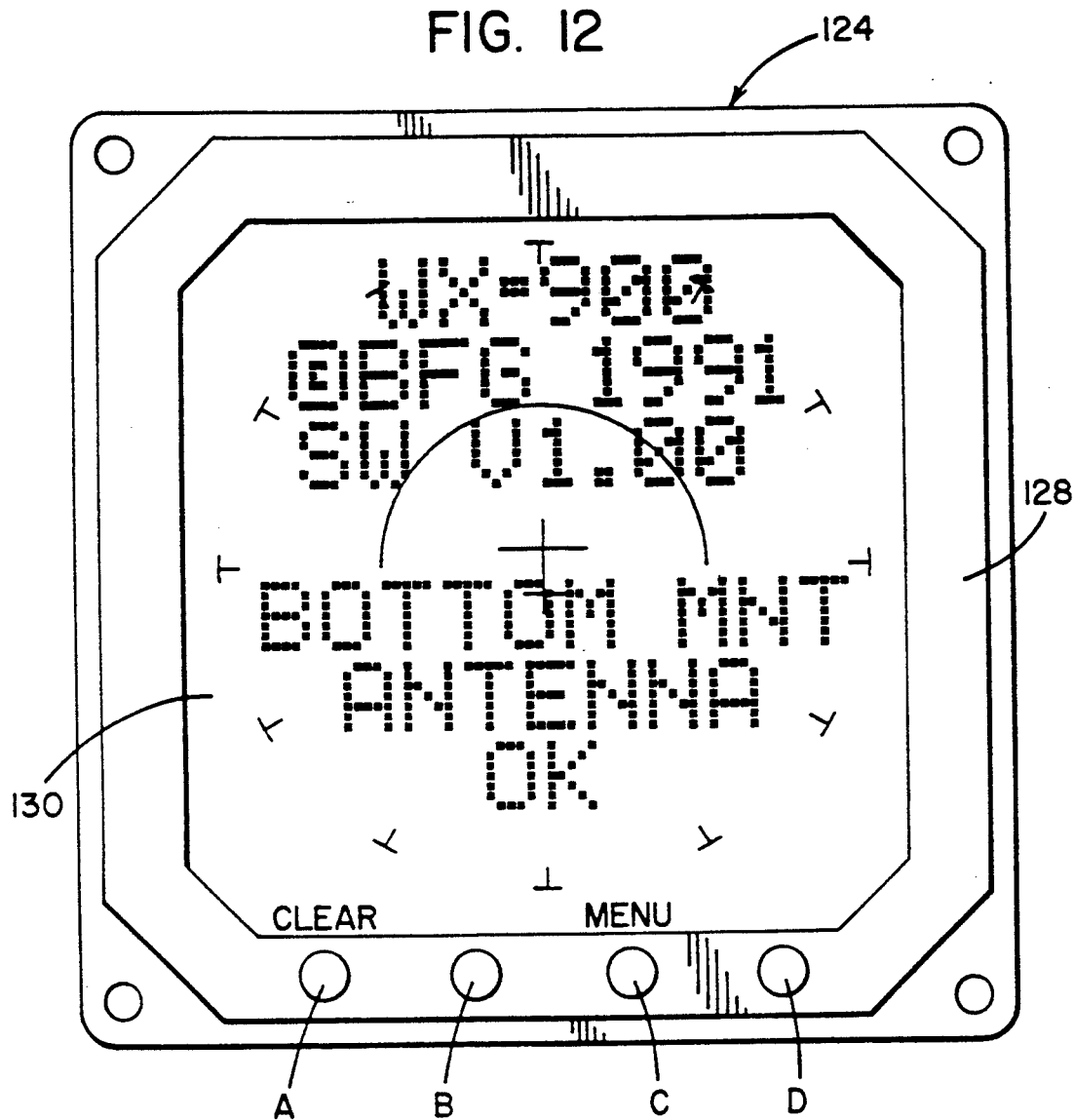
Figure 13:
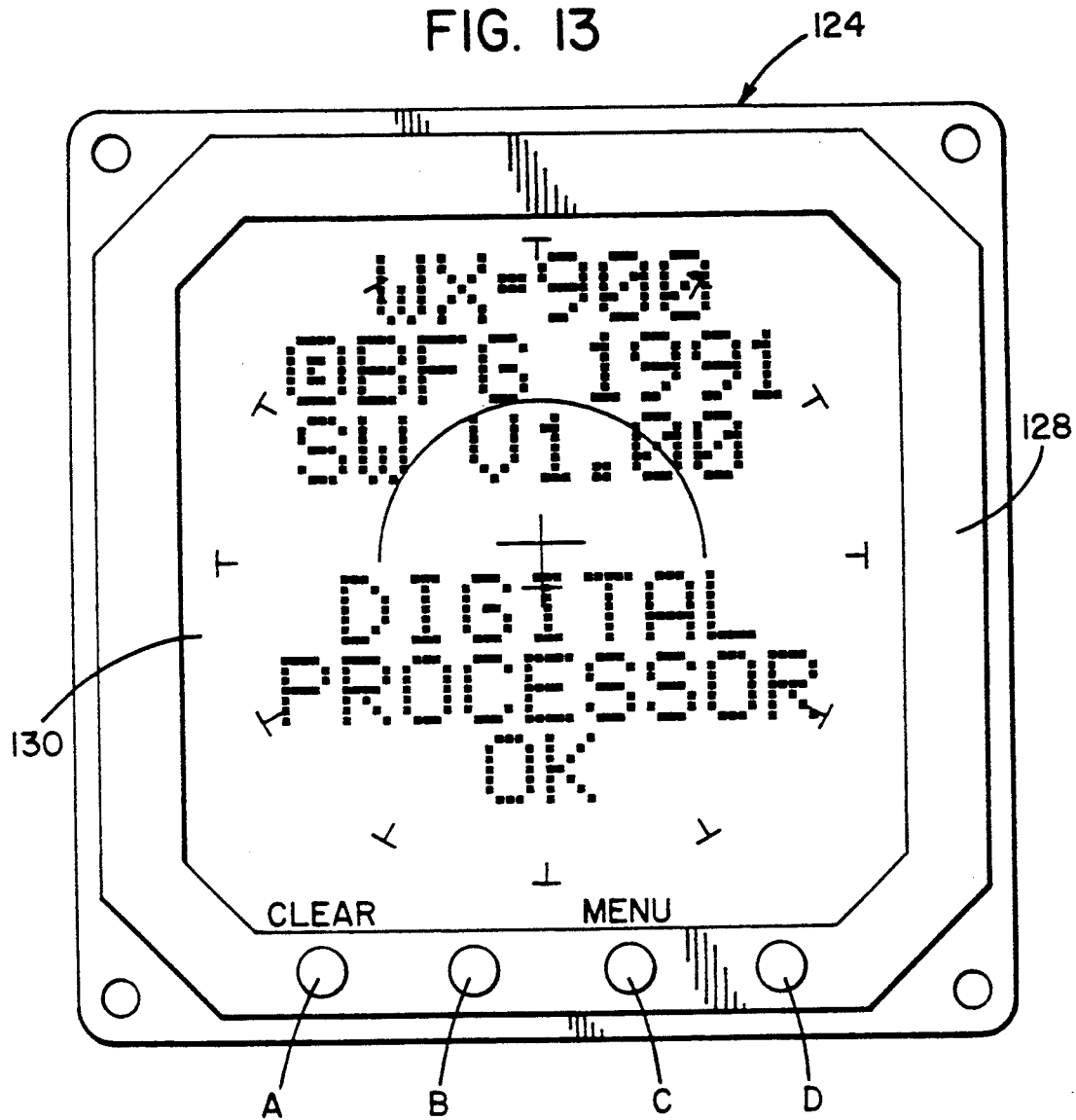
Figure 14:
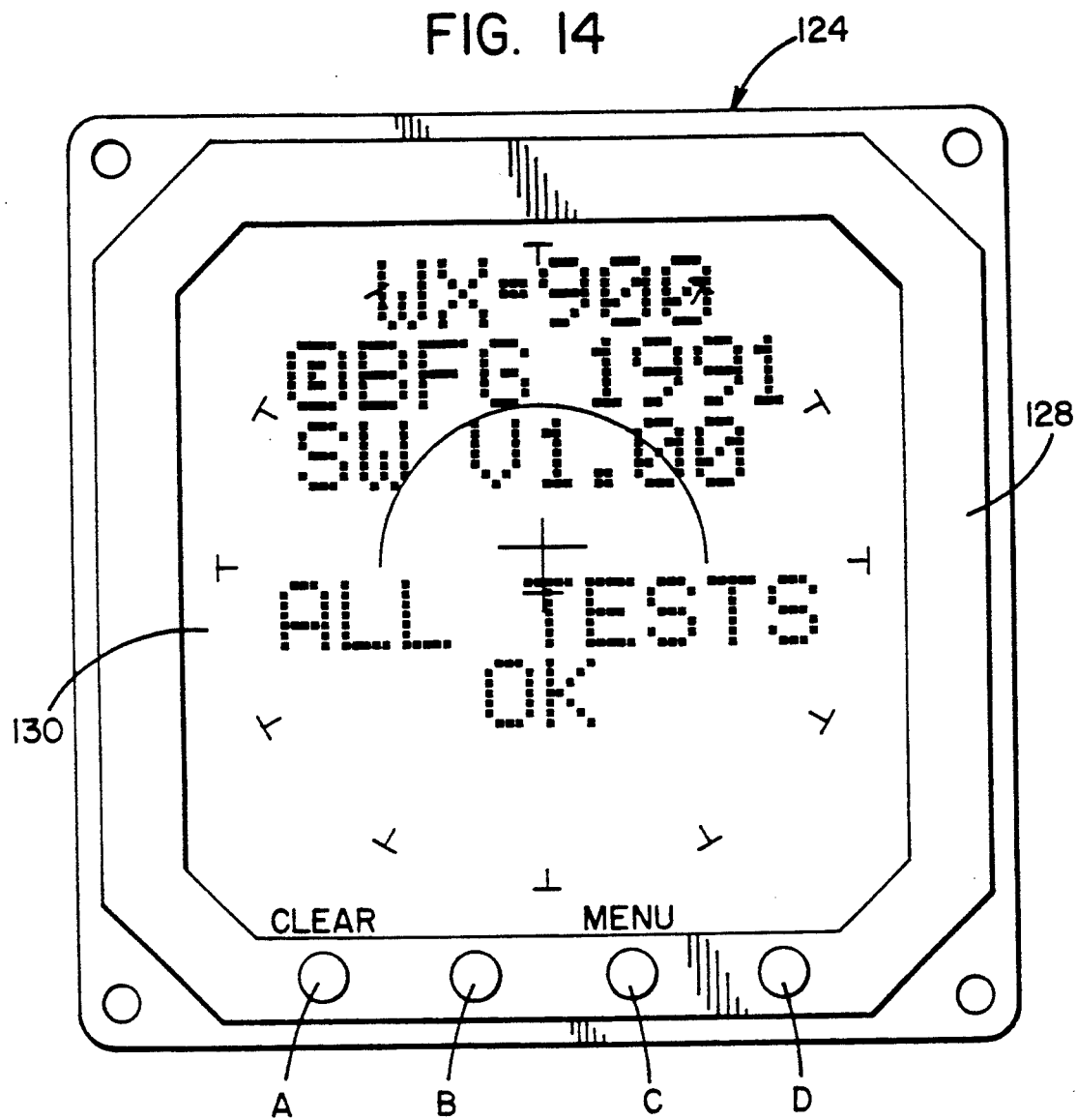

As described by the foregoing, test status messages are displayed by block 226 on the display 84. Examples of such status messages are shown by the illustration of FIGS. 12 and 13. If no fault is detected by the decisional block 228, an "all test ok" is displayed on the display 84 by the block 230. FIG. 14 illustrates a suitable display for this purpose. On the other hand, if a fault is detected by block 228, an error message will be displayed by block 232 on the display 84 as exemplified by the illustration of FIG. 15. Other type error messages which may be displayed as an indication of error status are shown in the table here below.

TABLE 8

| Test | Message | |
|---|---|---|
| Antenna Fault Line | ERROR 0 | ANTENNA |
| Antenna Jumpers | ERROR 1 | ANTENNA |
| EEPROM (M68HC11A1) | ERROR 2 | PROCESSOR |
| EPROM U210 | ERROR 3 | PROCESSOR |
| Inhibit Asserted More Than 1 Minute | ERROR 4 | MIC KEY STUCK |
| No Test Strikes | ERROR 5 | WX PROCESSING |
| Invalid Test Strikes | ERROR 6 | WX PROCESSING |
| RAM U212 | ERROR 7 | PROCESSOR |
| DSP on-chip RAM or U107 and/or U108 | ERROR 8 | PROCESSOR |
| DSP/M68HC11A1 Serial Communications | ERROR 9 | PROCESSOR |
| DSP EPROM U105 and/or U106 | ERROR 10 | PROCESSOR |
| DSP A/D Converter and/or RAM U111 | ERROR 11 | PROCESSOR |
| Self-test Inhibited | ERROR 12 | PROCESSOR |

The system photocell and antenna fault line are read via the M68HC11 analog to digital converter. If the ADC fails, the result could be displayed as ERROR 0 or the backlight brightness level may not vary automatically.

Softkey 1 is labelled with a flashing ACK while the fault message is displayed. Pressing softkey 1 removes the message from the screen. If error 3 or 7 occurs, the ACK label will not appear and continued operation is not possible—the message is displayed continuously.

Figure 15:
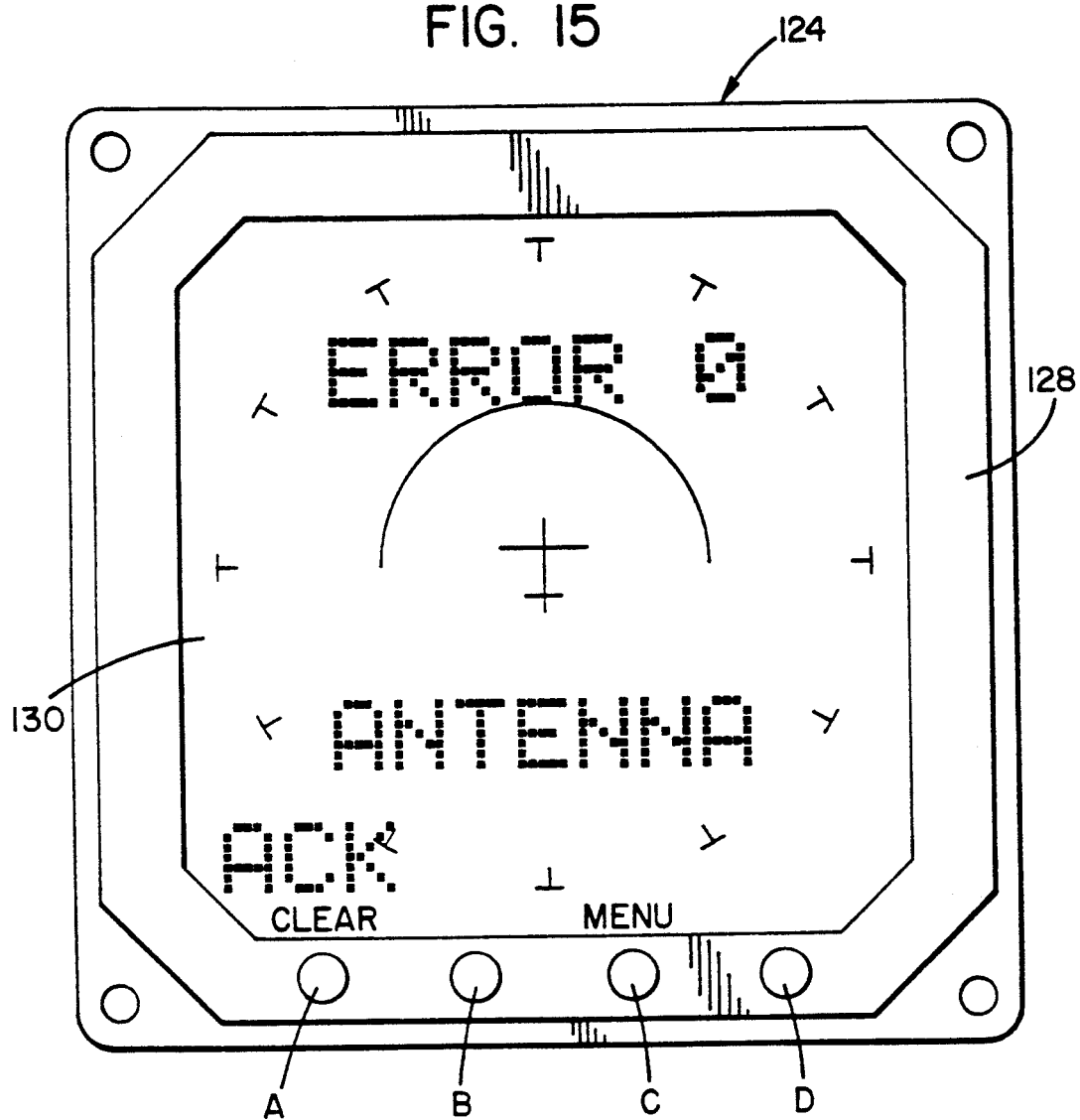

The system then determines if the detected error is a fatal error in the decisional block 234. Each non-fatal error message must be acknowledged by pressing the softkey A which is labeled with a flashing ACK label as shown in FIG. 15. If the pushbutton A is activated and the error is acknowledged via blocks 236 and 238, the system next checks if all of the errors have been acknowledged in the decisional block 240. If not, the routine is diverted back to the block 232 to display the next error message and the program flow continues through blocks 234, 236 and 238 once again. If all the errors are acknowledged then the program routine enters the weather mode in block 242. Returning to the decisional block 234, fatal errors or non-recoverable errors will cause the system to lock up and display an error message continuously, if possible, utilizing the instructions of block 244.

Figure 16:
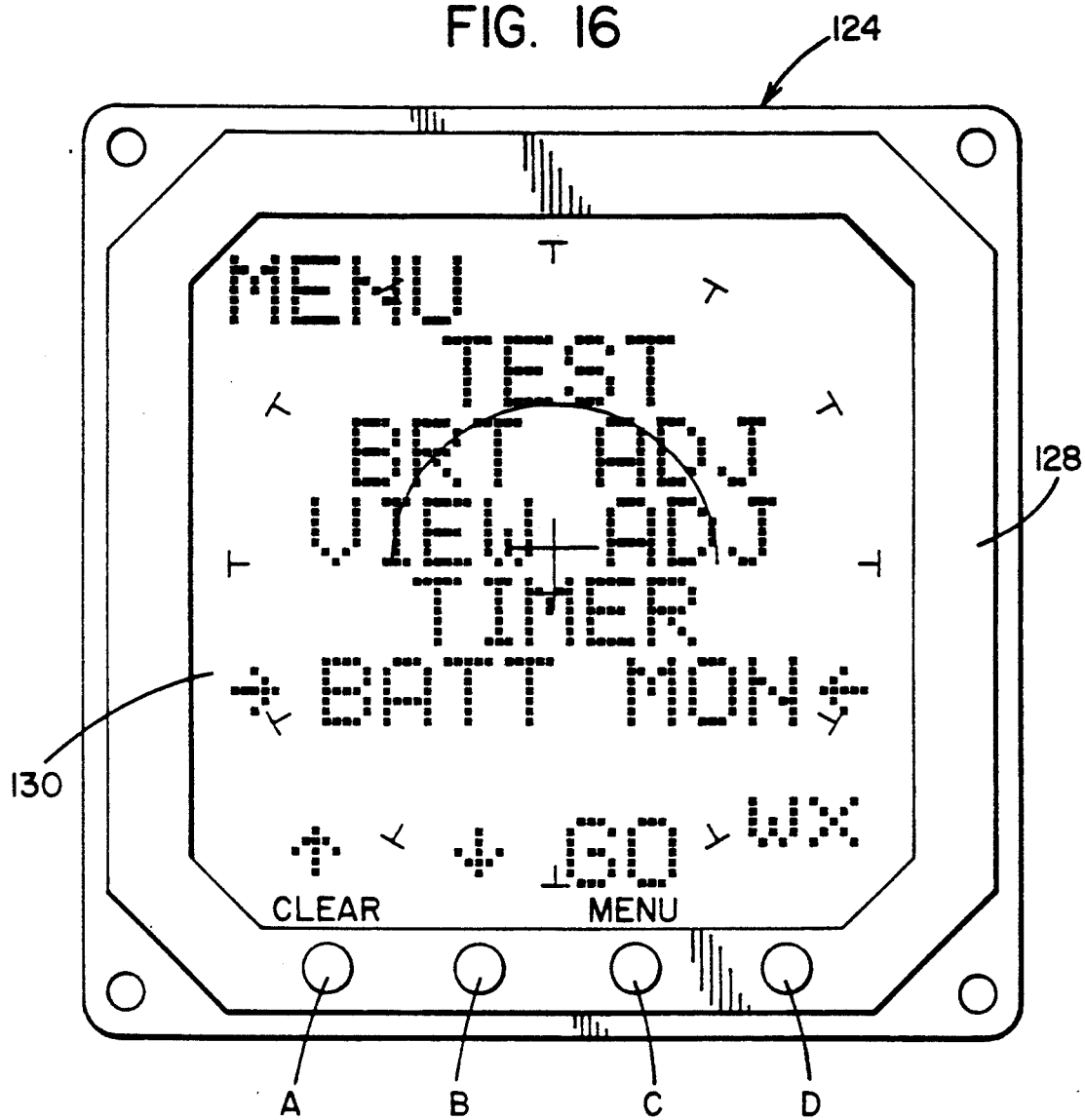

While in the weather mode 242, if the pushbutton C is activated as determined by the decisional block 246, a menu mode is entered at block 248 and a selection menu is displayed on the display 84. A suitable display format of a menu is illustrated in FIG. 16. In accordance with the instructions of block 250, while in the menu mode, the depression of pushbuttons A and B causes a pointer in the display to point to a selected item. After making the selection the activation of pushbutton C causes the program execution to go to the routine of the selected mode via blocks 252 and 254. Otherwise, if pushbutton D is activated, program execution is diverted back to the weather mode 242 in accordance with decisional block 256. One of the menu items is user test and when selected causes the program execution to divert to the block 258 and renders execution of the test routine starting at block 216.

Figure 17:
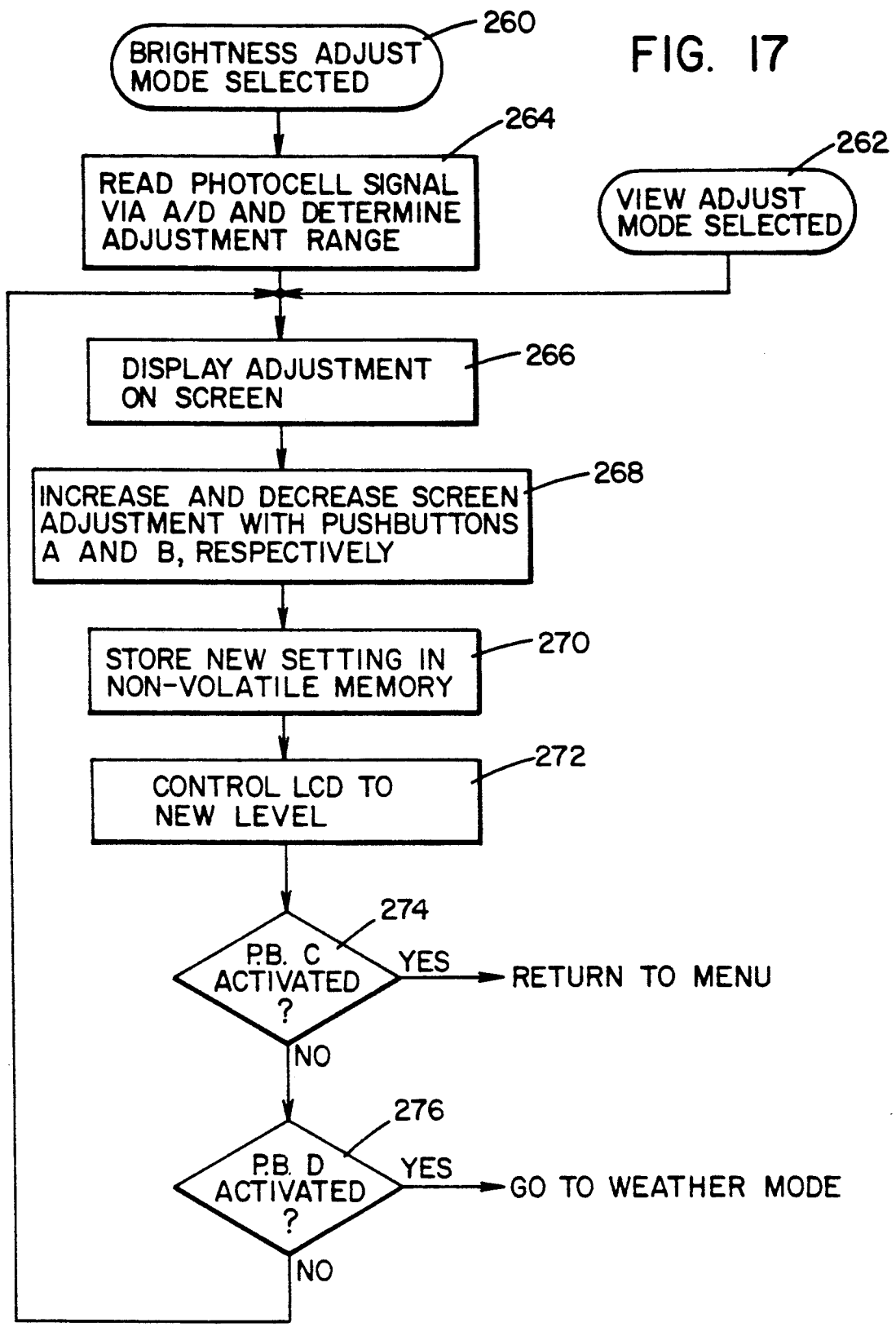
FIG. 17 is a software flow chart suitable for programming the microcontroller for brightness and view adjust modes of the display module.
Figure 18:
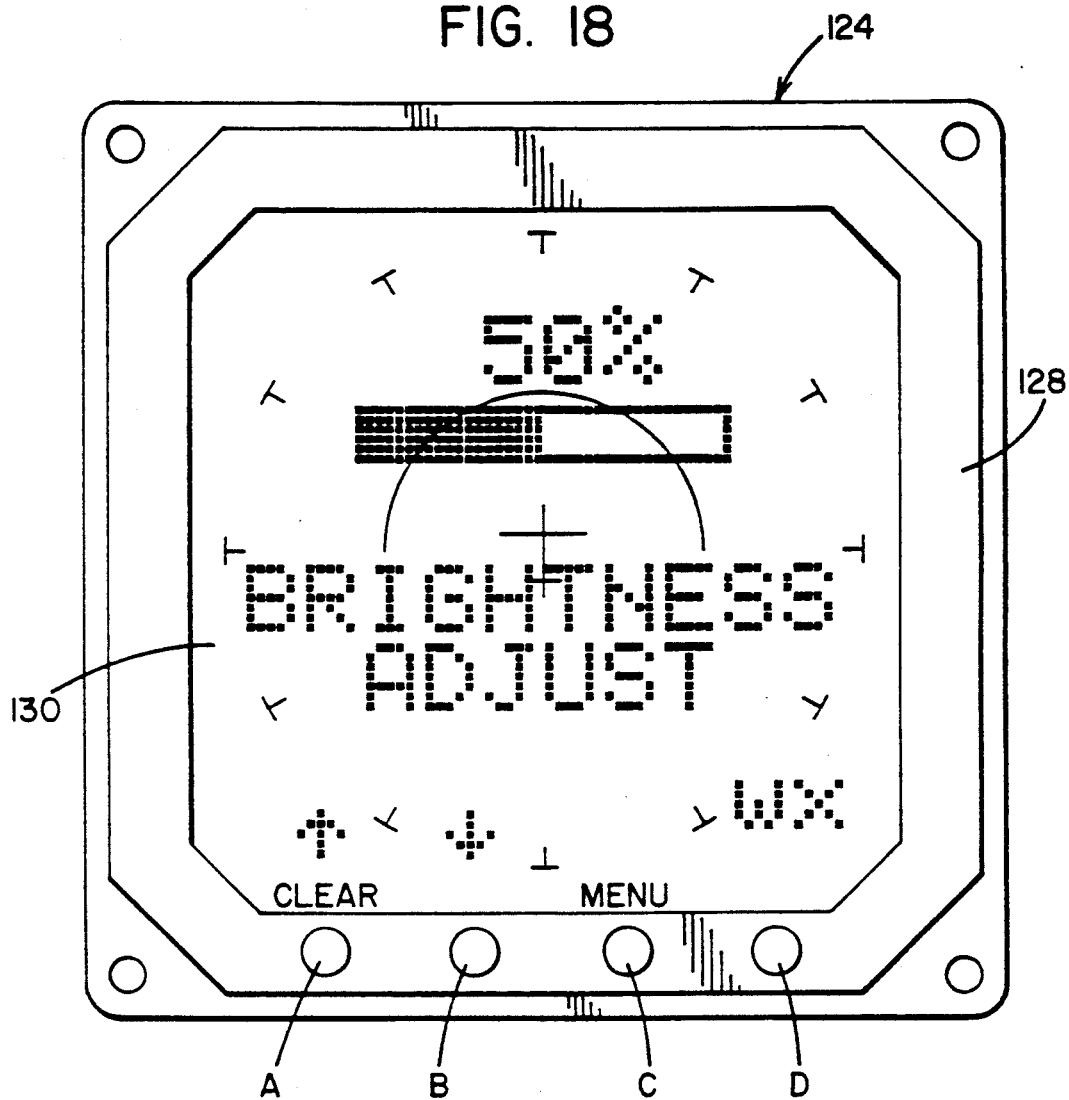
FIGS. 18 and 19 are screen display formats which may be generated by the software routine of FIG. 17.
Figure 19:
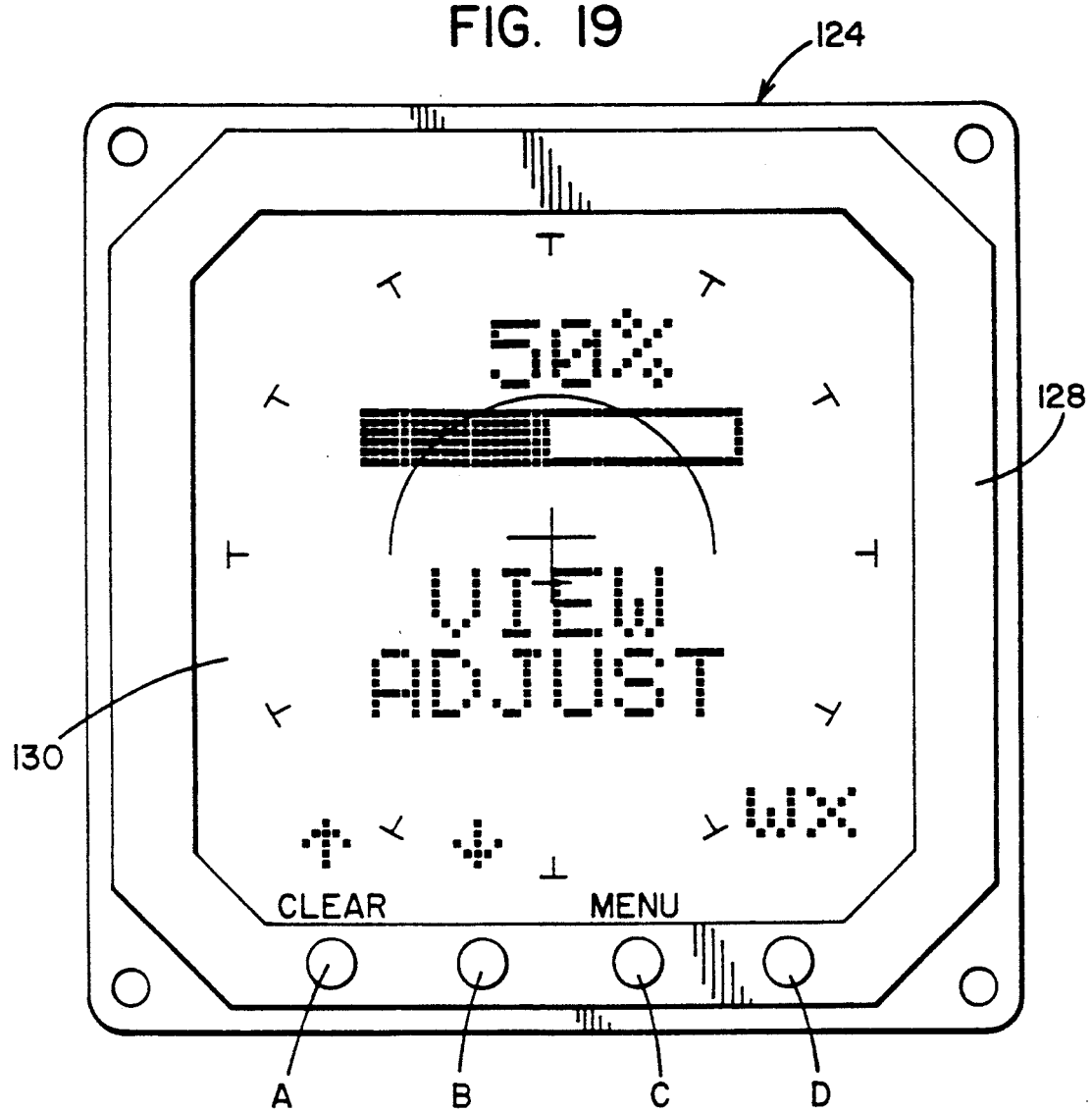

Referring to FIG. 16, when either the brightness adjust or view adjust modes are selected from the displayed menu, program execution is diverted to a routine similar to that shown by the software flowchart of FIG. 17 starting at block 260 or 262 as the case may be. If in the brightness adjust mode, the photocell signal is read through the A/D convertor and an appropriate adjustment rang is determined from the value of the reading in block 264. In the present embodiment, there exists four (4) storage registers in memory for storing corresponding brightness setpoint values of four (4) ambient light level ranges. Accordingly, the photocell signal value determines which setpoint range is selected for display on the display 84. FIG. 18 illustrates a suitable display for brightness adjust. In the present embodiment, the view adjust routine includes a single register for storage of a view adjust setpoint and this setpoint range is displayed on display 84 similar to that shown by the illustration of FIG. 19.

Continuing, the instructions of block 266 causes the proper display format representative of the selected setpoint value to be displayed on the LCD. The adjustment of the displayed setpoint is accomplished through the pushbuttons A and B. For example, pushbutton A may cause the setpoint value to increase and pushbutton B may cause the setpoint value to decrease. Ultimately, the new setpoint value is stored in the proper register of non-volatile memory by instructional block 270 and used to control the brightness or view (contrast) of the LCD to the newly adjusted level by the instructions of block 272. The activation of pushbutton C causes the program execution to return to the menu screen as determined by the decisional 274 and the activation of pushbutton D causes a return to the weather mode as determined by block 276. Otherwise, the selected setpoint adjustment display continues to afford the operator further adjustment of the selected setpoint value.

Figure 20:
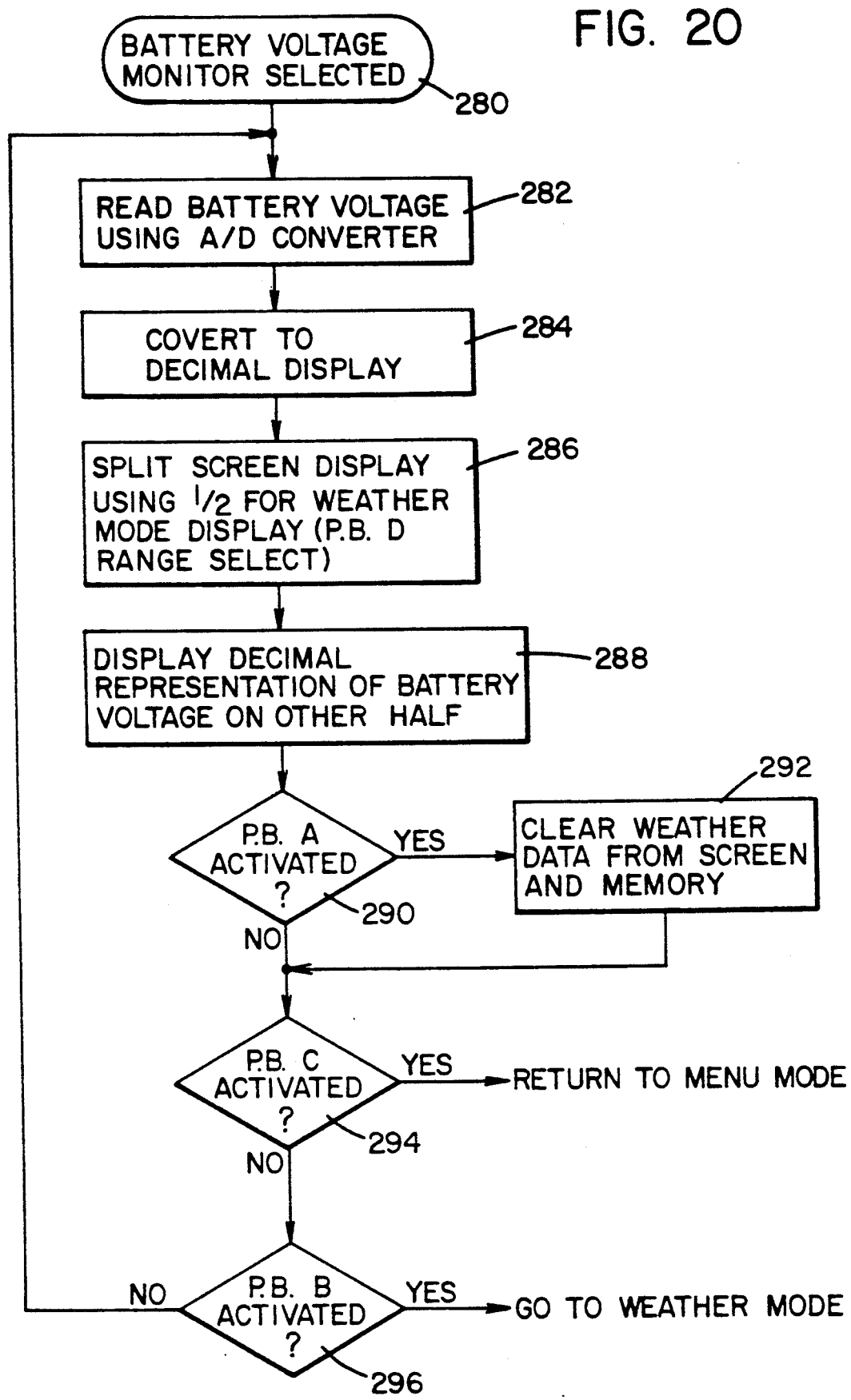
FIG. 20 is a software flow chart suitable for programming the microcontroller to monitor the avionics power bus.
Figure 21:
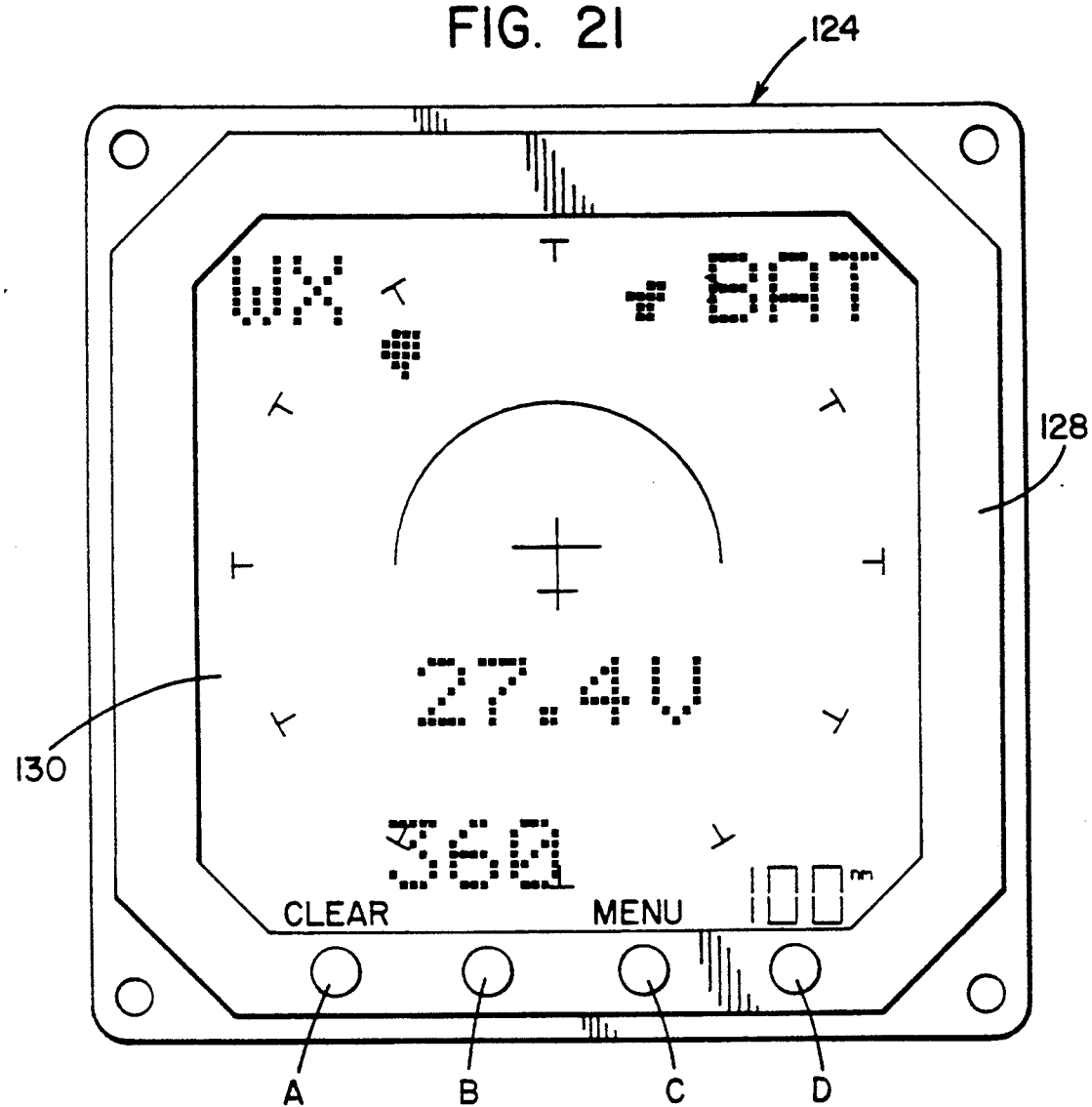
FIG. 21 is an example of a screen display format which may be generated by the software routine of FIG. 20.

Should the avionics power bus monitor or battery monitor mode be selected from the menu shown in FIG. 16, program execution is diverted to a routine similar to that shown by the exemplary software flowchart of FIG. 20. Program execution of this mode starts at block 280 and the first task initiated by block 282 is to read the signal VBAT which is representative of the battery voltage of the avionics power source using the A/D convertor 108 of the microcontroller 70. In the present embodiment, the analog signal level is converted to a decimal reading in block 284 for display on the LCD screen. In block 286, the display screen is split into two portions-one for displaying the lightning strike indications from the weather mode wherein range is selected through PBD. The instructions of block 288 displays the decimal representation of the monitored battery voltage on the other half of the display whereupon both the lightning strike indications and the battery voltage are displayed concurrently so that the pilot or operator does not lose sight of potentially threatening weather in the direction of his or her aircraft. An example of a suitable display for this purpose is shown in the illustration of FIG. 21. While in this battery voltage monitor mode, the activation of pushbutton A clears weather data from the screen and display memory in accordance with the blocks 290 and 292. Also, pushbutton C activation causes a return to the menu mode and pushbutton B activation causes a return to the weather mode as determined by the decisional blocks 294 and 296, respectively. Otherwise, the battery voltage is continuously monitored and displayed on a portion of the display with the other portion continuously providing indications of detected lightning strikes.

Figure 22:
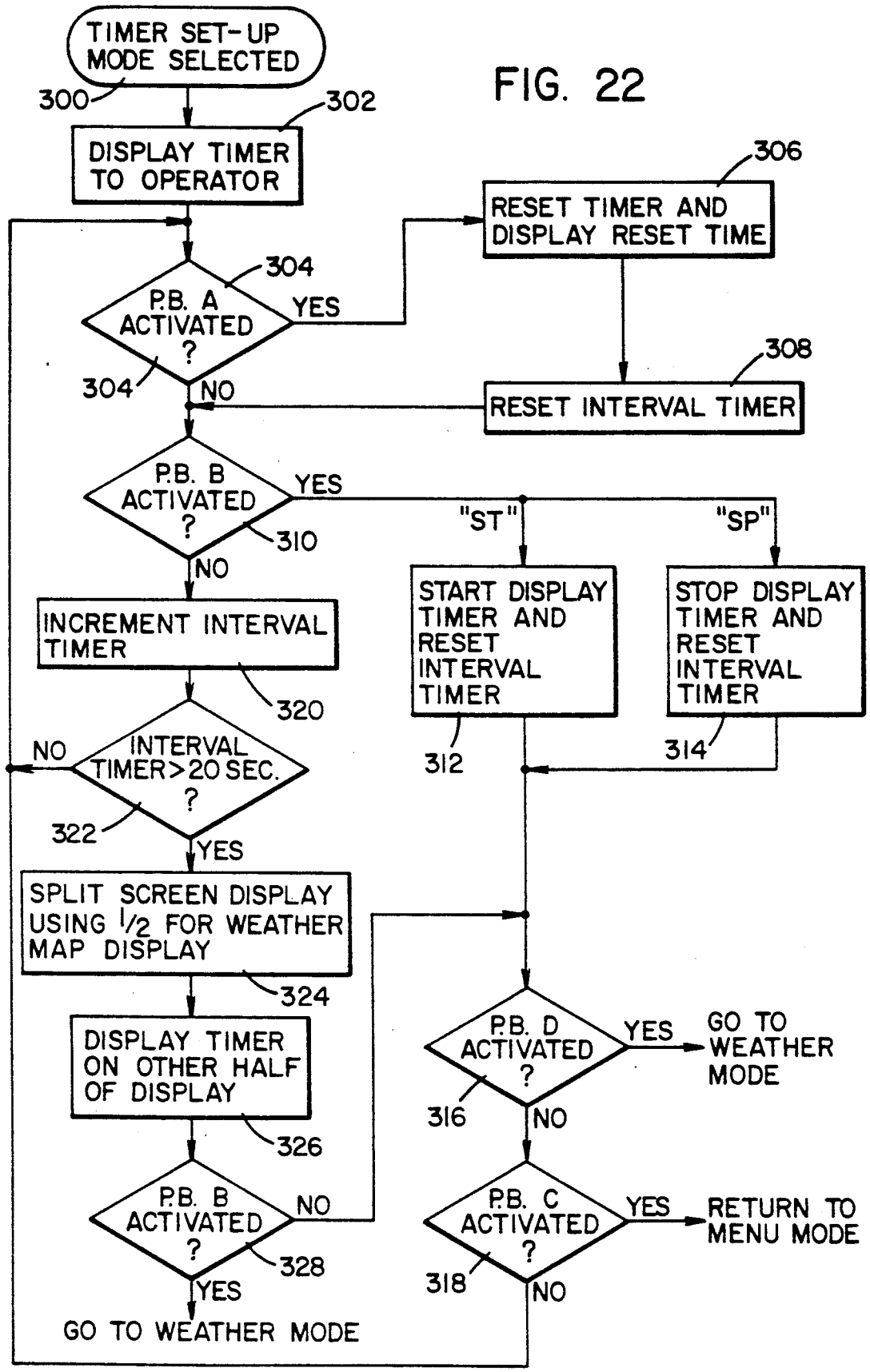
FIG. 22 is a software flow chart of a suitable program for the microcontroller in connection with a timer setup mode.
Figure 23:
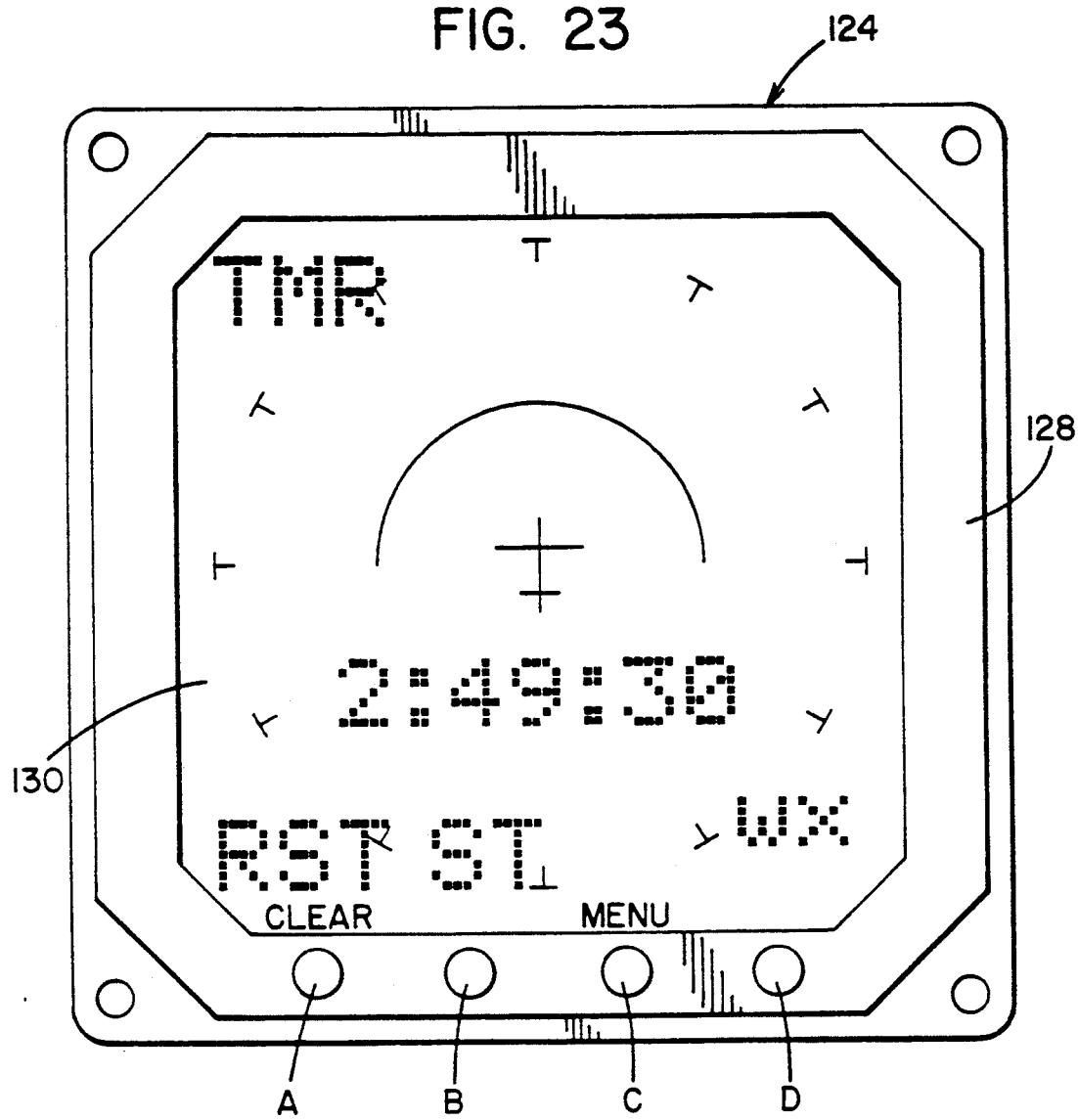
FIGS. 23 and 24 are examples of screen display formats which may be generated by the software routine of FIG. 22

If the timer mode is selected from the menu screen as shown in FIG. 16, program execution is directed to a routine similar to that exemplified by the flow chart of FIG. 22 starting at block 300. In the instruction 302 the time of the timer is displayed in decimal format to the operator through an LCD screen format similar to that shown by the exemplary illustration of FIG. 23. The time of the reset timer may be reset by the activation of pushbutton A via blocks 304 and 306 and an interval timer may be reset by the block 308. Activation of pushbutton B as determined by the decisional block 310 either starts the display timer and resets the interval timer by instructional block 312 if the timer was in a mode "ST" in which it was not counting or stops the display timer and resets the interval timer by the instructions of block 314 if the timer is in a mode "SP" and counting. After execution of either block 312 or 314, the program execution may be diverted to the weather mode or the menu mode by depression of pushbuttons D or C, respectively, as determined by the respective decisional blocks 316 and 318.

Figure 24:
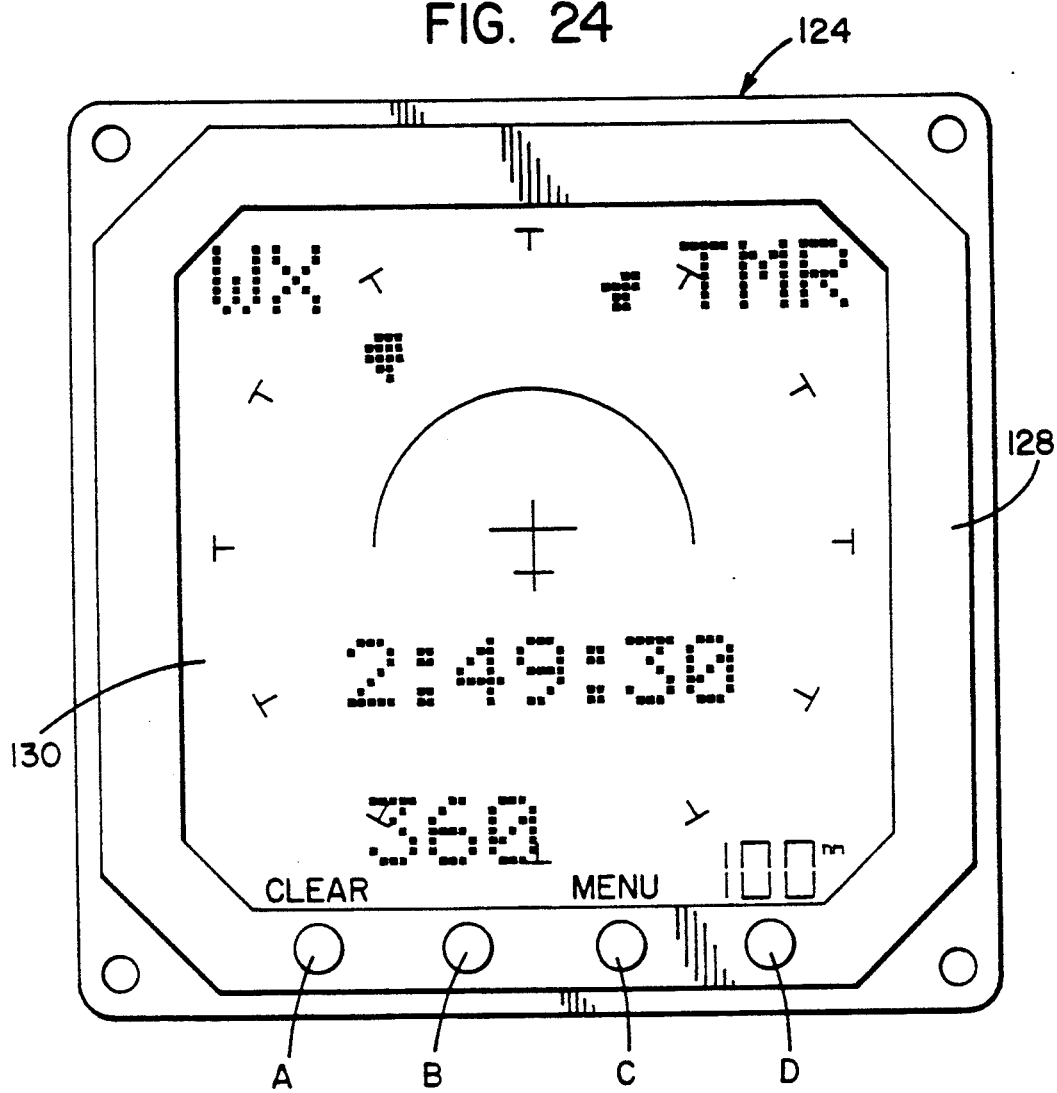

Returning to the decisional blocks 304 and 310, each cycle time the pushbuttons A and B remain idle or un-activated, an idle interval timer is incremented by the block 320 until it reaches a predetermined time as determined by the decisional block 322. In the present embodiment, this time is set at 20 seconds. If the idle time reaches 20 seconds, the LCD display is caused to split into two portions using one portion for displaying the map of lightning strike indications according to the instructions of block 324 and the other portion for displaying the decimal representation of the timer by block 326. FIG. 24 illustrates a suitable display format for this purpose. Pushbutton B may be activated to exit this mode to enter the weather mode as determined by decisional block 328 or a return to the weather on menu modes may be rendered by activating either pushbutton D or C as determined by blocks 316 or 318; respectively.

Figure 25:
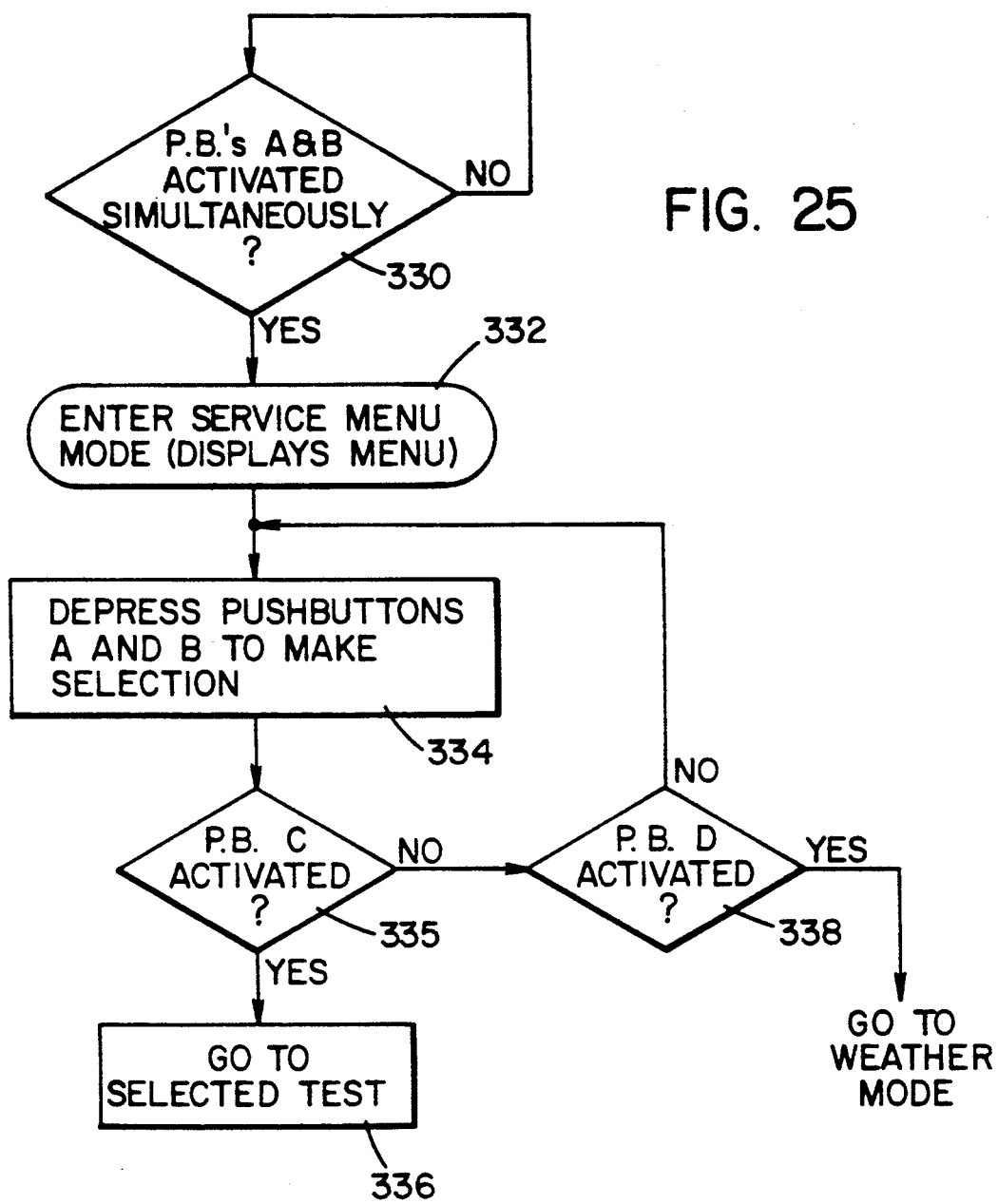
FIG. 25 is a software flow chart of a suitable program for the microcontroller in connection with service menu mode operation.
Figure 26:
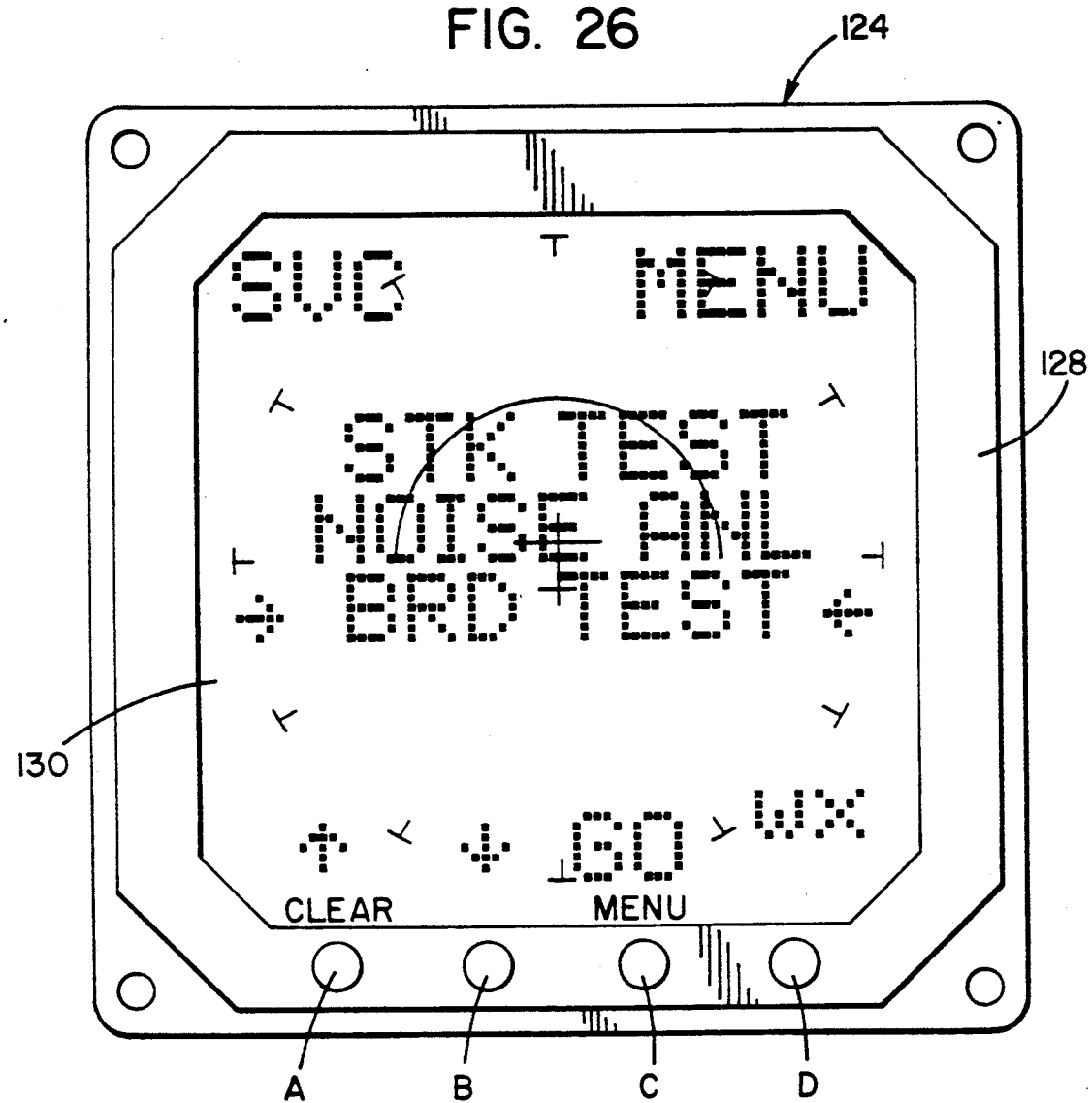
FIG. 26 is an example of a screen display format which may be generated by the software routine of FIG. 25.

As indicated above, in the present embodiment, the simultaneous activation of the pushbuttons A and B causes the microcontroller software to enter a service mode routine. A suitable software routine for this purpose is illustrated by the software flow chart of FIG. 25 wherein the simultaneous activation is detected by the decisional block 330 whereupon the service menu mode is entered at block 332 and a service menu format is caused to be displayed on the LCD screen similar to that illustrated in FIG. 26. While in this service mode, the depression of pushbuttons A and B causes an arrowed pointer to point to a selected test or routine of the menu as accomplished by the instructions of block 334. Once a selection is made, activation of pushbutton C as determined by block 335 causes the routine to go to the selected test routine in block 336. At any time during the service menu, should pushbutton D be activated, a return to the weather mode is effected by the decisional block 338.

Figure 27:
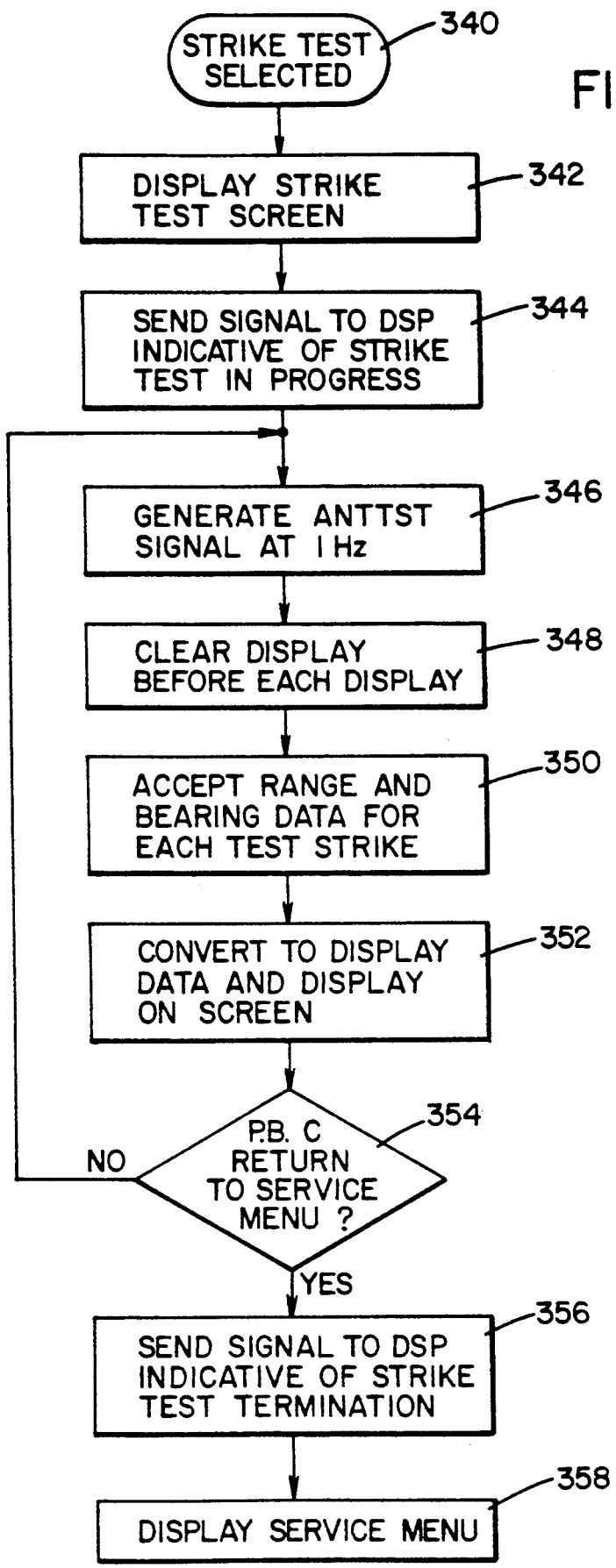
FIG. 27 is a software flow chart suitable for programming the microcontroller for strike test processing.
Figure 28:
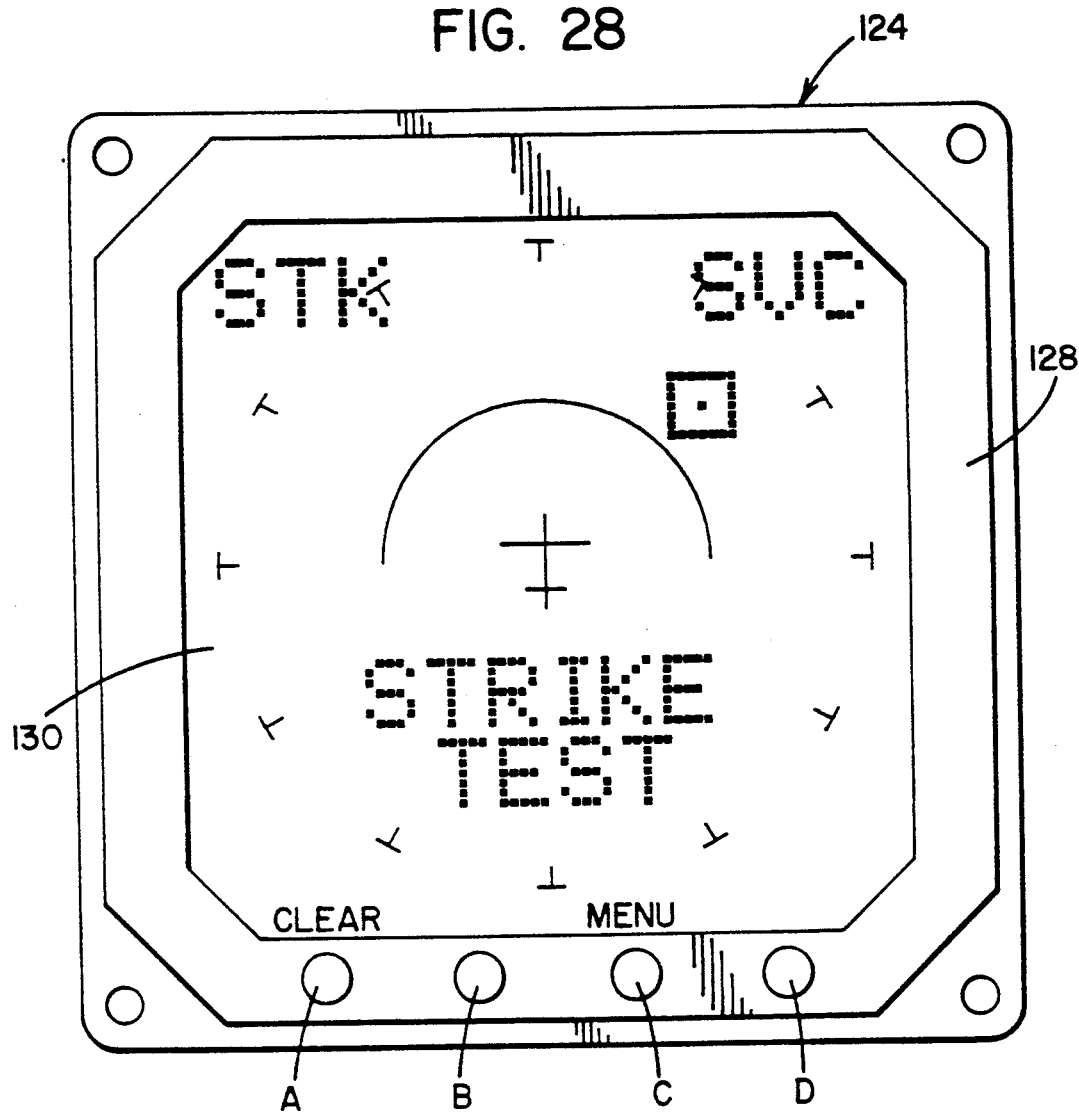
FIGS. 28 and 29 are examples of screen display formats which may be generated by the software routine of FIG. 27.

If the strike test is selected from the service menu, program execution is diverted to a routine similar to that exemplified by the flow chart of FIG. 27 wherein program execution is initiated at block 340. The block 340 may also be entered as part of the board test selection for performing the strike processing test. In the block 342, a strike test format is displayed on the LCD screen similar to that exemplified by the illustration of FIG. 28. In the strike test mode, a box is displayed at the 1:30(44DEG) position at a range of approximately 17 NM, and the test strike indications are to be displayed within the box for the test to be successful. In this mode, no range indication need be displayed. Next, in block 344, the STKTST signal is conducted to the DSP 46 indicative of a strike test in progress. Thereafter, the microcontroller 70 is caused to generate the ANTTST signal at 1 hertz (10 hertz for board test) according to the instructions of block 346. The strike test display is cleared before each next display by the block 348. Thereafter, responsive range and bearing data is received by block 350 from the DSP 46 for each generation of the ANTTST signal. The strike data is converted to a location for screen display by the block 352. Pushbutton C allows the routine to return to the service menu as determined by the decisional block 354. Prior to returning to the service menu, a signal is sent to the DSP 46 to indicate the termination of the strike test according to the instructions of block 356. The service menu is then redisplayed by the block 358.

Figure 29:
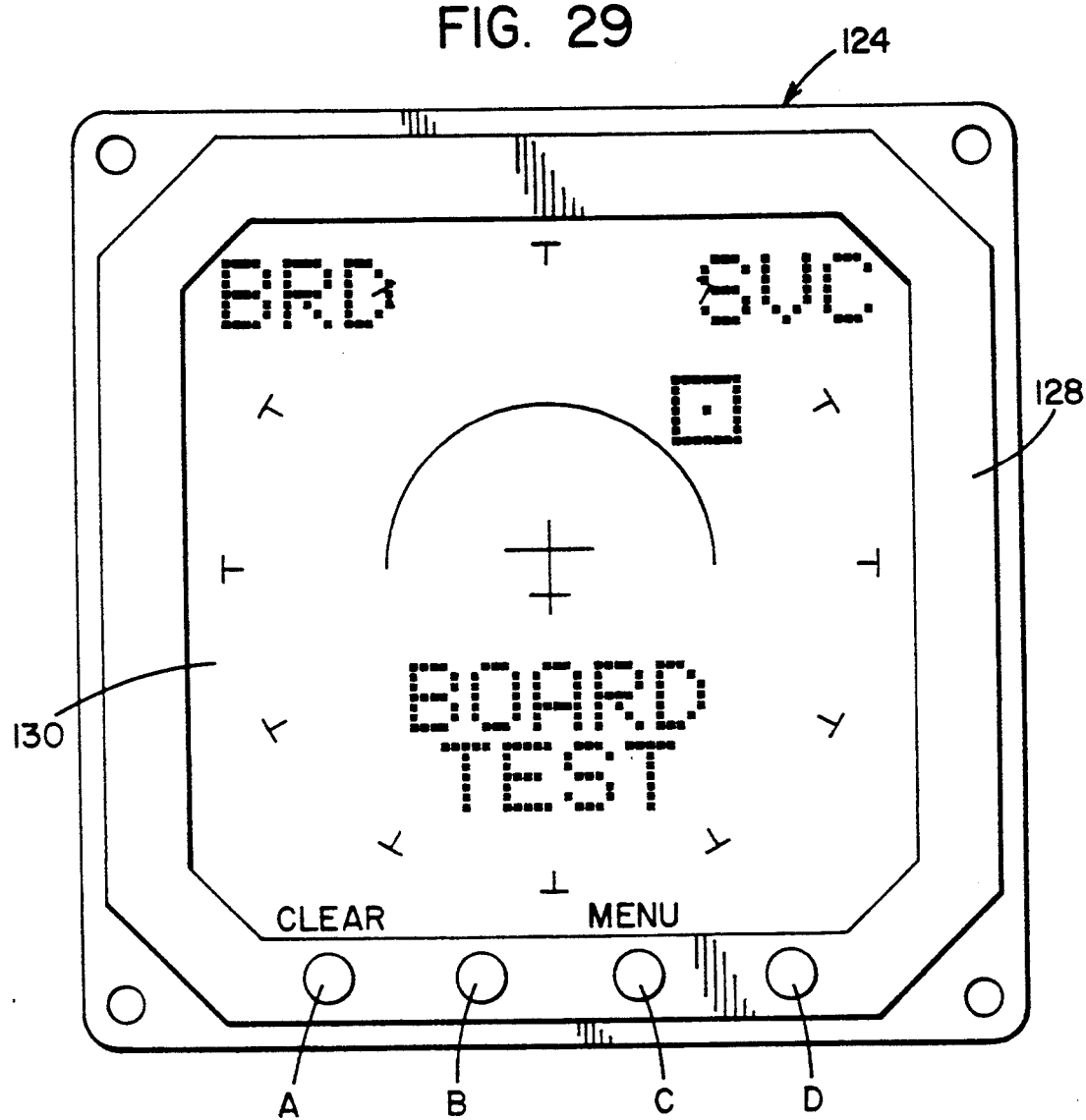

The board test mode is intended as an aid in isolating system problems to the printed circuit board level. The mode is to be used when the aircraft is on the ground or with the electronics system on a test bench. While in the board test mode of the service menu, the test strike screen format is generated and displayed similar to that exemplified by the illustration of FIG. 29 and test strikes are generated at a rate of at least 10 hertz according to software which is similar to that described in connection with the flow chart of FIG. 27. In both the strike test and board test modes lightning test strikes are indicated by a single pixel in the LCD display for the present embodiment.

Figure 30:
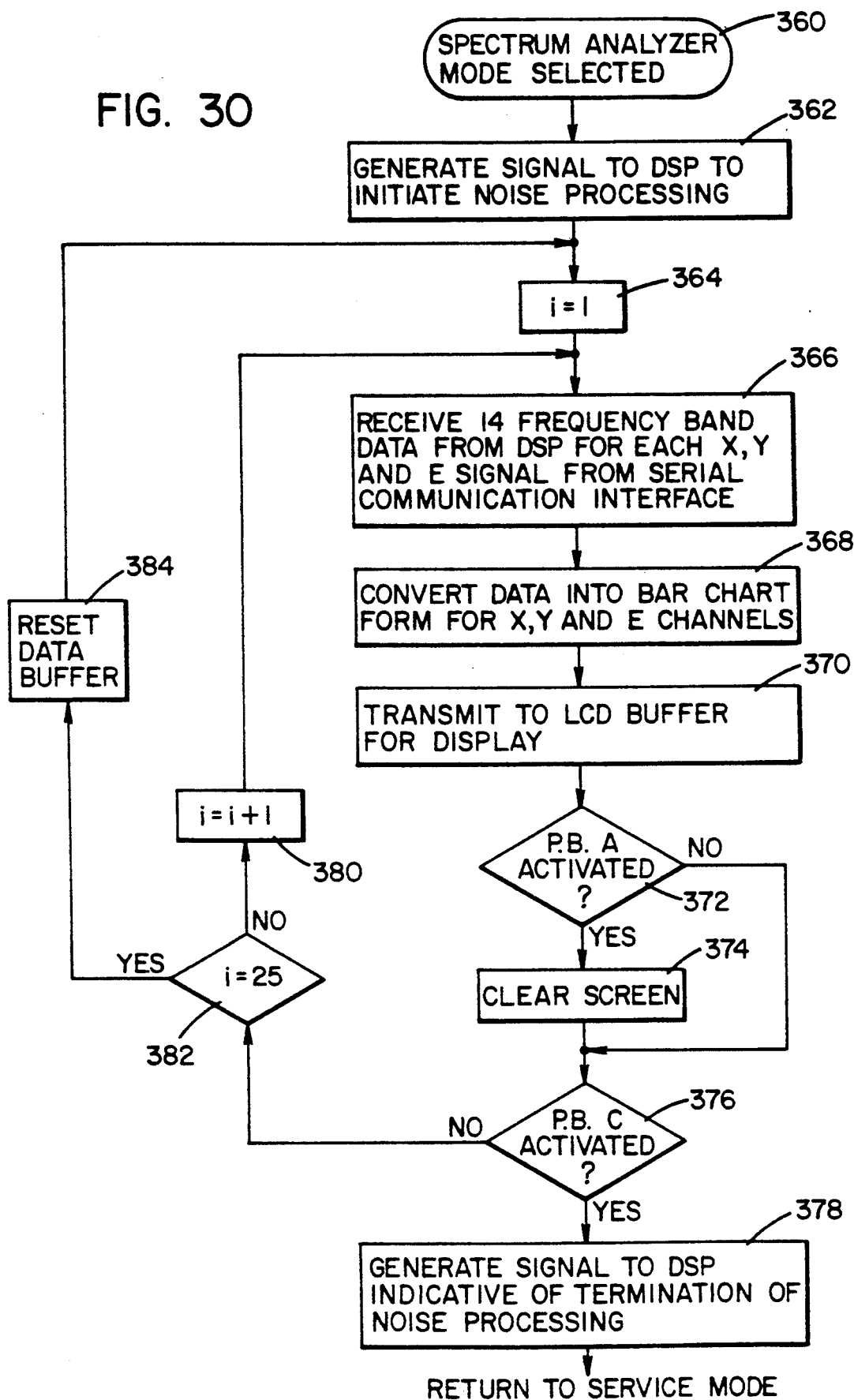
FIG. 30 is a software flow chart suitable for programming the microcontroller to operate in a spectrum analyzer mode.
Figure 31:
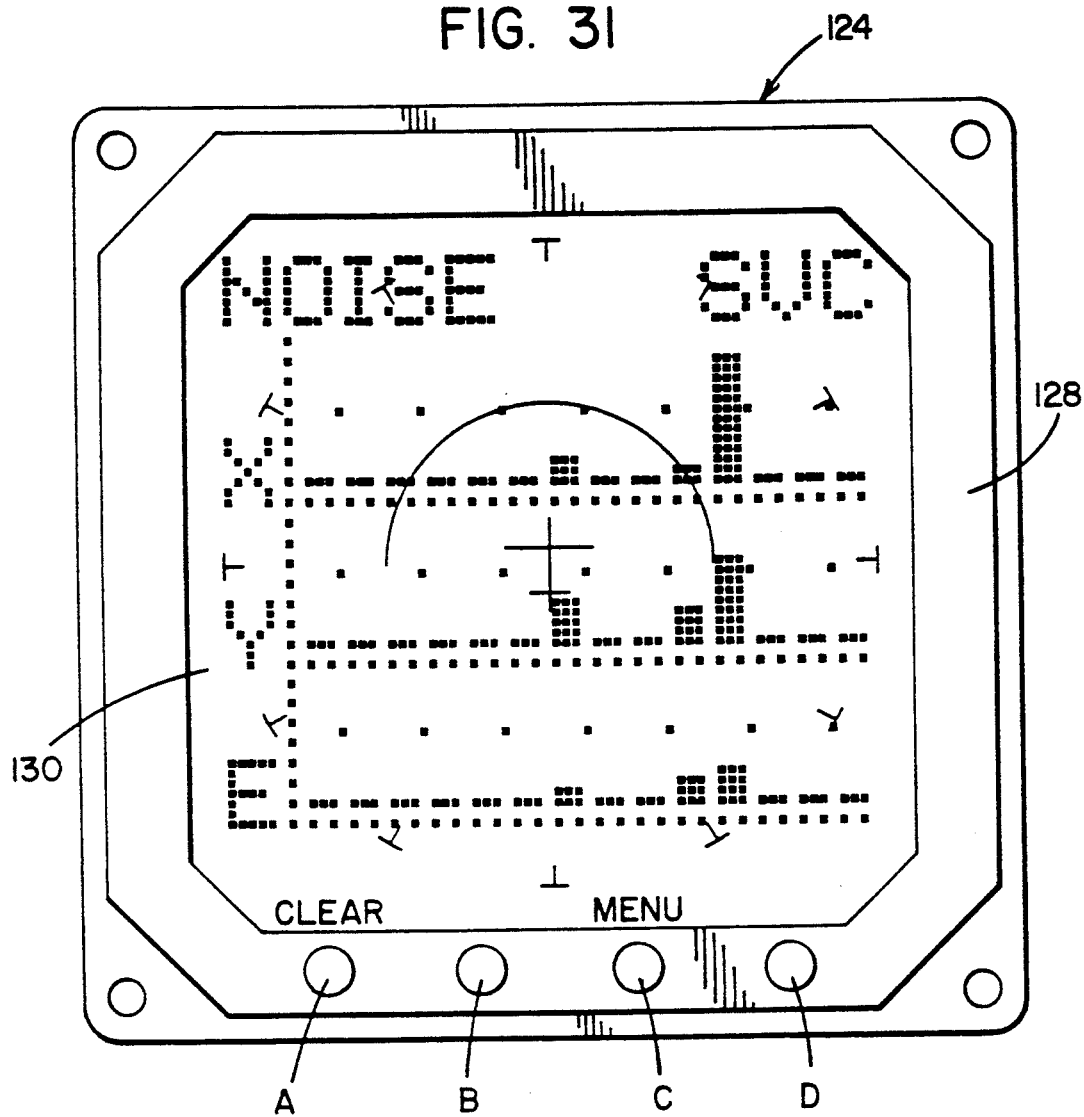
FIG. 31 is an example of a screen display format which may be generated by the software routine of FIG. 30.

If the spectrum analyzer mode is selected from the service menu (FIG. 26), program execution is diverted to a routine similar to that shown by the software flow chart of FIG. 30, for example, and more specifically, at block 360 thereof. The spectrum analyzer mode is initiated by generating the SPANL signal to the DSP 46 over signal line 72 to commence frequency processing in accordance with block 362. Thereafter, an index i is set to 1 in block 364. The DSP 46 is left to perform the frequency spectrum analysis as will be described in greater detail hereinbelow. The microcontroller 70 then receives a plurality of frequency band data from the DSP 46 for each of the X, Y and E signals via the synchronous communication interface 74 according to the instructions of block 366. In block 368, the data is converted into a bar chart format for the X, Y and E channels and then transmitted to the LCD display buffer for display on the screen thereof by block 370. FIG. 31 illustrates a suitable display of a bar chart format for the frequency spectrums of the X, Y and E channels. Activation of pushbutton A clears the screen and screen buffer as effected by the blocks 372 and 374. Activation of pushbutton C returns the program execution to the service mode as determined by the decisional block 376. Prior to return, a signal is generated to the DSP 46 to indicate the termination of frequency spectrum processing by the block 378. Otherwise, the index i is incremented by the block 380 and the processing of blocks 366, 368 and 370 are repeated until the index reaches a predetermined number which for the present embodiment is set at 25. When the index reaches 25 as determined by the decisional block 382, the data buffer is reset in block 384 and program execution is returned to block 364 to begin all over again through another 25 cycles. Note that the programmed steps of blocks 380, 382 and 384 may be performed in the DSP 46 in the preferred embodiment.

Figure 32:
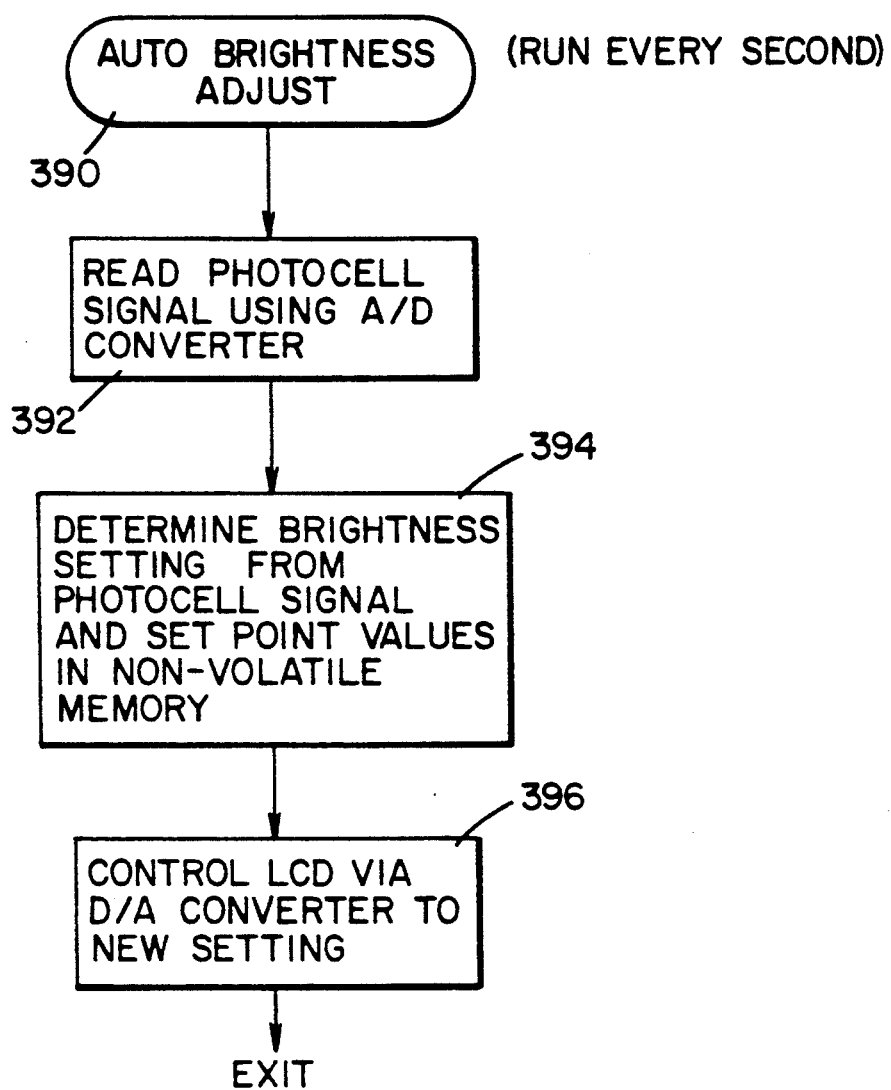
FIG. 32 is a software flow chart suitable for programming the microcontroller to adjust the brightness level of the display of the system automatically.

In the background, the microcontroller 70 performs an auto brightness adjust routine periodically. For the present embodiment, this routine is executed once every second. A suitable routine is exemplified by the flow chart shown in FIG. 32 starting at the block 390. An initial step at 392 causes reading of the photocell signal using the A/D convertor 108 of the microcontroller 70. In block 394, an ambient light level range is determined from the read photocell signal and the set point value corresponding to the storage register of that range is selected for control of the brightness of the LCD to the selected setting via the D/A convertor 96 in accordance with the instructions of 396.

Figure 33:
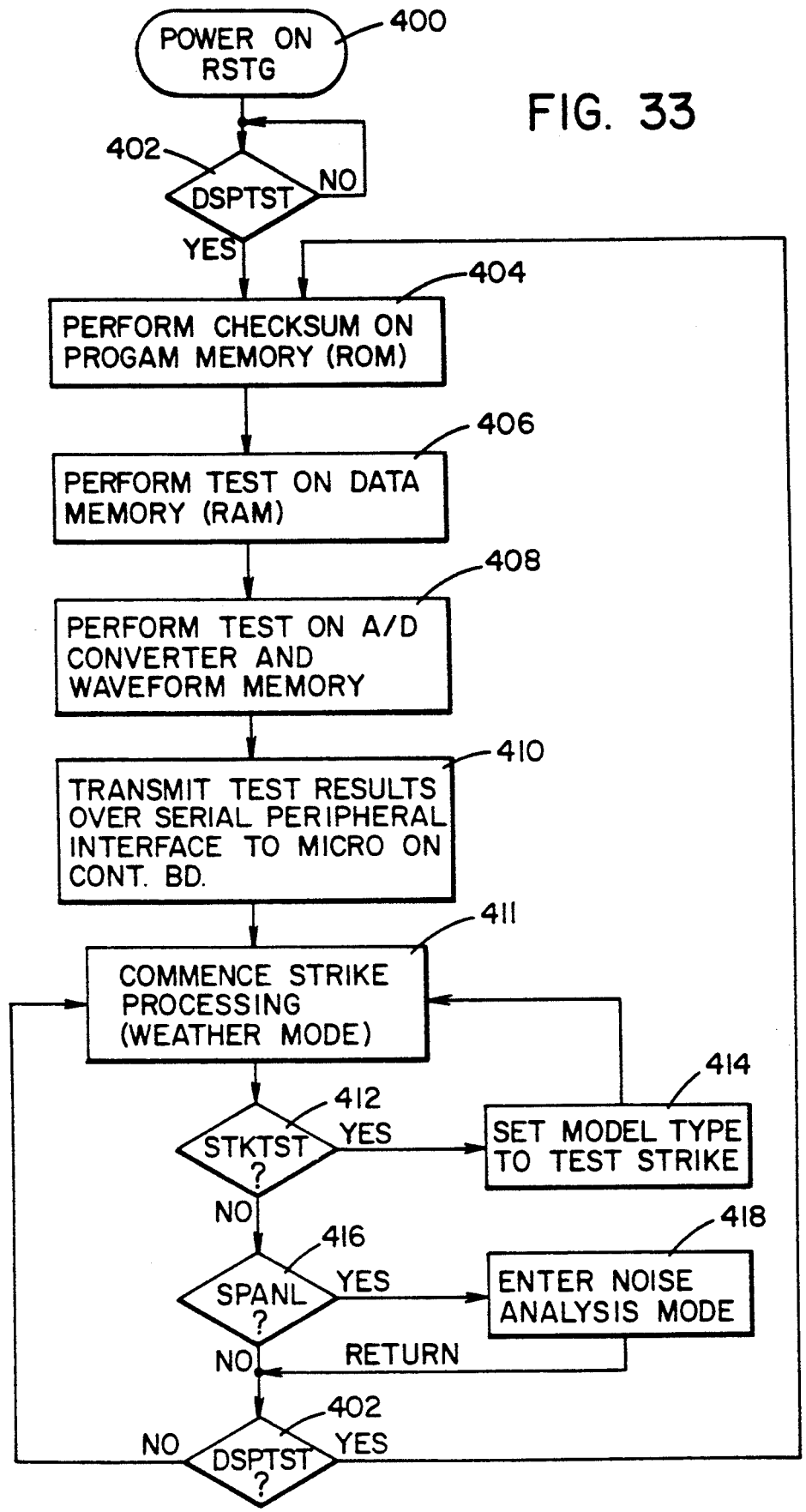
FIG. 33 is a software flow chart suitable for programming the digital signal processor (DSP) of the system at a task level.

Another set of flow charts are provided to exemplify the programmed operations of the DSP 46 for the DSP module starting at FIG. 33. When power is turned on to the DSP 46, it waits at the block 400 to receive the reset signal RSTG from the microcontroller 70 or logic block 90 thereof. Thereafter, the DSP waits for the power-up DSPTST signal as determined by the block 402. The DSPTST signal may also be generated as a result of the continuous self-test every 10 seconds or by user selection randomly in accordance with the operational block 220 as described in connection with FIG. 10. In response to the DSPTST signal, the DSP 46 performs a checksum of the two 8k×8 bit read only memories in accordance with the instructions of block 404. A test is also performed on the two 2k×8 bit random access memories and the onchip DSP memory by block 406. The execution of blocks 404 and 406 may be reversed in order. A third test is performed by block 408 by reading the contents of the waveform RAM 42 which should contain a value corresponding to the test voltage reference as described hereabove in connection with data acquisition circuitry testing.

After performing the tests of blocks 404, 406 and 408, the DSP 46 sends the test results message to the microcontroller 70 over the synchronous communication interface 74, which message contains a pass/fail indicator for each test. An error message is displayed as described in connection with the flow chart of FIG. 10 for any tests which fail or if no tests results message is received from the DSP 46. In some cases, if the DSP indicates a faulty condition, no further DSP test may be performed and the synchronous communication interface of the microcontroller 70 may be disabled. If no faults are detected, the lightning strike processing is commenced in block 411 which will be described in greater detail in subsequent flow chart descriptions hereinbelow.

At this time, the program may automatically enter the strike processing mode upon receiving the STKTST signal from the microcontroller logic. The strike processing test may also be performed every 10 seconds as part of the continuous self-tests. During the strike processing test, the microcontroller 70 generates a 30 millisecond positive current pulse as the ANTTST signal to cause the circuitry of the antenna module to produce a simulated test strike after each edge of the generated pulse. Generally, these test pulses have the same shape, but one may start out positive and another negative. In the present embodiment, the signal STKTST is asserted at the rising edge of the antenna test pulse and stays asserted for a total of 60 milliseconds. The test strikes are processed by the DSP to determine a range and bearing of the simulated strikes. When the signal STKTST is asserted as determined by block 412, the program sets the strike model type as will be more fully understood from the description found herein below to TEST STRIKE or to INVALID TEST STRIKE depending upon the characteristics of the strike data. This is accomplished in the block 414. In the present embodiment, the processing of block 414 sets the strike type to TEST STRIKE when a strike with the correct pulse width is received while the STKTST signal is asserted. On the other hand, the block 414 will set the strike type to INVALID TEST STRIKE if a strike with a non-model pulse width is processed while the STKTST signal is asserted. Also, if a strike signal is received at any time having a pulse width which is above or below predefined limits, the strike data is discarded by the DSP 46. After the strike type is set by the block 414, the lightning strike processing is commenced in the block 411.

Still further, the frequency spectrum analysis program of the DSP 46 may be initiated by asserting the signal SPANL which is detected by the block 416 of the flow chart of FIG. 33 and causes the program execution to enter the frequency analysis mode by the block 418. A suitable program for analyzing the input signals of the XLP, YLP, and EFD channels and generating frequency spectrums thereof is exemplified by the software flow chart of FIG. 34.

Referring to FIG. 34, the frequency spectrum analysis enters the routine by block 420, sets an index i equal to 1 in block 422, and waits for a threshold trigger in block 423. Upon detection of a trigger, in block 424, the DSP 46 reads in 128 samples, for example, of each of the X, Y and E sampled-data signals from the waveform RAM 42 and stores them into a sample buffer of the DSP 46 as real values. Thereafter, in block 426, the data stream is formatted for processing including setting the imaginary values of the 128 samples of each X, Y and E channels to zero, among other steps. In block 428, the 256 values of each of the X, Y and E channels are processed through a 256 point Fast Fourier Transform (FFT) algorithm to yield 256 frequency samples for each of the X, Y and E channels. The instructions of block 430, selects the first 126 frequency samples, for example, of each of the X, Y and E channels and compresses them into 14 frequency bands for each channel. In the present embodiment, there are 9 frequency signals in each band and as part of the frequency selection process for each band, the largest of the frequency signals in a band is selected as the frequency for that band. The instructions of block 432 are skipped over for i equals 1 and the selected 14 frequency signals are converted to a proper format for transmission to the microcontroller 70 in block 434. Next, block 436 transmits the frequency spectrum information of the three channels X, Y and E to the microcontroller 70 over the synchronous communication lines using FSX, COMM and COMCLK.

In the decisional block 438, the program determines if the index has reached a predetermined number which for the present embodiment is set at 25. If not, the index is incremented in block 440 and the processing repeated. For i greater than 1, the instructions of block 432 are executed to compare the current 14 frequency signals with the previous 14 frequency signals respectively and the largest quantity in each case is selected as the resulting frequency signal. This is performed for the frequency signals of all three channels X, Y and E. When the total number of repetitions is complete as determined by the decisional block 438, the overall frequency spectrum analysis routine may be repeated until terminated by the deassertion of the signal SPANL as determined by the decisional block 416 in the flow chart of FIG. 433.

When the weather mode is selected as part of the program execution of the microcontroller 70, a routine similar to that exemplified by the flow chart of FIG. 35 is executed starting at the block 450. Concurrently, the DSP 46, upon receiving the interrupt DSPTST, commences execution of a routine which may be similar to that exemplified by the flow chart of FIG. 36 starting at block 500. Starting with the flow chart of FIG. 36, the DSP monitors the address lines of the data acquisition controller 34 until it identifies a predetermined address which may be a predefined address of the waveform RAM 42. In the present embodiment this address is 8003h as determined by the decisional block 502. Then, in block 504, an address index is set to 8001h and the sampled and digitized X and Y signals are each read into a buffer memory of the DSP 46 starting at the address 8001h for threshold monitoring thereof. Accordingly, the monitoring of the data samples is performed substantially contemporaneous with the sampling and digitizing of the received waveform signal being only slightly delayed by a relatively small number of sample cycles, e.g. 3 sample cycles.

Continuing with the flow chart of FIG. 36, in the threshold monitoring process, the data samples $Y_i$ and $X_i$ are compared with a predetermined threshold value in the decisional blocks 506 and 508 to determine if either of them exceeds the threshold value. If neither exceeds the threshold value, the index is incremented by 1 and the X and Y samples associated with the new address index are read in by the block 512 and are retested in the decisional blocks 506 and 508. This process continues until one of the contemporaneous read X or Y samples exceeds the predetermined threshold. Should the Y sample exceed the threshold first as detected by block 506, the Y channel or sampled-data train is set as the trigger channel and the X channel is set as the non-trigger channel in block 514. On the other hand, if the X sample exceeds the threshold first as determined by block 508, then the X channel or sampled-data train becomes the trigger channel and the Y channel becomes the non-trigger channel as set by the block 516.

In either case, a dart leader test is conducted next by the decisional block 518 using only samples of the trigger channel referred to as TS. In 518, at least one sample $TS_{i-1}$ preceeding the trigger sample $TS_i$ and at least one sample $TS_{i+1}$ succeeding the trigger sample are read and compared with the trigger sample. If both of the preceeding and suceeding samples are determined to be less than a predetermined portion of the trigger sample which in the present embodiment is set to be one half of the trigger sample, then the trigger sample is considered a dart leader and further processing is aborted with an immediate resumption of monitoring the incoming samples for threshold trigger levels. In the present embodiment, processing may be delayed for N samples and the index i is increased by N in the block 520. For the preferred embodiment, N is set at 15 samples. After the 15 sample delay, the processing of blocks 512, 506, 508 and 510 are repeated until the next trigger sample is detected.

If the trigger sample is determined not to be a dart leader in 518, then the processing is continued at the block 522 wherein 15 pre-trigger samples and 112 subsequent samples of each of the channels X, Y and E are read into a buffer from the waveform memory 42 by the DSP 46. Accordingly, the DSP 46 has collected in a data sample buffer 128 samples, including the recovery of 15 prethreshold samples, of each of the sampled data trains representative of a detected lightning strike pulse like waveform. Next, in the instructional block 524, a pulse width of the detected lightning strike waveform is calculated. A suitable routine for performing the pulse width calculation is depicted by the flow chart of FIG. 37.

Referring to FIG. 37, the pulse width routine is entered at the block 530 and caused to search each of the samples in the designated trigger channel buffer starting from the trigger sample $TS_i$ to find a first local maximum thereof in block 532. The sample associated with the local maximum is multiplied by some pre-determined constant to establish an amplitude cutoff level in block 534. For the present embodiment, the constant may be chosen at 0.2. Next, in block 536, the routine counts the number of samples of the trigger channel buffer having amplitudes in excess of the amplitude cutoff level on both sides of the local maximum. Next, in block 538, a pulse width PW is set equal to the number of counted samples and the routine is returned to the primary routine of FIG. 36.

Upon return to the main routine of FIG. 36, the calculated pulse width $PW_c$ from block 524 is saved for subsequent processing in a buffer and also compared with a pulse width threshold $PW_{TH}$ in the decisional block 540. If the calculated pulse width is below the threshold setting, the represented lightning strike thereof is considered invalid and processing is aborted and the routine is diverted back to the decisional block 502. Otherwise, a correlation is next performed in the block 542 to further determine lightning strike validity. A suitable routine for processing the X, Y and E samples from the buffer to perform a correlation test thereof is exemplified by the software flow chart of FIG. 38.

Figure 38:
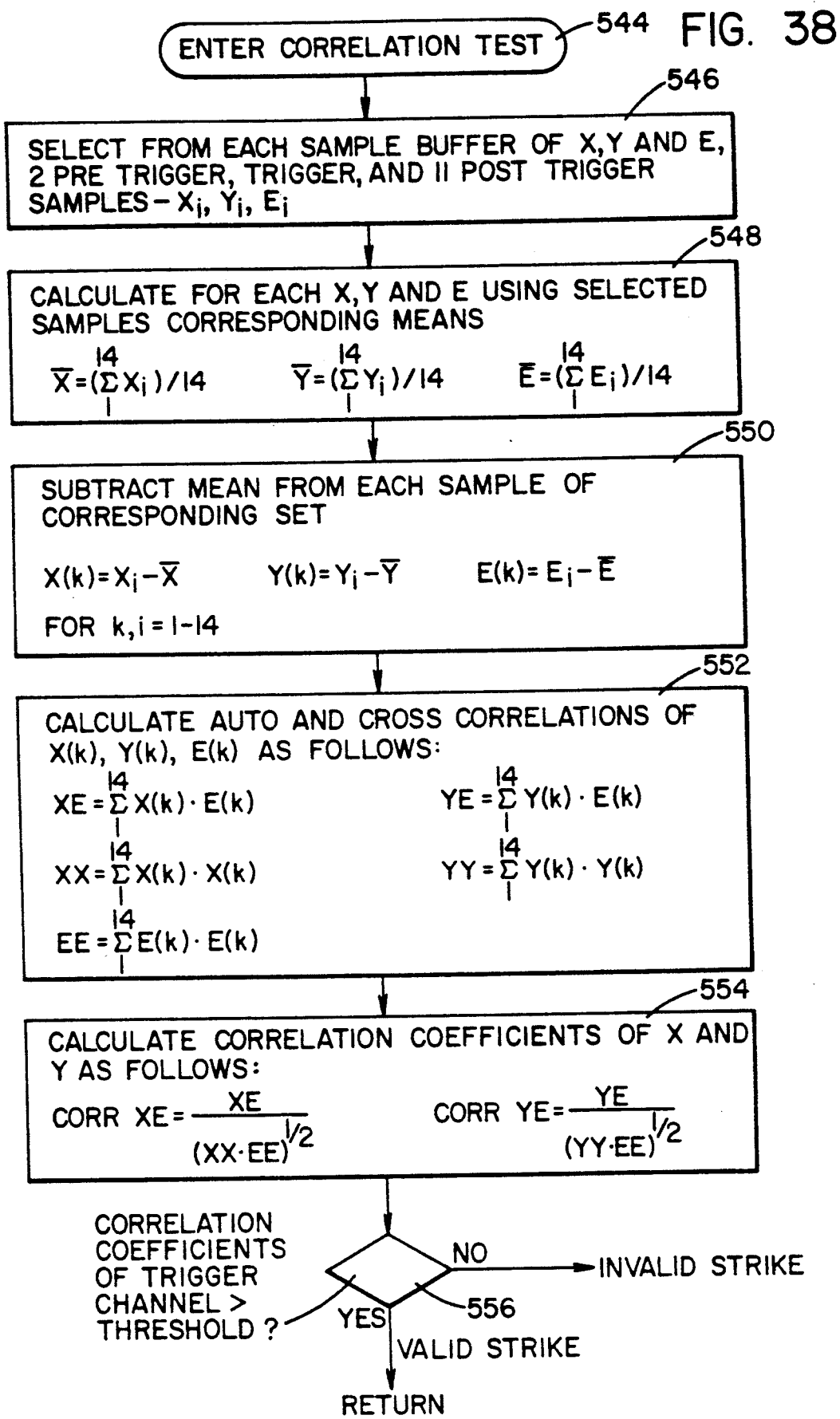

Referring to FIG. 38, the correlation test routine is entered at block 544 and the next block 546 is executed to select from each of the X, Y and E sample buffers data samples representative of the of the lightning strike waveform which includes a pulse shaped portion and a trailing shaped portion. In the present embodiment, 2 pre-trigger, the trigger and 11 post trigger samples are selected from each buffer and designated as $X_i$, $Y_i$ and $E_i$. The selected samples are substantially coherent with the pulse shaped portion of the trigger signal waveform and not intended to include the trailing portion thereof. In block 548, a mean is calculated for each of the sample groups yielding X, Y and E. Thereafter, in block 550, a new sample set X(k), Y(k), and E(k) is calculated by subtracting the samples of each group from their coresponding calculated mean. Next, auto and cross correlations are calculated from the new set of samples X(k), Y(k), and E(k) in accordance with the instructions of block 552. In block 554, correlation coefficients of the X and Y channels are computed as a function of the auto and cross correlations determined in block 552. The correlation coefficient XE is computed in the present embodiment, by dividing the cross correlation of X and E with the square root of the product of the auto correlations of X and E. Similarly the correlation co-efficient YE is effected by dividing the cross correlation of Y and E with the square root of the product of the auto correlations of Y and E. The signs of the correlation coefficients XE and YE are stored in a buffer memory to be used in subsequent processing in regard to estimating the bearing of the associated lightning strike.

To determine whether the instant lightning strike represented by the collected samples is a valid or invalid strike, the correlation coefficient of the trigger channel is compared to a threshold value in the decisional block 556. If determined to be less than the threshold value, the correlation is considered insufficient and the strike data is considered invalid in which case the processing is aborted and the routine is diverted back to the decisional block 502. Otherwise, the strike data is considered valid, the lightning strike considered detected, and full processing thereof is commenced starting at block 560 in the flow chart of FIG. 36.

In the subsequent processing of the lightning strike data, the sampled-data signals are processed to determine the frequency signature or spectrum thereof which is used to classify the corresponding lightning strike as one of a set of predetermined valid types. In the present embodiment, a bank of band pass filters are used to determine the frequency signature. Range and bearing estimates are determined from the frequency signature or filter outputs along with the type classification. The type classification may also include the pulse width calculation of the detected lightning strike signal. In this case, special tests, which combine time domain and frequency domain signal analysis techniques, are used to establish the classification type of the lightning signal waveform. More specifically, the type determination is used to weight the filter outputs for range and bearing calculations.

Now returning to block 560 in FIG. 36, the 128 samples of the X signal waveform and 128 samples of the Y signal waveform collected from the sample buffer are each passed through a bank of M band pass filters, where M is 3 in the present embodiment. That is, each of the X and Y signal representative of the magnetic field of the lightning strike is filtered by three different band pass digital filters. For the instant case, each of the filters is a fourth order Butterworth filter having filter coefficients of a center frequency and quality factor as follows: 6.25 kHz and 2; 2.5 kHz and 3; 25.0 kHz and 4, respectively. These three filters thus represent a 3-point frequency spectral analysis of the lightning strike data. Accordingly, at this point in the processing, six filtering operations are performed yielding 128 filter output samples in each case. Next in block 562, the absolute values of the filter outputs of each filter are sumed to yield three outputs for each X and Y channel which are denoted as O1X, O2X and O3X and O1Y, O2Y and O3Y, respectively. Accordingly, these six outputs are used (1) to classify the type of the detected lightning strike, and (2) to estimate the range and bearing thereof.

It is understood that for the present embodiment the lightning strike is to be classified in only one of three types—Type 1 which are signals having peak energy between 8.0 and 12.5 kHz; Type 2 which are signals having peak energy below 6.25 kHz; and Type K which are signals having peak energies in the 25 kHz neighborhood. Clearly, more than three filters may be added to the embodiment for classifying more than three types of lightning strikes as the case may be without deviating from the principles of the present invention. The filter center frequencies and quality factors of the filters were in part chosen for maximum spectral coverage with space minimum spectral overlap and this criteria will be followed if more filters are added in an alternate embodiment.

Next in block 564, the lightning signal is classified as one of the three types—Type 1, Type 2, or Type K either using the frequency signature or spectral energy information yielded by the filters or using a combination of the spectral energy and pulse width computation of the corresponding lightning strike signal. The type classification using spectral energy alone may be based on the observation that Type 2 signals have spectral energy centered at very low frequencies; Type 1 signals have spectral energy centered at higher frequencies, and Type K signals has spectral energy centered at still higher frequecies. However, by using a combination of pulse width and frequency sagnature tests, better type classification may be obtained than compared to classifications which only use frequency spectrum information. For the combination testing, a second observation is used as a basis for the type classification as follows: Type 2 signals tend t have wide pulses; Type 1 signals have narrower pulses; and Type K signals have still narrower pulses. The pulse width computation is taken from the buffer according to the computations of block 524 in FIG. 36.

In the present embodiment, the spectral energy information is formed from the filter outputs O1, O2 and O3 as defined by the following equations:

$$f1 = O1/(O2+O3), \quad (1)$$

$$f2 = O2/(O1+O3), \quad (2)$$

$$f3 = O3/(O1+O2), \quad (3)$$

where O1, O2, and O3 represent the accumulated filter outputs from the 6.25, 12.5 and 25.0 kHz filters of the trigger magnetic channel, respectively.

In the present embodiment the specific tests used in block 564 for classifying lightning strikes are as follows:
   (a) if pulse width is less than 4 or if f3 is greater than 0.6, then the signal is classified as Type K;
   (b) else, if pulse width is greater than 10 or if f1 is greater than 2×f2 than the signal is classified as Type 2;
   (c) else, the signal is classified as Type 1.

Note that the specific constants used for classification in the instant embodiment are chosen based on an analysis of lightning strike information using a large number of lightning strikes collected during actual flight tests and that the signal is classified on the trigger channel features only.

In the strike test mode, note that the strike classification operations of block 564 are circumvented by the instructions of block 566 in which the strike type is set to either TEST STRIKE or INVALID TEST STRIKE.

Figure 39:
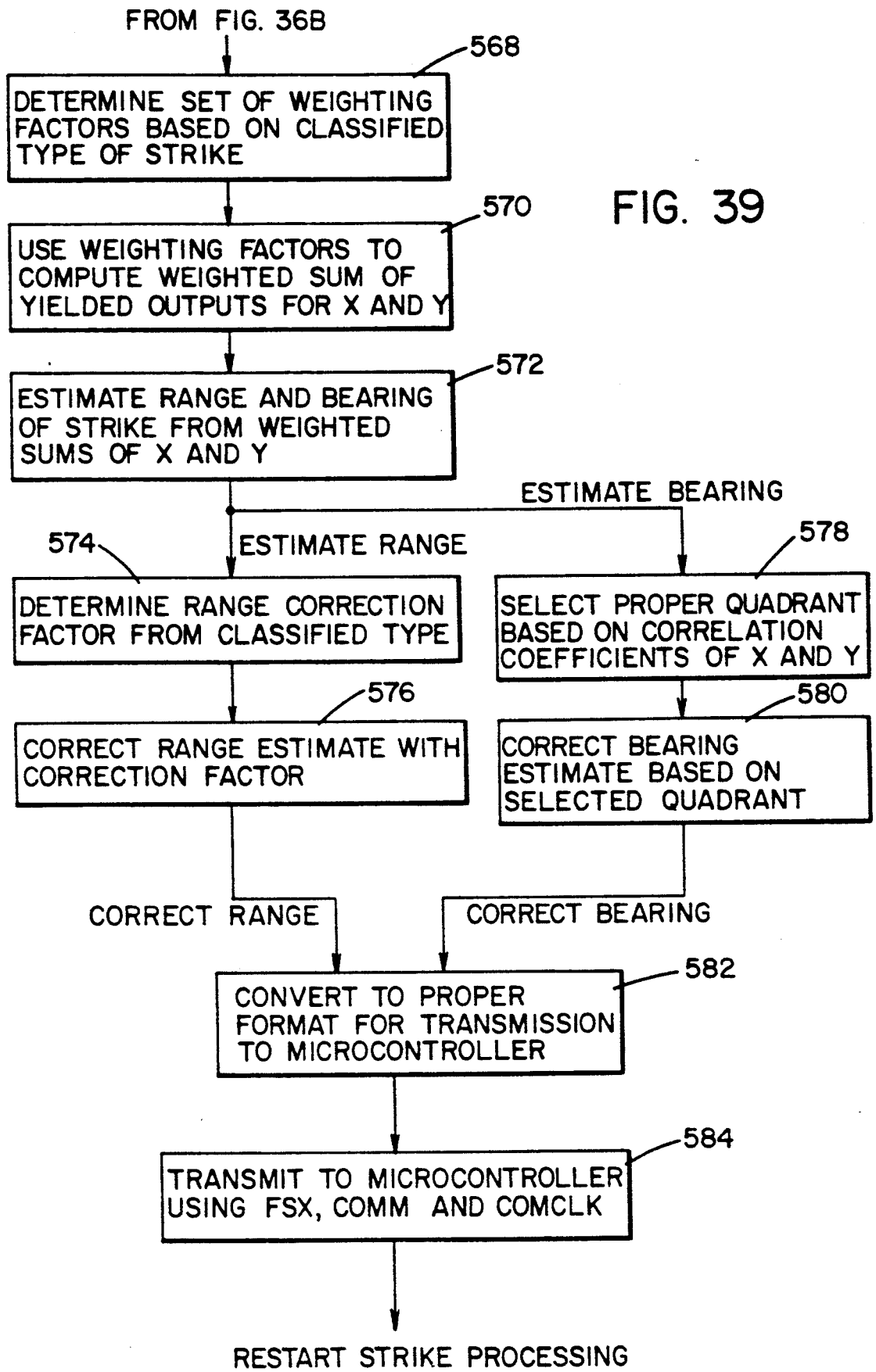

Continuing now into the flow chart of FIG. 39, in block 568, a set of weighting factors W1, W2 and W3 are determined based on the classified type of strike. In the present embodiment, a set of weights depend on the strike type and are designed to correspond to the energy distribution of the corresponding lightning signals. Currently, the weights (W1, W2, W3) selected for the three types are as follows: (0.4, 0.4 and 0.2) for Type 1; (0.5, 0.3, 0.2) for Type 2, and (0.3, 0.3 and 0.4) for Type K. Note that the highest weights are used on filter outputs centered at the peak spectral energy of the lightning signals according to type.

Next, in block 570, the selected weights W1, W2 and W3 are used to compute weight sums from the yielded outputs for the X and Y channels as follows:

$$OX = W1^*O1X + W2^*O2X + W3^*O3X \quad (4)$$

$$OY = W1^*O1Y + W2^*O2y + W3^*O3Y \quad (5)$$

where the * symbol in the above equations represents a multiplication operation in each case. Accordingly, OX and OY are the weighted sums for the X and Y channels, respectively.

A range r is estimated in block 572 from the weighted sums OX and OY based on an inverse relationship as follows:

$$r = k/SQRT(OX^2 + OY^2), \quad (6)$$

where k is a type dependent range correction factor determined from the classified type in block 574. In the present embodiment, k=1 for Type 1, k=1.25 for Type 2 and k=0.5 for Type K signals. The estimated range is corrected with this correction factor in block 576 of the flowchart as shown by the above equation.

Similarly, the bearing of the detected lightning strike may be estimated using a weighted sum of the X and Y channel filter outputs by the blocks 568, 570 and 572. However, the set of weights may be different from those used in the range computation. Currently, the weight set (W1, W2 and W3) for the bearing computations are determined to be (0.7, 0.3, 0.0) for all three signal types. This was found to improve qunatization error, as the lower frequency filters were found to be less sensitive to quantization errors than the higher frequency filters. Accordingly, the weighted sums for the bearing estimate calculations are first determined using the same equations as (4) and (5) but using the different set of weights. The estimated bearing is then computed as:

$$Theta = arctan (OX/OY)^*180 \, PI. \quad (7)$$

Next, in block 578, the proper quadrant of the bearing is selected based on the correlation coefficients XE and YE computed from the flow chart of FIG. 38, for example. In 580, the bearing estimate is corrected based on the selected quadrant utilizing the following equations:
   if CORR XE is less than 0 and CORR YE is greater than 0, then data=360 minus theta,
   else if CORR XE is less than 0 and CORR YE is less than 0, then data=theta plus 180,
   else if CORR XE is greater than 0 and CORR YE is less than 0, then data=180−theta.

Thereafter, the corrected estimated range and bearing components of the lightning strike location are converted to the proper format for the synchronous communication interface in block 582 and then transmitted to the microcontroller 70 utilizing the signals of the synchronous communication interface in block 584. Then, the strike processing is restarted at block 500 in the flow chart of FIG. 36.

Figure 40:
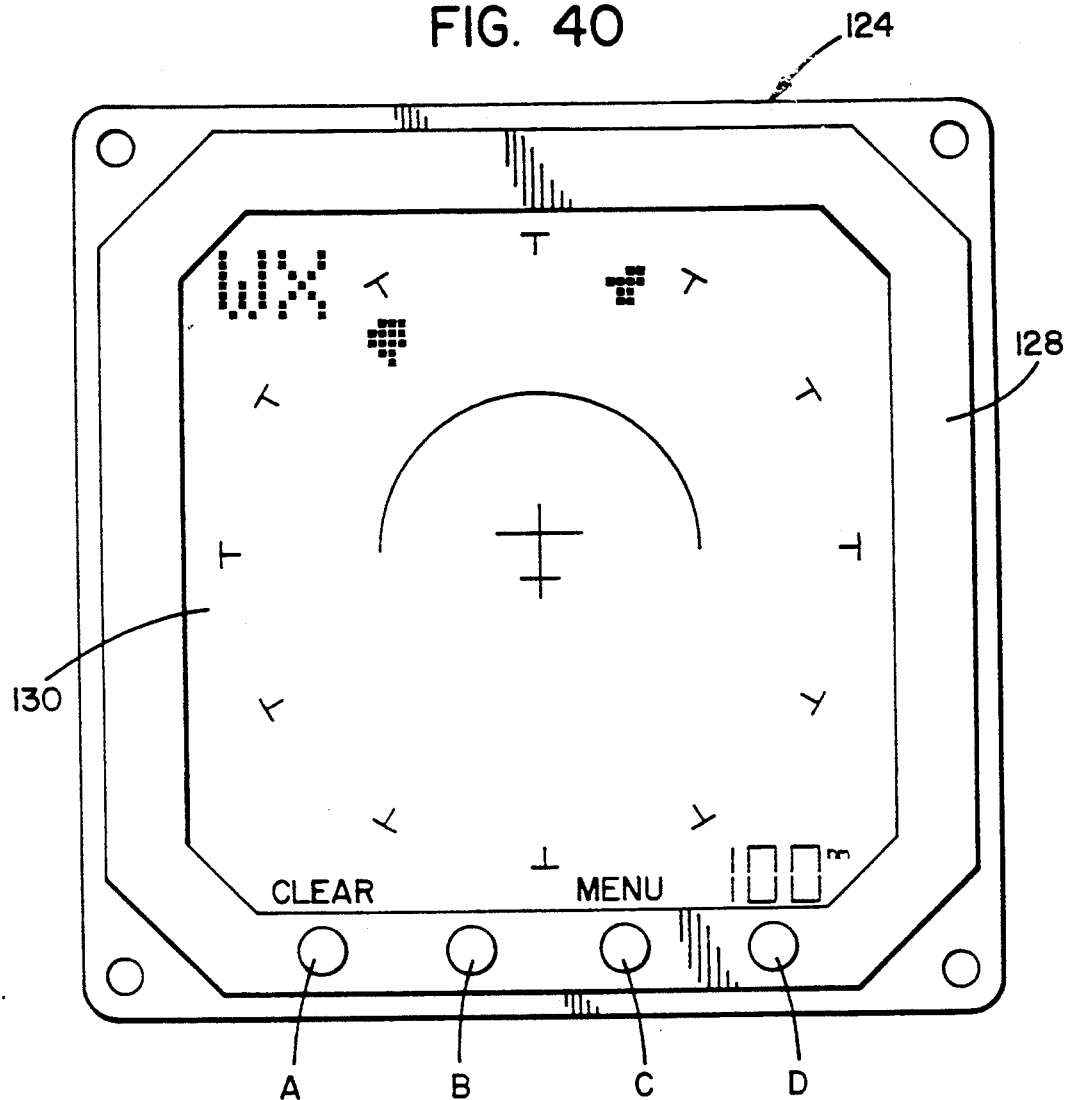
FIG. 40. is an example of a screen format display which may be generated by the software routine of FIG. 35.

Returning back to FIG. 35 which is a suitable software flow chart routine for operating the microcontroller 70 in connection with the weather mode operation. In block 452, the range and bearing data of a detected lightning strike is received from the DSP 46 over the synchronous communication interface. Next in block 462, the range and bearing strike data is converted into the proper format, which may include the processing of a compression type algorithm, for LCD display and stored in applicable range display buffers of 25, 50 and 100 nautical miles. In block 464, a range display buffer is selected based on softkey selection. Thereafter, the selected display data is transmitted to the LCD buffer for display using the instructions of 466. FIG. 40 exemplifies the mapping of lightning strike indications on the LCD display based on the calculated locations thereof. Activation of pushbutton C transfers program execution to the menu mode as determined by decisional block 468. Also, activation of pushbutton A as determined by decisional block 470 clears the LCD and range display buffers and returns program execution to block 452 to receive the range and bearing location data of the next detected lightning strike.

While the foregoing provided a description of a specific embodiment, it is understood that additions, deletions or equivalent substitutions may be made thereto without deviating from the principles of the present invention. Accordingly the present invention should not be limited to any single embodiment, but rather construed in broad scope and breadth in accordance with the recitation of the appended claims.

What is claimed is:

1. A sampled data lightning strike detection and mapping system comprising:
    receiving means for receiving a signal waveform representative of a lightning strike;
    sampling means for sampling said signal waveform to generate a train of data samples representative thereof;
    identifying means for identifying a data sample of said train which exceeds a predetermined threshold level as a trigger sample;
    recovering means for recovering a predetermined number of data samples, preceeding said trigger sample, of said train based upon said trigger sample; and
    means for processing the recovered predetermined number of data samples to detect and map the lightning strike.

2. The system in accordance with claim 1 wherein the sampling means includes means for sampling the received signal to generate a train of samples having amplitudes which form a contemporaneous sampled data representation of the received signal waveform, and wherein the identifying means includes means for comparing data samples of said train with the predetermined threshold level to identify the trigger sample, said comparisons being performed substantially contemporaneous with the reception of the lightning strike signal waveform.

3. The system in accordance with claim 1 including storing means for storing the data samples of said train.

4. The system in accordance with claim 3 wherein the storing means comprises a circular memory having a capacity to store a greater number of data samples than the predetermined number.

5. The system in accordance with claim 3 wherein the recovering means includes means for collecting the predetermined number of data samples from the storing means for processing.

6. The system in accordance with claim 5 wherein the collecting means is governed by the identification of the trigger sample.

7. The system in accordance with claim 1 wherein the receiving means includes means for receiving first and second signal waveforms representative of the lightning strike; wherein the identifying means includes means for identifying the data sample of the first or second signal waveform which exceeds the predetermined threshold level and for designating the identified waveform as the trigger waveform for subsequent processing of the data samples thereof.

8. The system in accordance with claim 7 wherein the first and second signal waveforms are representative of a magnetic field generated by the lightning strike.

9. The system in accordance with claim 8 wherein the first and second signal waveforms are representative of orthogonal components of the magnetic field.

10. The system in accordance with claim 3 wherein the sampling means includes means for digitizing the signal samples to generate a train of digital data samples; and wherein the storing means includes a digital memory having storage registers for storing the digital data samples.

11. A sampled data lightning strike detection and mapping systems comprising:
    receiving means for receiving a signal waveform representative of a lightning strike;
    sampling means for sampling the received signal waveform and for digitizing said samples to generate a train of digital data samples;
    digital signal processing means operative to process the digital data samples of said train for identifying a sample which exceeds a predetermined threshold level as a trigger sample; and
    recovering means for recovering a predetermined number of digital data samples, preceeding the trigger sample, of said train based upon said trigger sample, for lightning strike detection and mapping processing thereof by the digital signal processing means.

12. The system in accordance with claim 11 wherein the digital data samples are representative of sampled amplitudes of the signal waveform such that the train of samples form a contemporaneous digital data representation of the signal waveform; and wherein the digital signal processing means processes the digital data samples for trigger sample identification substantially contemporaneous with the reception of the lightning strike signal waveform.

13. The system in accordance with claim 11 including a digital memory having storage registers for storing the digital data samples of the train.

14. The system in accordance with claim 13 wherein the recovering means includes means governed by the identification of the trigger sample to access the predetermined number of digital data samples from the digital memory for processing by the digital signal processing means.

15. A sampled data lightning strike detection and mapping system comprising:
    receiving means for receiving first and second signal waveforms representative of a lightning strike;
    sampling means for sampling said received first and second signal waveforms and for digitizing the samples to generate a first train of digital data samples representative of the first signal waveform and a second train of digital data samples representative of the second signal waveform;

digital signal processing means operative to process the digital data samples of said first and second trains for identifying a sample which exceeds a predetermined threshold level as a trigger sample; and recovering means for recovering a predetermined number of digital data samples, preceeding the trigger sample and based upon said trigger sample, of both of said first and second trains for lightning strike detection and mapping processing thereof by the digital signal processing means.

16. The system in accordance with claim 15 wherein the first and second signal waveforms are representative of a magnetic field generated by the lightning strike.

17. The system in accordance with claim 16 wherein the receiving means includes means for receiving a third signal waveform representative of an electric field generated by the lightning strike; wherein the sampling and digitizing means includes means for sampling said third signal waveform and for digitizing said samples to generate a third train of digital data samples representative of the third signal waveform; and wherein the recovering means includes means for recovering a predetermined number of digital data samples, preceeding the trigger sample, of the third train for lightning strike detection and mapping processing by the digital signal processing means.

18. The system in accordance with claim 17 including a digital memory having storage registers for storing the digital data samples of the first, second and third trains.

19. The system in accordance with claim 18 where the receiving means includes means governed by the identification of the trigger sample to access the predetermined number of digital data samples of the first, second or third trains from the digital memory for processing by the digital signal processing means.

20. The system in accordance with claim 18 wherein the sampling and digitizing means includes means for digitizing a contemporaneous sample of each of the first, second and third trains before digitizing the next contemporaneous sample of said trains.

* * * * *